US011133399B2

(12) United States Patent
Yoshimochi

(10) Patent No.: US 11,133,399 B2
(45) Date of Patent: Sep. 28, 2021

(54) SEMICONDUCTOR DEVICE

(71) Applicant: ROHM CO., LTD., Kyoto (JP)

(72) Inventor: Kenichi Yoshimochi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/280,665

(22) Filed: Feb. 20, 2019

(65) Prior Publication Data

US 2019/0267467 A1    Aug. 29, 2019

(30) Foreign Application Priority Data

Feb. 23, 2018    (JP) .............................. JP2018-030901

(51) Int. Cl.

| | |
|---|---|
| *H01L 29/66* | (2006.01) |
| *H01L 29/423* | (2006.01) |
| *H01L 29/778* | (2006.01) |
| *H01L 21/285* | (2006.01) |
| *H01L 29/45* | (2006.01) |
| *H01L 29/40* | (2006.01) |
| *H01L 29/165* | (2006.01) |
| *H01L 21/8234* | (2006.01) |
| *H01L 21/8238* | (2006.01) |

(Continued)

(52) U.S. Cl.

CPC .. *H01L 29/66431* (2013.01); *H01L 21/28575* (2013.01); *H01L 21/823481* (2013.01); *H01L 21/823878* (2013.01); *H01L 29/165* (2013.01); *H01L 29/402* (2013.01); *H01L 29/42324* (2013.01); *H01L 29/452* (2013.01); *H01L 29/66462* (2013.01); *H01L 29/778* (2013.01); *H01L 29/7786* (2013.01); *H01L 29/2003* (2013.01); *H01L 29/4236* (2013.01); *H01L 29/4966* (2013.01)

(58) Field of Classification Search

CPC ............. H01L 29/66431; H01L 29/165; H01L 29/402; H01L 29/452; H01L 29/7786; H01L 21/28575; H01L 29/66462; H01L 29/778; H01L 29/42324; H01L 29/4966; H01L 29/4236; H01L 29/2003; H01L 21/823878

See application file for complete search history.

(56) References Cited

U.S. PATENT DOCUMENTS

| | | | | |
|---|---|---|---|---|
| 5,247,199 A | * | 9/1993 | Matlock ............ | H01L 21/76224 257/371 |
| 6,358,796 B1 | * | 3/2002 | Lin ....................... | H01L 27/115 438/257 |

(Continued)

FOREIGN PATENT DOCUMENTS

JP    2011-192834 A    9/2011

Primary Examiner — Charles D Garber
Assistant Examiner — S M Sohel Imtiaz
(74) Attorney, Agent, or Firm — Gregory M. Howison

(57) ABSTRACT

A semiconductor device includes a semiconductor layer which has a first device formation region and a second device formation region, a first HEMT which is formed in the first device formation region and has a first two-dimensional electron gas region as a channel, a second HEMT which is formed in the second device formation region and has a second two-dimensional electron gas region as a channel, and a region separation structure which is formed in the semiconductor layer and defines the first device formation region and the second device formation region.

20 Claims, 44 Drawing Sheets

(51) Int. Cl.
*H01L 29/20* (2006.01)
*H01L 29/49* (2006.01)

(56) References Cited

U.S. PATENT DOCUMENTS

| | | | | |
|---|---|---|---|---|
| 6,914,015 B2* | 7/2005 | Belyansky | ........ | H01L 21/02274 |
| | | | | 438/788 |
| 6,914,316 B2* | 7/2005 | Yun | .................. | H01L 21/76229 |
| | | | | 257/506 |
| 2002/0175375 A1* | 11/2002 | Kunikiyo | .......... | H01L 21/76264 |
| | | | | 257/347 |
| 2003/0013270 A1* | 1/2003 | Seitz | ................ | H01L 21/76229 |
| | | | | 438/424 |
| 2008/0124888 A1* | 5/2008 | Sandhu | ............. | H01L 21/76229 |
| | | | | 438/400 |
| 2010/0264462 A1* | 10/2010 | Hirler | ............... | H01L 29/41766 |
| | | | | 257/194 |
| 2013/0062666 A1* | 3/2013 | Imada | .................... | H01L 29/207 |
| | | | | 257/194 |
| 2013/0240897 A1* | 9/2013 | Imada | ................ | H01L 21/8252 |
| | | | | 257/76 |
| 2013/0313560 A1* | 11/2013 | Khalil | ................ | H01L 29/2003 |
| | | | | 257/76 |
| 2014/0103969 A1* | 4/2014 | Jeon | .................... | H01L 29/7781 |
| | | | | 327/109 |
| 2014/0151749 A1* | 6/2014 | Jeon | .................... | H01L 29/7786 |
| | | | | 257/194 |
| 2014/0210033 A1* | 7/2014 | Yano | ................ | H01L 27/14627 |
| | | | | 257/432 |
| 2014/0264441 A1* | 9/2014 | Murase | ............ | H01L 29/66462 |
| | | | | 257/190 |
| 2015/0014740 A1 | 1/2015 | Briere | | |
| 2015/0069482 A1* | 3/2015 | Mueller | ............. | H01L 27/0207 |
| | | | | 257/296 |
| 2015/0279982 A1* | 10/2015 | Yamamoto | ........ | H01L 29/66462 |
| | | | | 257/76 |

* cited by examiner

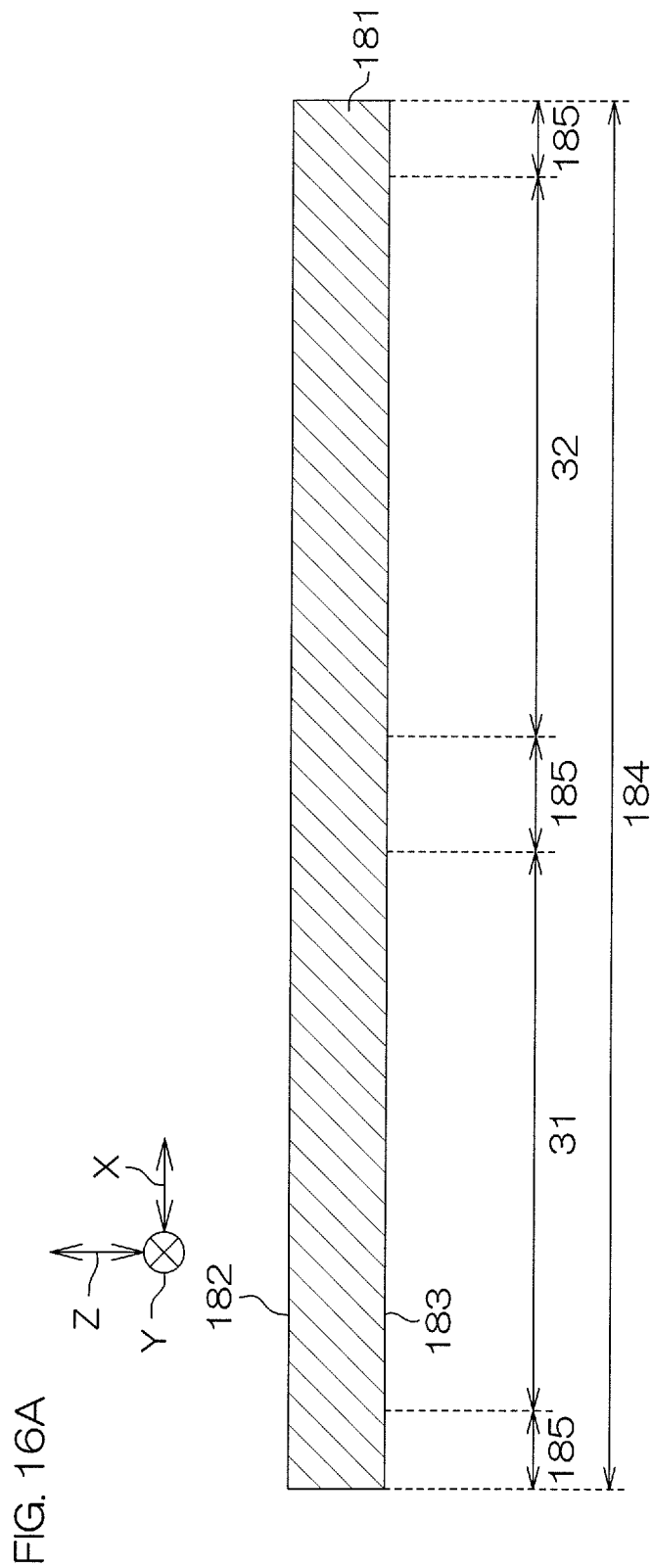

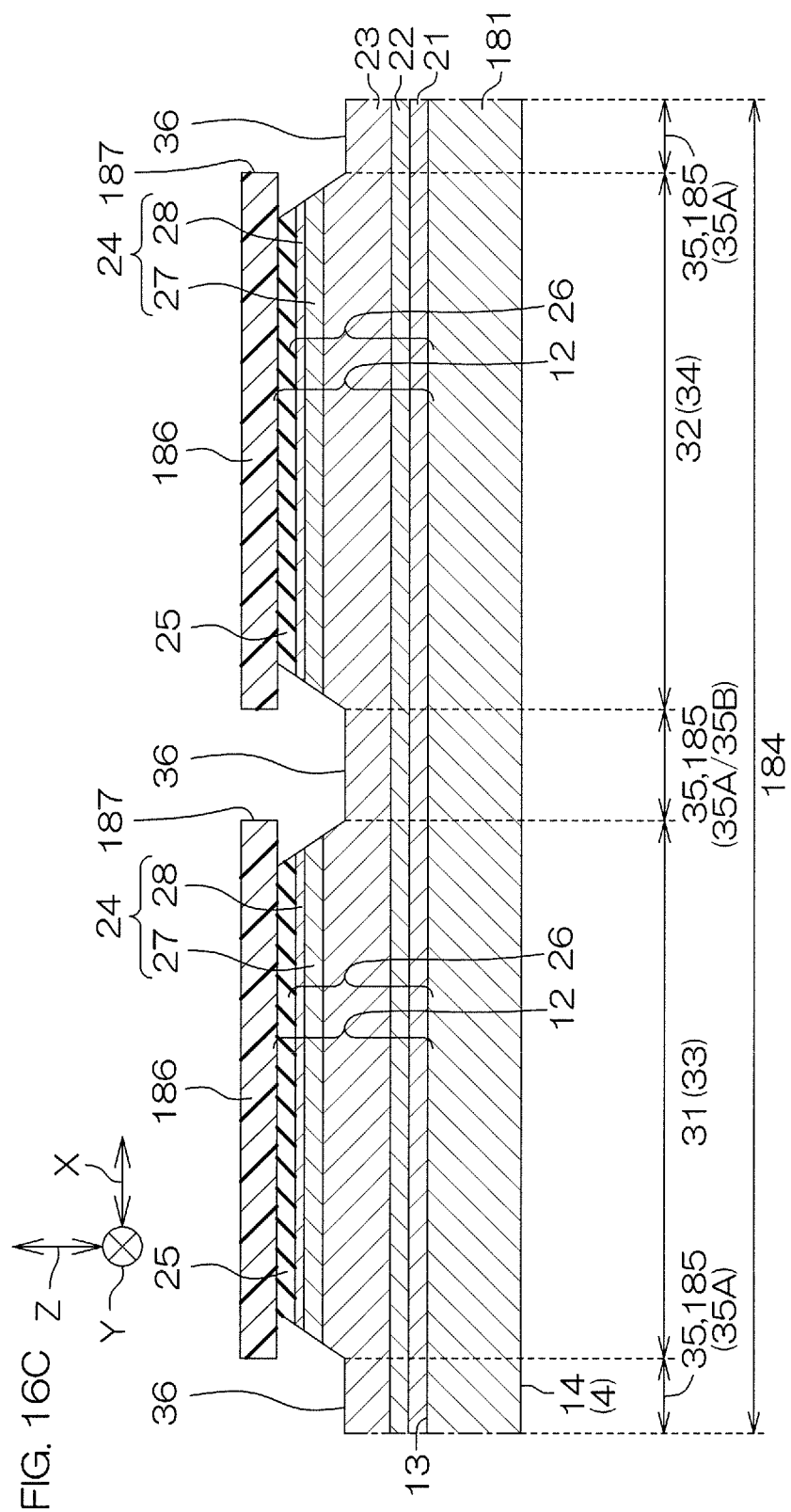

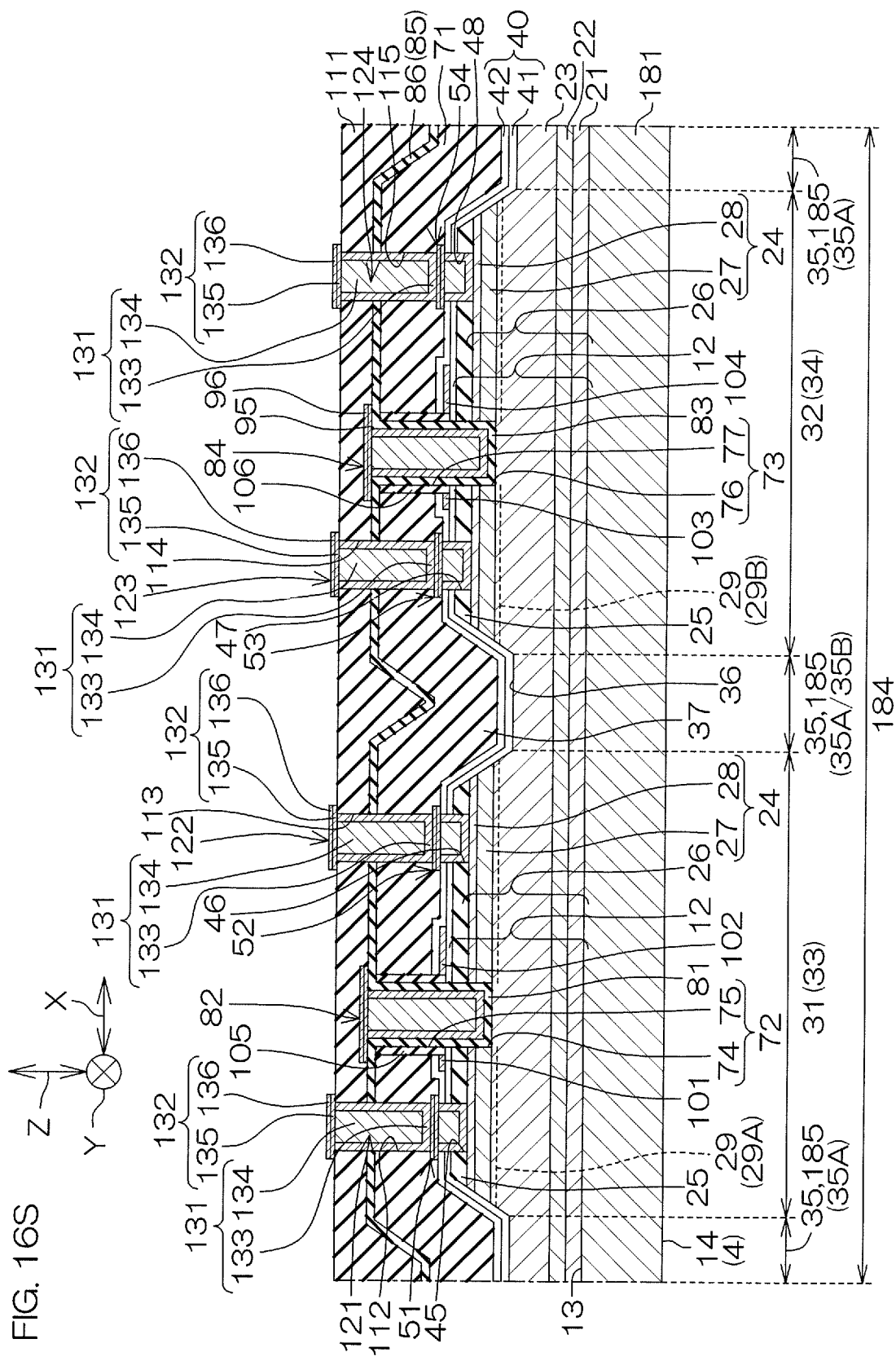

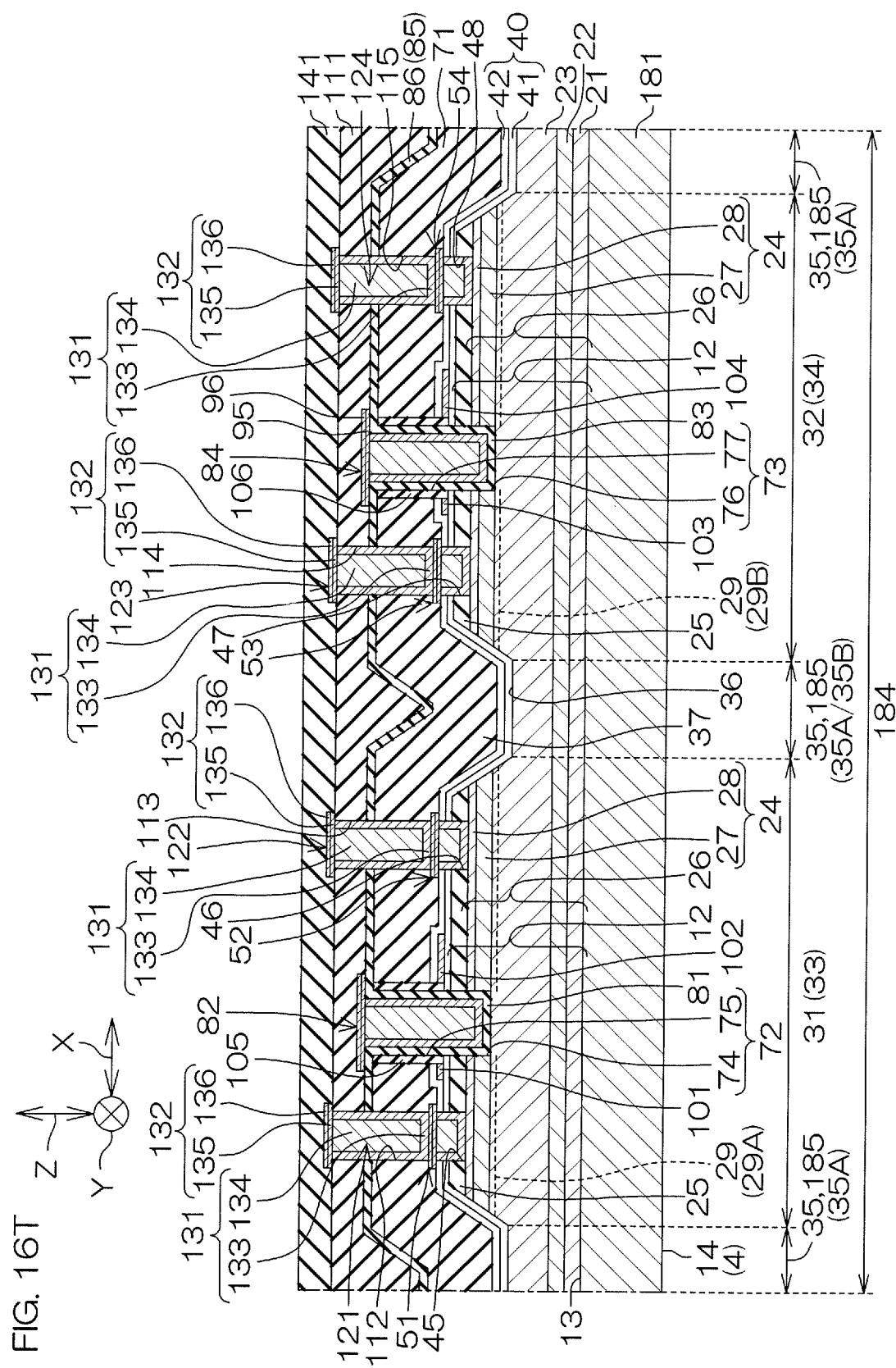

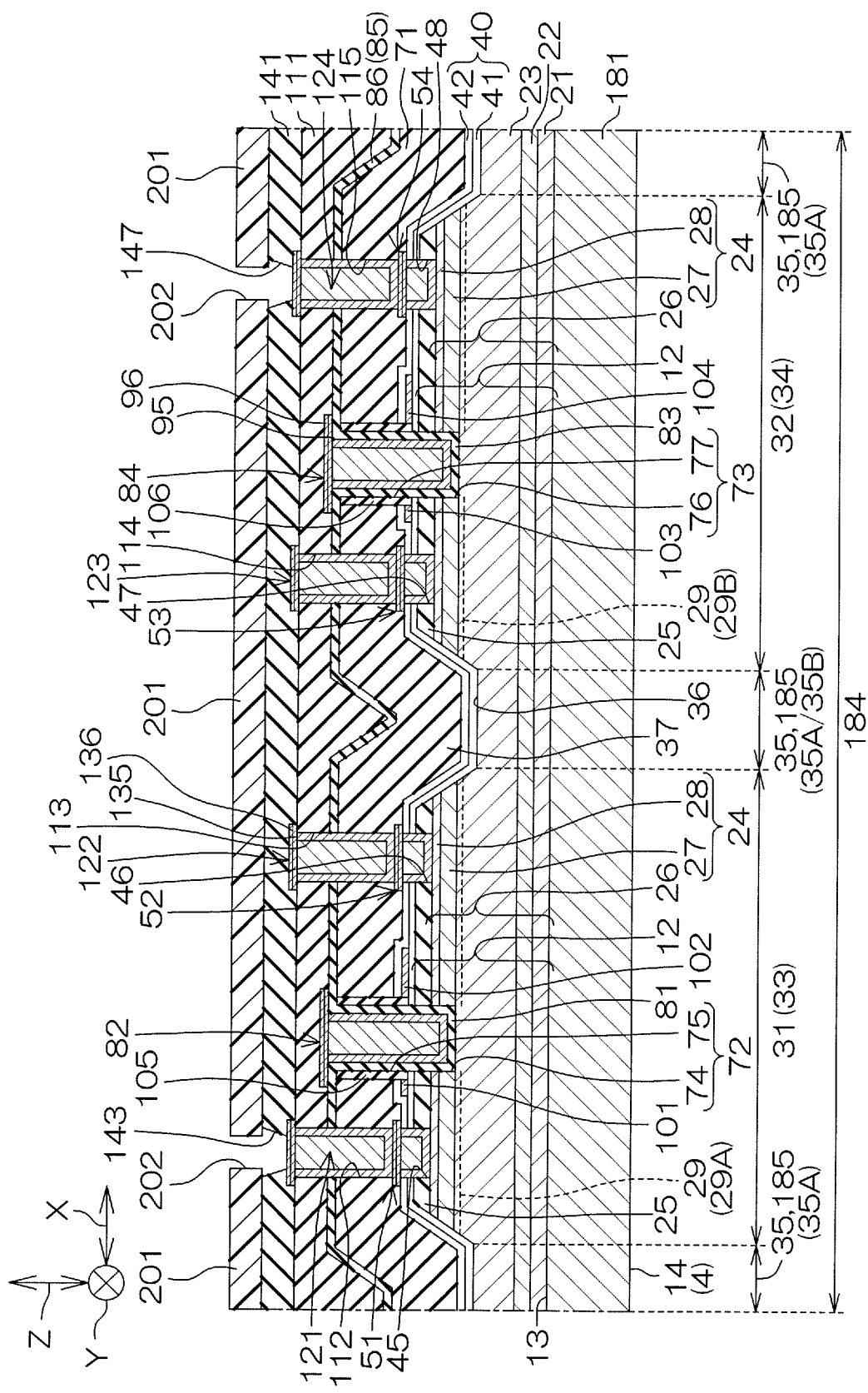

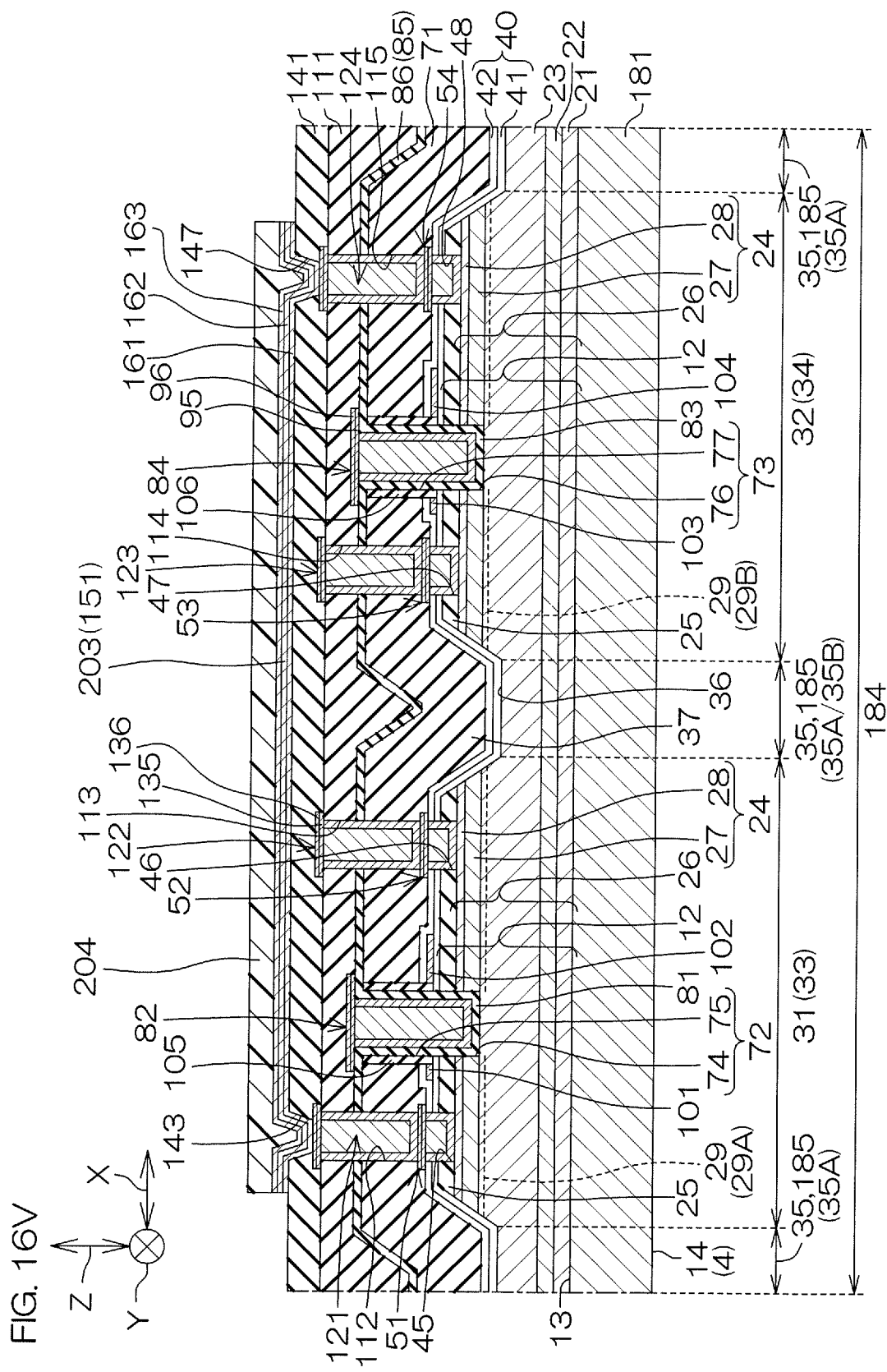

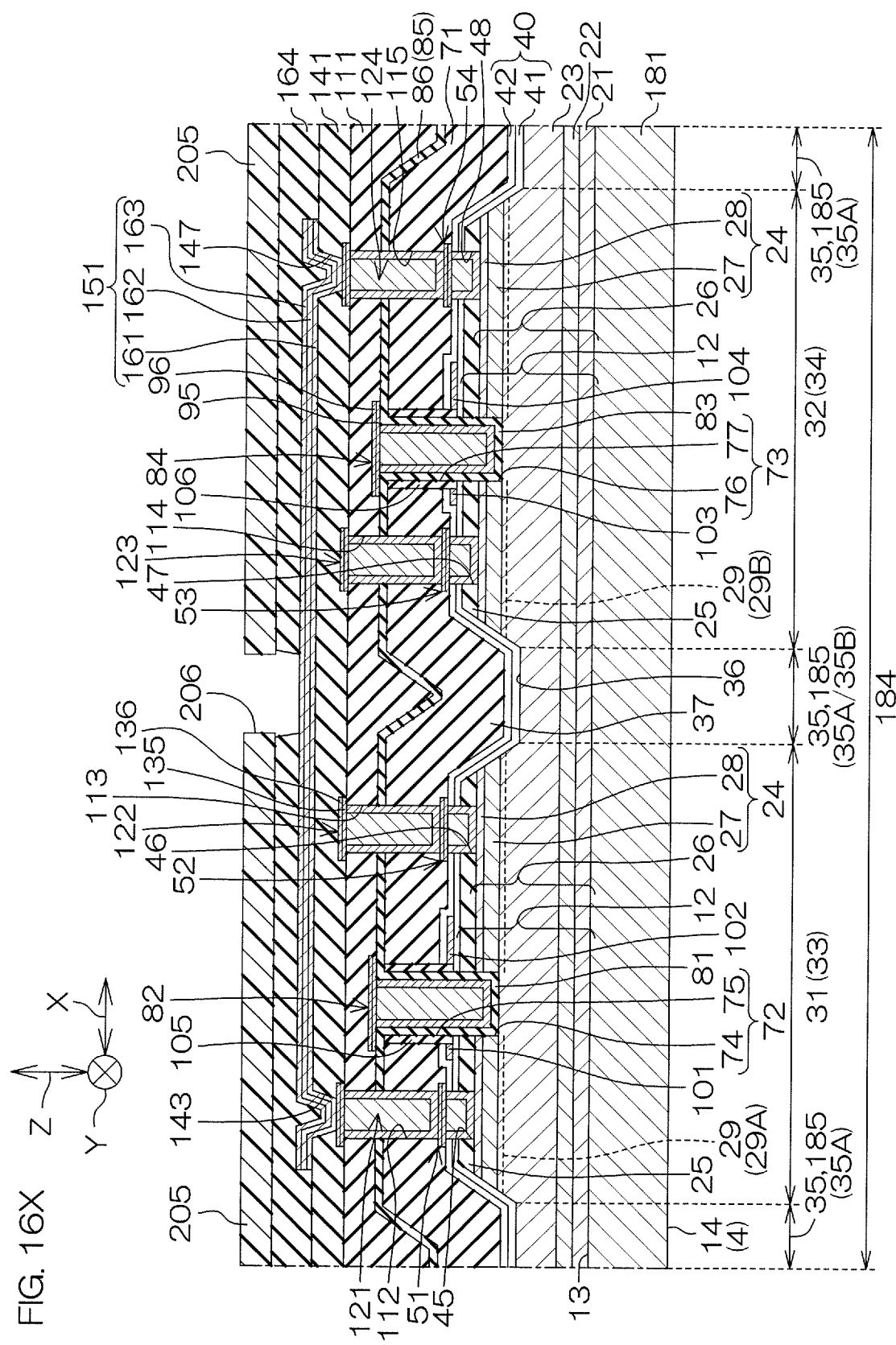

SEMICONDUCTOR DEVICE

CROSS-REFERENCE TO RELATED APPLICATIONS

This application claims the benefit of priority to Japanese Patent Application No. 2018-030901 filed on Feb. 23, 2018. The entire contents of the application are hereby incorporated herein by reference.

BACKGROUND OF THE INVENTION

1. Field of the Invention

The present invention relates to a semiconductor device that includes a High Electron Mobility Transistor (HEMT).

2. Description of the Related Art

JP2011-192834A discloses a semiconductor device that includes a High Electron Mobility Transistor (HEMT). The semiconductor device includes a silicon substrate. A buffer layer is formed on the silicon substrate. A GaN layer is formed on the buffer layer. A gate electrode layer is formed on the GaN layer with a gate insulating layer interposed therebetween. A source electrode layer and a drain electrode layer are formed on the GaN layer with an AlGaN layer interposed therebetween.

SUMMARY OF THE INVENTION

A preferred embodiment of the present invention provides a semiconductor device that includes a semiconductor layer which has a first device formation region and a second device formation region, a first HEMT which is formed in the first device formation region and has a first two-dimensional electron gas region as a channel, a second HEMT which is formed in the second device formation region and has a second two-dimensional electron gas region as a channel, and a region separation structure which is formed in the semiconductor layer and defines the first device formation region and the second device formation region.

A preferred embodiment of the present invention provides a semiconductor device that includes a semiconductor layer which includes an electron transit layer, and an electron supply layer formed on the electron transit layer, a region separation structure which includes a trench penetrating the electron supply layer, and an embedded insulator embedded in the trench, the region separation structure separating the semiconductor layer into a first device formation region and a second device formation region, a first HEMT that is formed in the first device formation region and has a first two-dimensional electron gas region as a channel, and a second HEMT that is formed in the second device formation region and has a second two-dimensional electron gas region as a channel.

The aforementioned or other objects, features, and effects of the present invention will be clarified by the following description of preferred embodiments given below with reference to the accompanying drawings.

DETAILED DESCRIPTION OF THE PREFERRED EMBODIMENTS

Figure 1:
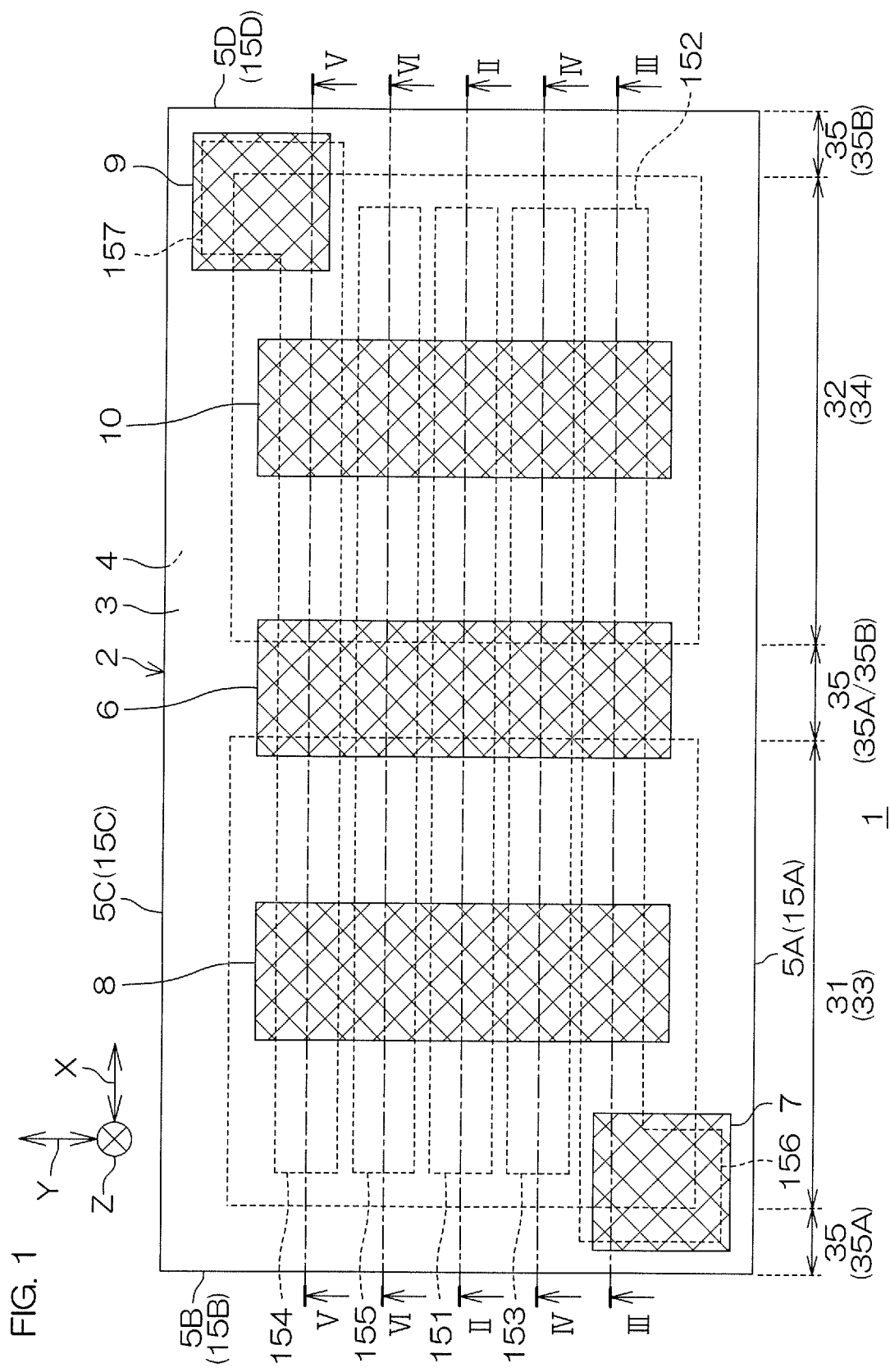
FIG. 1 is a plan view showing a semiconductor device according to a first preferred embodiment of the present invention.

The semiconductor device according to JP2011-192834A may be formed as one HEMT chip. In a case in which a plurality of HEMT chips mount onto a connection object such as a mounting board, the plurality of HEMT chips must be arranged side by side. As a result, a total area occupied in the connection object by the HEMT chips is increased. In addition, in a case in which the HEMT chips are electrically connected together, a wiring distance between the HEMT chips is increased. This leads to problems such as increases in wiring resistance and wiring inductance.

A preferred embodiment of the present invention therefore provides a semiconductor device which has a plurality of HEMTs that can be independently controlled and which can be reduced in size and improved in performance.

A preferred embodiment of the present invention provides a semiconductor device that includes a semiconductor layer which has a first device formation region and a second device formation region, a first HEMT which is formed in the first device formation region and has a first two-dimensional electron gas region as a channel, a second HEMT which is formed in the second device formation region and has a second two-dimensional electron gas region as a channel, and a region separation structure which is formed in the semiconductor layer and defines the first device formation region and the second device formation region.

According to the semiconductor device, the first HEMT and the second HEMT that can be controlled independently each other have been incorporated into the single semiconductor layer. This enables the first HEMT and the second HEMT to be confined in a limited region of the semiconductor layer, thus making it possible to reduce the device in size.

Furthermore, in a case in which the first HEMT and the second HEMT are electrically connected to each other in the semiconductor device, a wiring to be connected to the first HEMT and the second HEMT can be confined in the limited region of the semiconductor layer. Since this enables shortening a wiring distance, a wiring resistance and a wiring inductance can be reduced. It is thus possible to provide a semiconductor device that can be improved in performance by taking advantage of the size reduction.

A preferred embodiment of the present invention provides a semiconductor device that includes a semiconductor layer which includes an electron transit layer, and an electron supply layer formed on the electron transit layer, a region separation structure which includes a trench penetrating the electron supply layer, and an embedded insulator embedded in the trench, the region separation structure separating the semiconductor layer into a first device formation region and a second device formation region, a first HEMT that is formed in the first device formation region and has a first two-dimensional electron gas region as a channel, and a second HEMT that is formed in the second device formation region and has a second two-dimensional electron gas region as a channel.

According to the semiconductor device, the first HEMT and the second HEMT that can be controlled independently each other have been incorporated into the single semiconductor layer. This enables the first HEMT and the second HEMT to be confined in a limited region of the semiconductor layer, thus making it possible to reduce the device in size.

Furthermore, in a case in which the first HEMT and the second HEMT are electrically connected to each other in the semiconductor device, a wiring to be connected to the first HEMT and the second HEMT can be confined in the limited region of the semiconductor layer. Since this enables shortening a wiring distance, a wiring resistance and a wiring inductance can be reduced. It is thus possible to provide a semiconductor device that can be improved in performance by taking advantage of the size reduction.

Hereinafter, preferred embodiments of the present invention will be described in detail with reference to the attached drawings.

FIG. 1 is a plan view showing a semiconductor device 1 according to a first preferred embodiment of the present invention.

Referring to FIG. 1, the semiconductor device 1 includes a chip body 2 that is formed in a rectangular parallelepiped shape. The chip body 2 includes a first chip main surface 3 on one side, a second chip main surface 4 on the other side, and four chip side surfaces 5A, 5B, 5C, and 5D which connect the first chip main surface 3 and the second chip main surface 4. The first chip main surface 3 and the second chip main surface 4 are formed in a quadrangular shape (more specifically, in a rectangular shape) in plan view when viewed in a normal direction Z of the chip main surfaces (hereafter, simply referred to as "in plan view").

The chip side surfaces 5A and 5C extend in a first direction X and oppose each other along a second direction Y that intersects the first direction X. The chip side surfaces 5B and 5D extend in the second direction Y and oppose each other along the first direction X. The first direction X is set to the longitudinal direction of the chip body 2, in this preferred embodiment. The second direction Y is set to a direction orthogonal to the first direction X, that is, the transverse direction of the chip body 2, in this preferred embodiment.

A plurality of external terminals to be externally connected are formed on the first chip main surface 3 of the chip body 2. The plurality of external terminals include a source-drain external terminal 6, a first gate external terminal 7, a drain external terminal 8, a second gate external terminal 9, and a source external terminal 10.

The source-drain external terminal 6 is formed in a central portion of the first chip main surface 3, in this preferred embodiment. The source-drain external terminal 6 is formed in a band shape that extends along the second direction Y in plan view.

The first gate external terminal 7 is formed in a region along a corner portion in the first chip main surface 3, in this preferred embodiment. More specifically, the first gate external terminal 7 is formed at a region along a corner portion that connects the chip side surface 5A and the chip side surface 5B in the first chip main surface 3.

The first gate external terminal 7 is formed in a quadrangular shape (more specifically, in a square shape) in plan view. The first gate external terminal 7 may be formed in a band shape that extends along the second direction Y in plan view.

The drain external terminal 8 is formed in a region at one end portion side of the first chip main surface 3 in regard to the first direction X, in this preferred embodiment. More specifically, the drain external terminal 8 is formed in a region at the chip side surface 5B side in the first chip main surface 3. The drain external terminal 8 is formed in a band shape that extends along the second direction Y in plan view.

The second gate external terminal 9 is formed in a region along a corner portion in the first chip main surface 3, in this preferred embodiment. More specifically, the second gate external terminal 9 is formed in a region along a corner portion that connects the chip side surface 5C and the chip side surface 5D in the first chip main surface 3. The second gate external terminal 9 opposes the first gate external terminal 7 along a diagonal direction of the first chip main surface 3.

The second gate external terminal 9 is formed in a quadrangular shape (more specifically, in a square shape) in plan view. The second gate external terminal 9 may be formed in a band shape that extends along the second direction Y in plan view.

The source external terminal 10 is formed in a region at the other end portion side of the first chip main surface 3 in regard to the first direction X, in this preferred embodiment. More specifically, the source external terminal 10 is formed in a region at the chip side surface 5D side of the first chip main surface 3. The source external terminal 10 is formed in a band shape that extends along the second direction Y in plan view.

The source external terminal 10 opposes the drain external terminal 8 in the first direction X with the source-drain external terminal 6 interposed between the source external terminal 10 and the drain external terminal 8. The source-drain external terminal 6, the drain external terminal 8, and the source external terminal 10 are formed in a stripe shape that extends along the second direction Y in plan view.

Figure 2:
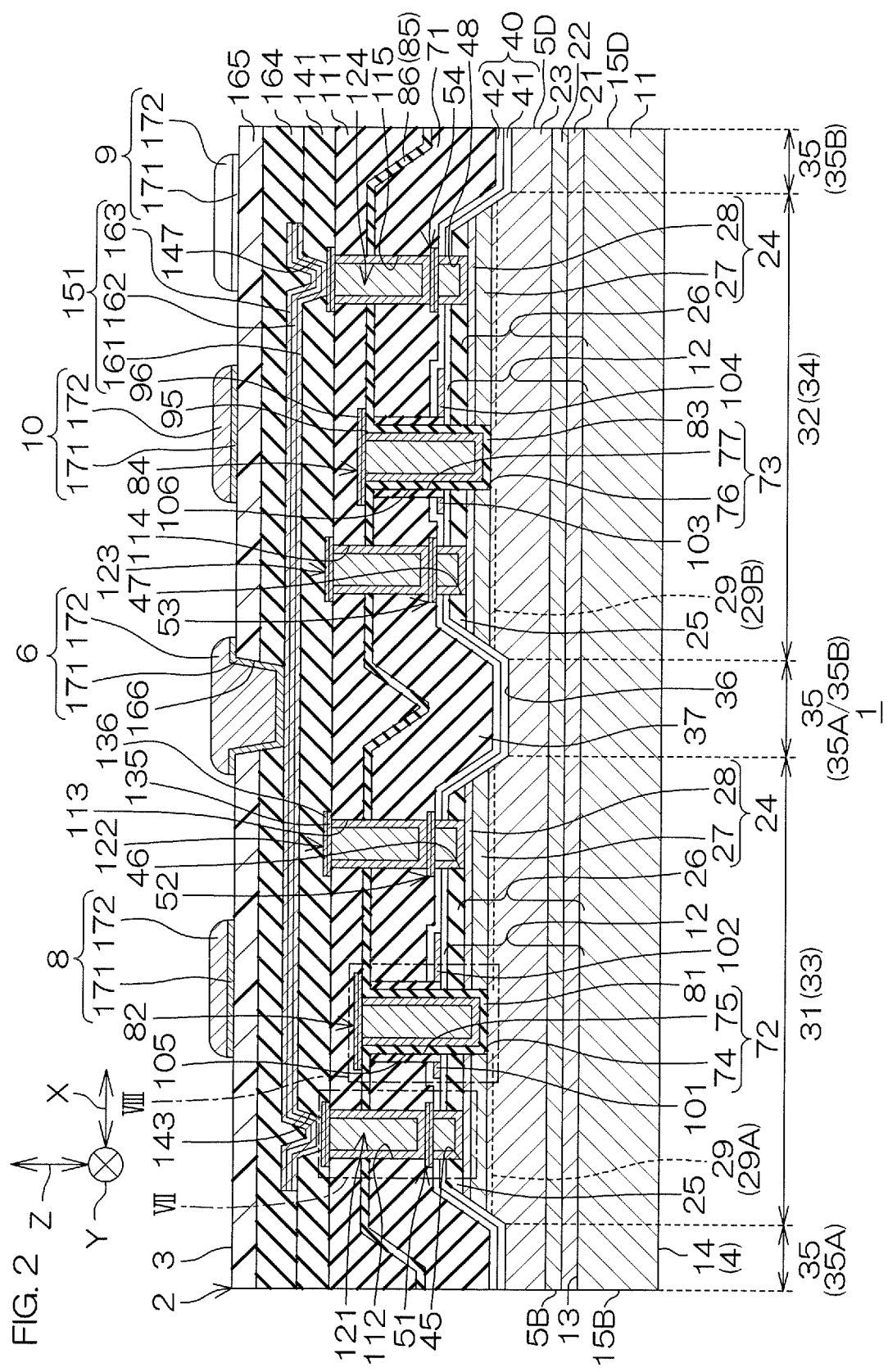
FIG. 2 is a cross-sectional view taken along line II-II shown in FIG. 1.
Figure 3:
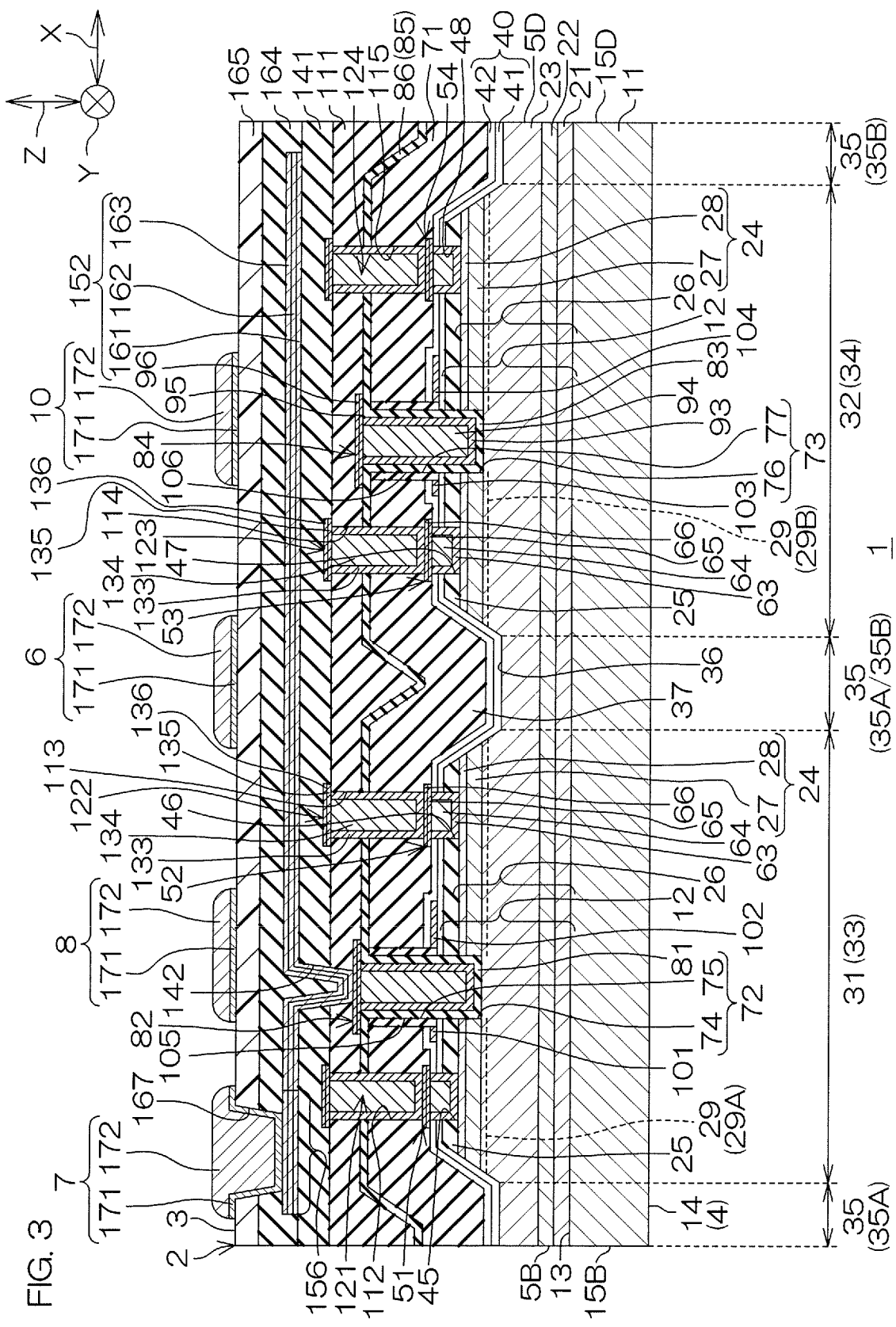
FIG. 3 is a cross-sectional view taken along line shown in FIG. 1.
Figure 4:
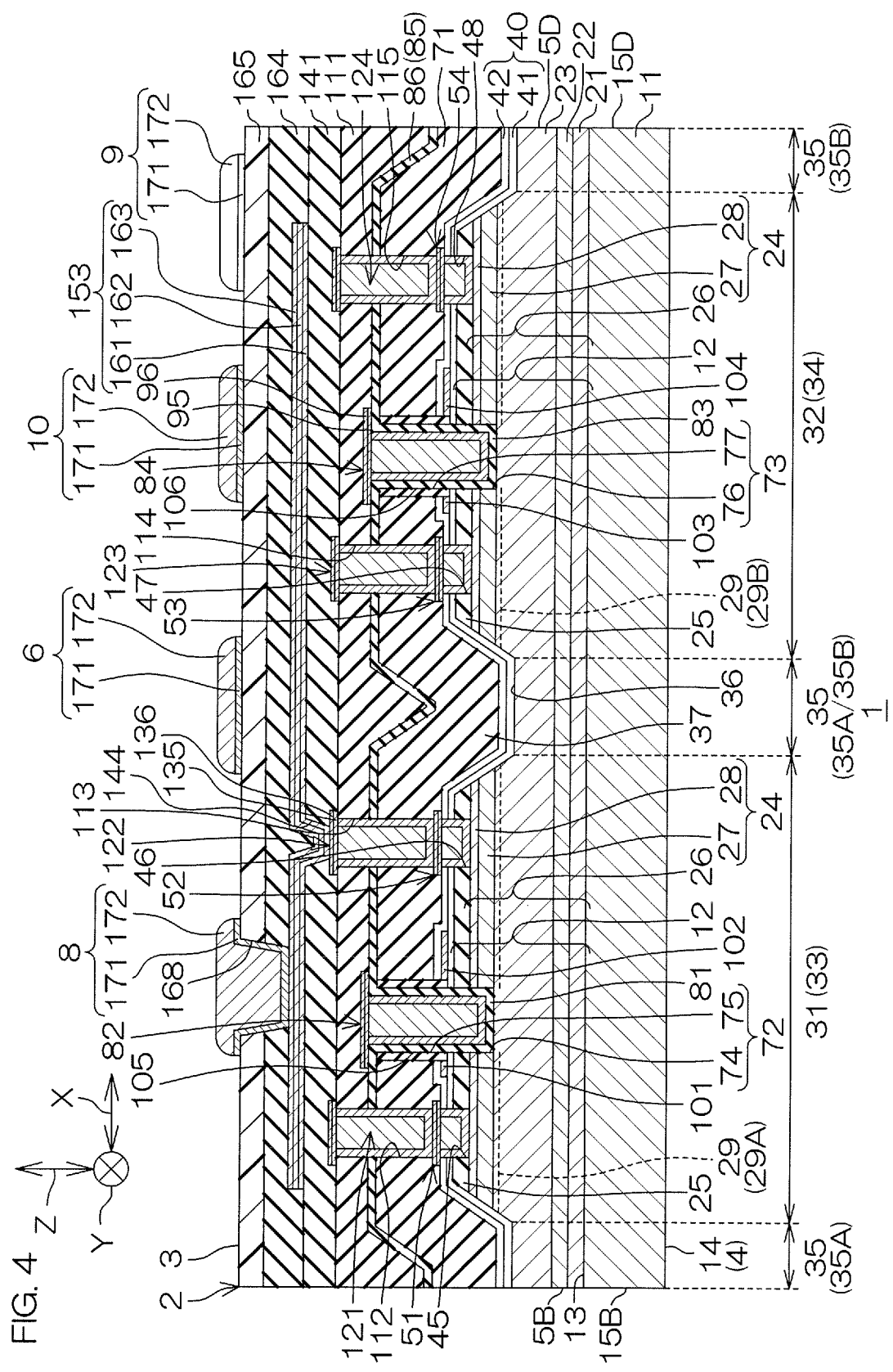
FIG. 4 is a cross-sectional view taken along line IV-IV shown in FIG. 1.
Figure 5:
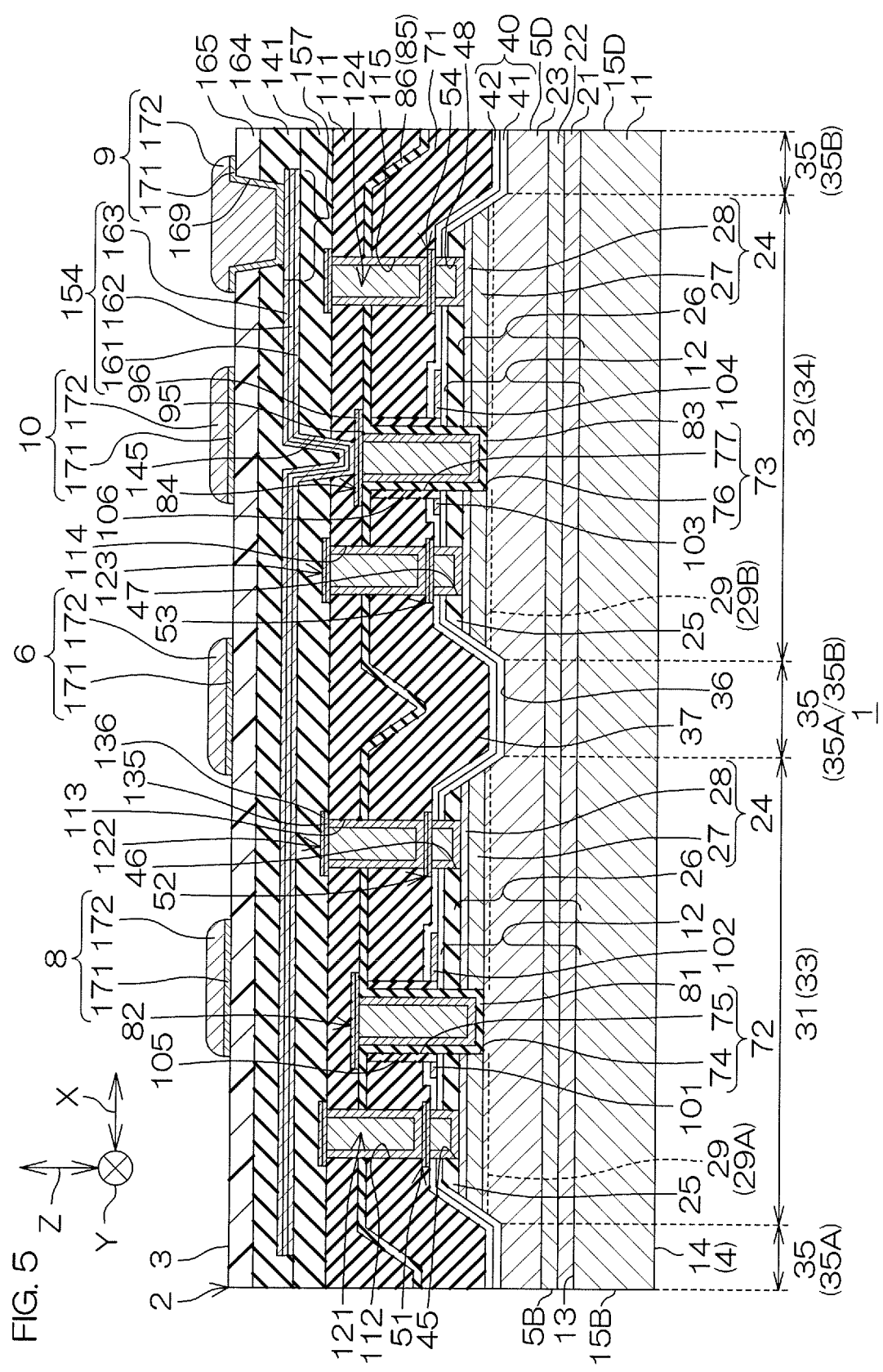
FIG. 5 is a cross-sectional view taken along line V-V shown in FIG. 1.
Figure 6:
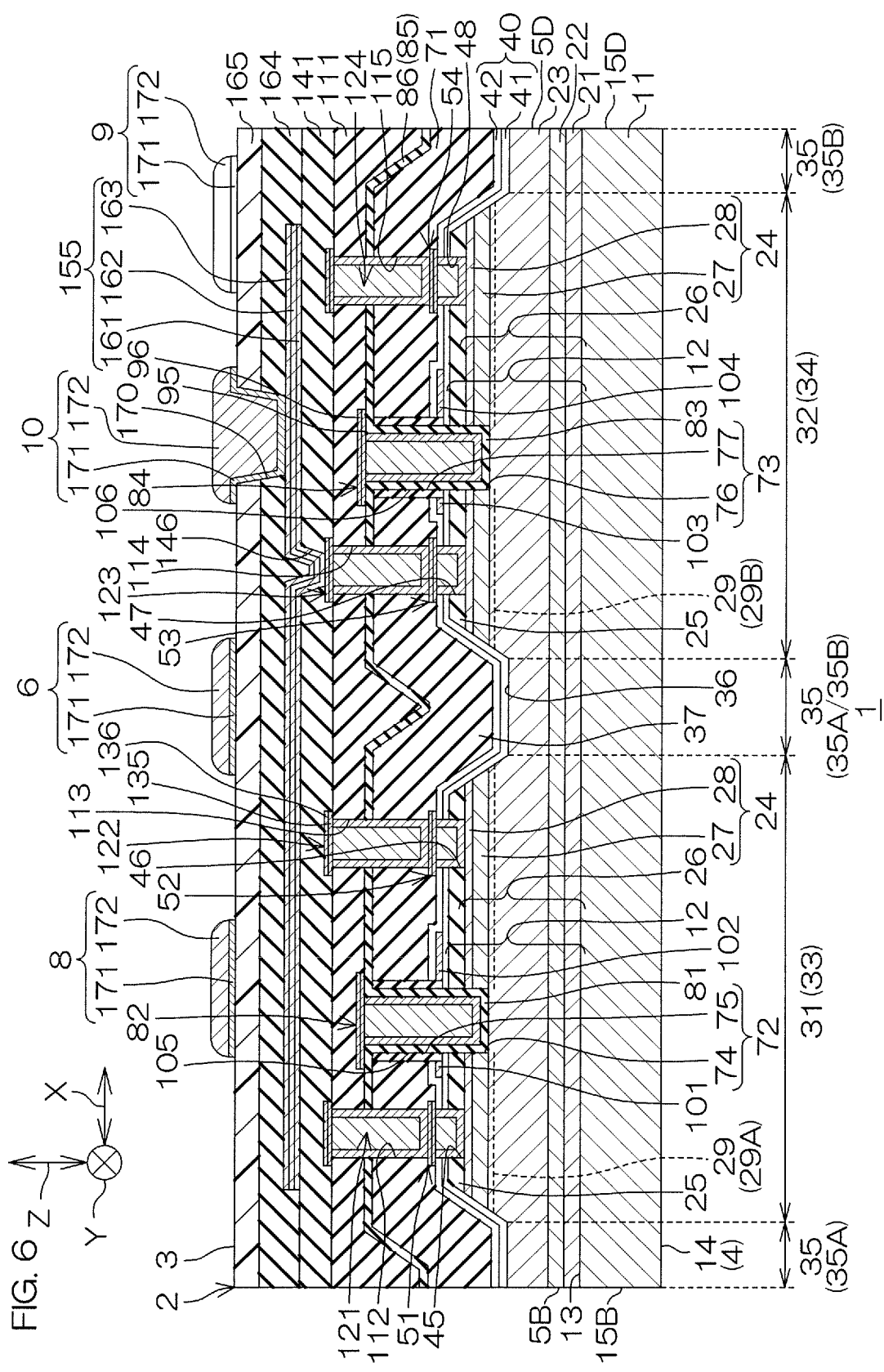
FIG. 6 is a cross-sectional view taken along line VI-VI shown in FIG. 1.
Figure 7:
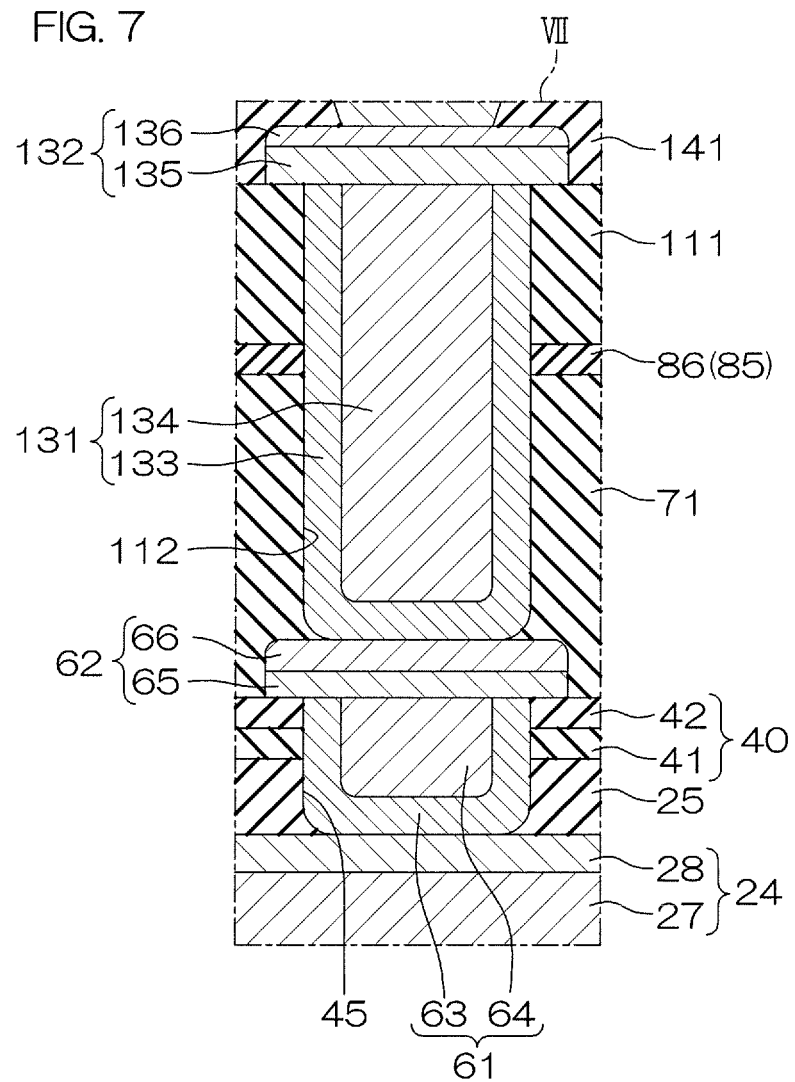
FIG. 7 is an enlarged view of region VII shown in FIG. 2.
Figure 8:
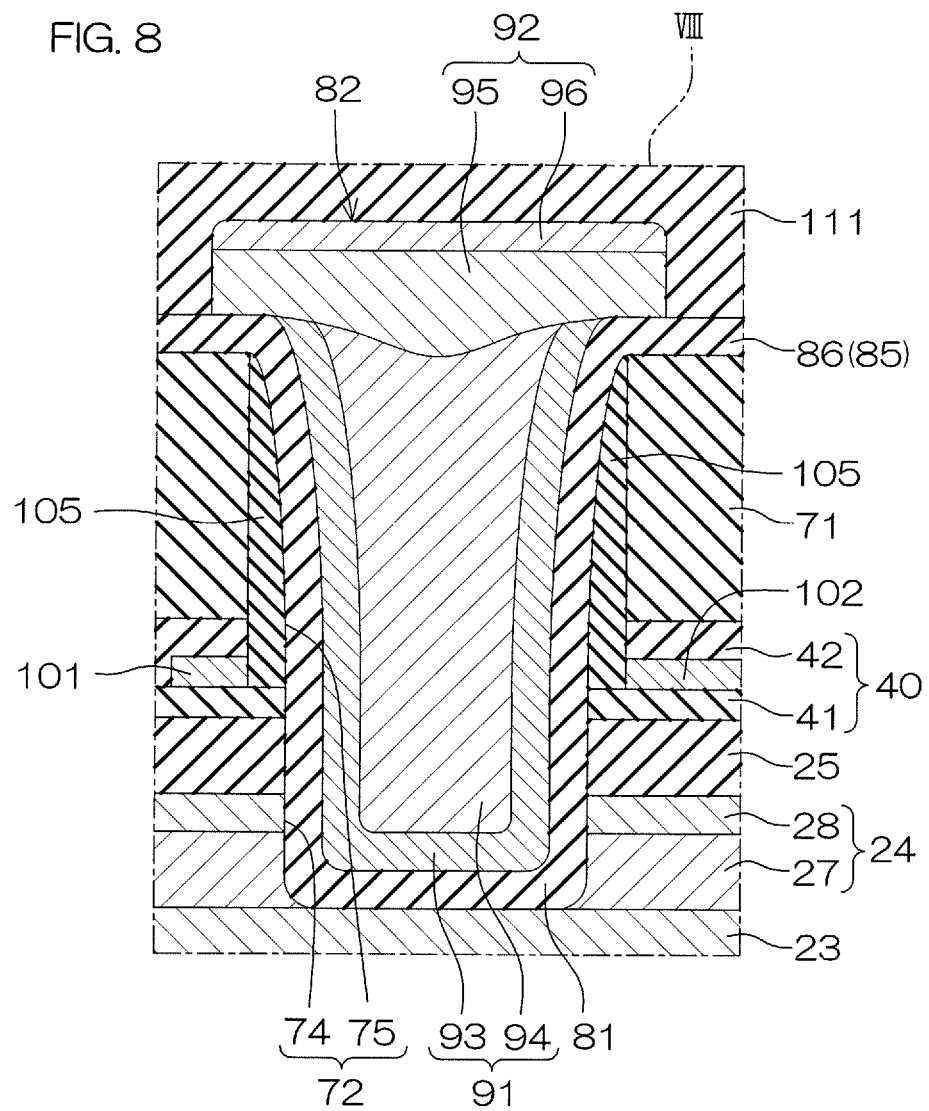
FIG. 8 is an enlarged view of region VIII shown in FIG. 2.

FIG. 2 is a cross-sectional view taken along line II-II shown in FIG. 1. FIG. 3 is a cross-sectional view taken along line shown in FIG. 1. FIG. 4 is a cross-sectional view taken along line IV-IV shown in FIG. 1. FIG. 5 is a cross-sectional view taken along line V-V shown in FIG. 1. FIG. 6 is a cross-sectional view taken along line VI-VI shown in FIG. 1. FIG. 7 is an enlarged view of region VII shown in FIG. 2. FIG. 8 is an enlarged view of region VIII shown in FIG. 2.

Referring to FIG. 2 to FIG. 6, the chip body 2 includes a substrate 11, and a laminated structure portion 12 formed on the substrate 11. The substrate 11 may be a Si substrate, a SiC substrate, a sapphire substrate, a GaN substrate, or the like. The substrate 11 consists of the Si substrate, in this preferred embodiment.

The substrate 11 includes a first main surface 13 on one side, a second main surface 14 on the other side, and four side surfaces 15A, 15B, 15C, and 15D that connect the first main surface 13 and the second main surface 14. The normal direction of the first main surface 13 and the second main surface 14 coincides with the normal direction Z. Thus, the plan view aforementioned is also a plan view when viewed in the normal direction Z to the first main surface 13 and the second main surface 14.

The first main surface 13 and the second main surface 14 have a planar shape that is aligned with the planar shape of the chip body 2 in plan view. The second main surface 14 of the substrate 11 forms the second chip main surface 4. The side surfaces 15A to 15D form parts of the chip side surfaces 5A to 5D, respectively.

The laminated structure portion 12 includes a core formation layer 21, a buffer layer 22, an electron transit layer 23, an electron supply layer 24, and a top insulating layer 25, which are formed in that order from the first main surface 13 of the substrate 11. The laminated structure portion 12 is formed by an epitaxial layer that is formed on the first main surface 13 by an epitaxial growth method. The core formation layer 21, the buffer layer 22, the electron transit layer 23, and the electron supply layer 24 in the laminated structure portion 12 define a semiconductor laminated structure portion 26 (semiconductor layer).

The core formation layer 21 is formed on the first main surface 13. The core formation layer 21 includes an AlN layer. The core formation layer 21 may have a thickness of 100 nm or more and 300 nm or less. The core formation layer 21 may have a thickness of 100 nm or more and 150 nm or less, 150 nm or more and 200 nm or less, 200 nm or more and 250 nm or less, or 250 nm or more and 300 nm or less. The core formation layer 21 has a thickness of approximately 200 nm, in this preferred embodiment.

The buffer layer 22 is formed on the core formation layer 21. The buffer layer 22 includes an AlGaN layer. The buffer layer 22 may have a thickness of 100 nm or more and 300 nm or less. The buffer layer 22 may have a thickness of 100 nm or more and 150 nm or less, 150 nm or more and 200 nm or less, 200 nm or more and 250 nm or less, or 250 nm or more and 300 nm or less. The buffer layer 22 has a thickness of approximately 200 nm, in this preferred embodiment.

The buffer layer 22 may have a laminated structure in which a plurality of (two or more) AlGaN layers having different Al composition ratios are laminated. The buffer layer 22 may have a plurality of (two or more) AlGaN layers that are laminated on the core formation layer 21 in an order in which the Al composition ratios gradually decrease toward a laminating direction.

The electron transit layer 23 includes $Al_xIn_yGa_{(1-x-y)}N$ ($0 \leq x+y \leq 1$). The electron transit layer 23 consists of GaN, in this preferred embodiment. The electron transit layer 23 may have a thickness of 50 nm or more and 300 nm or less. The electron transit layer 23 may have a thickness of 50 nm or more and 100 nm or less, 100 nm or more and 150 nm or less, 150 nm or more and 200 nm or less, 200 nm or more and 250 nm or less, or 250 nm or more and 300 nm or less. The electron transit layer 23 has a thickness of approximately 200 nm, in this preferred embodiment.

The electron transit layer 23 may include an undoped $Al_xIn_yGa_{(1-x-y)}N$ (GaN in this preferred embodiment). The electron transit layer 23 may include $Al_xIn_yGa_{(1-x-y)}N$ (GaN in this preferred embodiment) doped with carbon as an impurity.

The electron supply layer 24 is formed on the electron transit layer 23. The electron supply layer 24 includes a nitride semiconductor having an Al composition ratio z that is different from the Al composition ratio x of the electron transit layer 23. The electron supply layer 24 has the Al composition ratio z that is greater than the Al composition ratio x of the electron transit layer 23.

More specifically, the electron supply layer 24 includes a barrier layer 27 and a cap layer 28. The barrier layer 27 includes $Al_zGa_{(1-z)}N$ ($0<z\leq1$). The barrier layer 27 consists of AlN, in this preferred embodiment. The barrier layer 27 may have a thickness of 1 nm or more and 5 nm or less. The barrier layer 27 may have a thickness of 1 nm or more and 2 nm or less, 2 nm or more and 3 nm or less, 3 nm or more and 4 nm or less, or 4 nm or more and 5 nm or less. The barrier layer 27 has a thickness of approximately 2 nm, in this preferred embodiment.

The cap layer 28 is formed on the barrier layer 27. The cap layer 28 is formed to improve the flatness of a region on the barrier layer 27. The cap layer 28 may include GaN.

The cap layer 28 may have a thickness of 0.5 nm or more and 5 nm or less. The cap layer 28 may have a thickness of 0.5 nm or more and 1 nm or less, 1 nm or more and 2 nm or less, 2 nm or more and 3 nm or less, 3 nm or more and 4 nm or less, or 4 nm or more and 5 nm or less. The cap layer 28 has a thickness of approximately 1 nm, in this preferred embodiment. The cap layer 28 may have a thickness that is equal to or less than the thickness of the barrier layer 27.

The electron supply layer 24 has the Al composition ratio z that is greater than the Al composition ratio x of the electron transit layer 23. A lattice constant of the electron supply layer 24 is less than a lattice constant of the electron transit layer 23. This causes a lattice mismatch between the electron supply layer 24 and the electron transit layer 23. Furthermore, the electron supply layer 24 has a tensile strain occurring along a direction parallel to a growth surface of the electron supply layer 24.

In a boundary region between the electron transit layer 23 and the electron supply layer 24, an energy level of a conduction band of the electron transit layer 23 is equal to or less than a Fermi level due to a spontaneous polarization of the electron transit layer 23 and the electron supply layer 24 and due to a piezo polarization caused by the lattice mismatch between the electron transit layer 23 and the electron supply layer 24. Thus, a two-dimensional electron gas region 29 is formed in a surface layer portion of the electron transit layer 23 in the boundary region between the electron transit layer 23 and the electron supply layer 24. In FIG. 2 to FIG. 6, the two-dimensional electron gas region 29 is shown by a broken line.

The top insulating layer 25 is formed on the electron supply layer 24. The top insulating layer 25 includes an SiN layer. The top insulating layer 25 is also referred to as a passivation layer. The top insulating layer 25 may have a thickness of 1 nm or more and 30 nm or less. The top insulating layer 25 may have a thickness of 1 nm or more and 10 nm or less, 10 nm or more and 20 nm or less, or 20 nm or more and 30 nm or less. The top insulating layer 25 has a thickness of approximately 10 nm, in this preferred embodiment.

A first device formation region 31 and a second device formation region 32 are defined in the laminated structure portion 12. A first HEMT (High Electron Mobility Transistor) 33 is formed in the first device formation region 31. A second HEMT 34 is formed in the second device formation region 32.

The first device formation region 31 is defined in a region at one end portion side of the laminated structure portion 12 in regard to the first direction X, in this preferred embodiment. More specifically, the first device formation region 31 is defined in a region at the side surface 15B side in the laminated structure portion 12.

The first device formation region 31 is formed in a quadrangular shape (a square shape in this preferred embodiment) having four sides parallel to the side surfaces 15A to 15D in plan view. The planar shape of the first device formation region 31 is arbitrary and not limited to the quadrangular shape. The first device formation region 31 may be defined in a polygonal shape, circular shape, elliptical shape, or the like in plan view.

The second device formation region 32 is defined in a region at the other end portion side of the laminated structure portion 12 in regard to the first direction X, in this preferred embodiment. More specifically, the second device formation region 32 is defined in a region at the side surface 15D side in the laminated structure portion 12.

The second device formation region 32 is defined in a quadrangular shape (a square shape in this preferred embodiment) having four sides parallel to the side surfaces 15A to 15D in plan view. The planar shape of the second device formation region 32 is arbitrary and not limited to the quadrangular shape. The second device formation region 32 may be defined in a polygonal shape, circular shape, elliptical shape, or the like in plan view.

Figure 9:
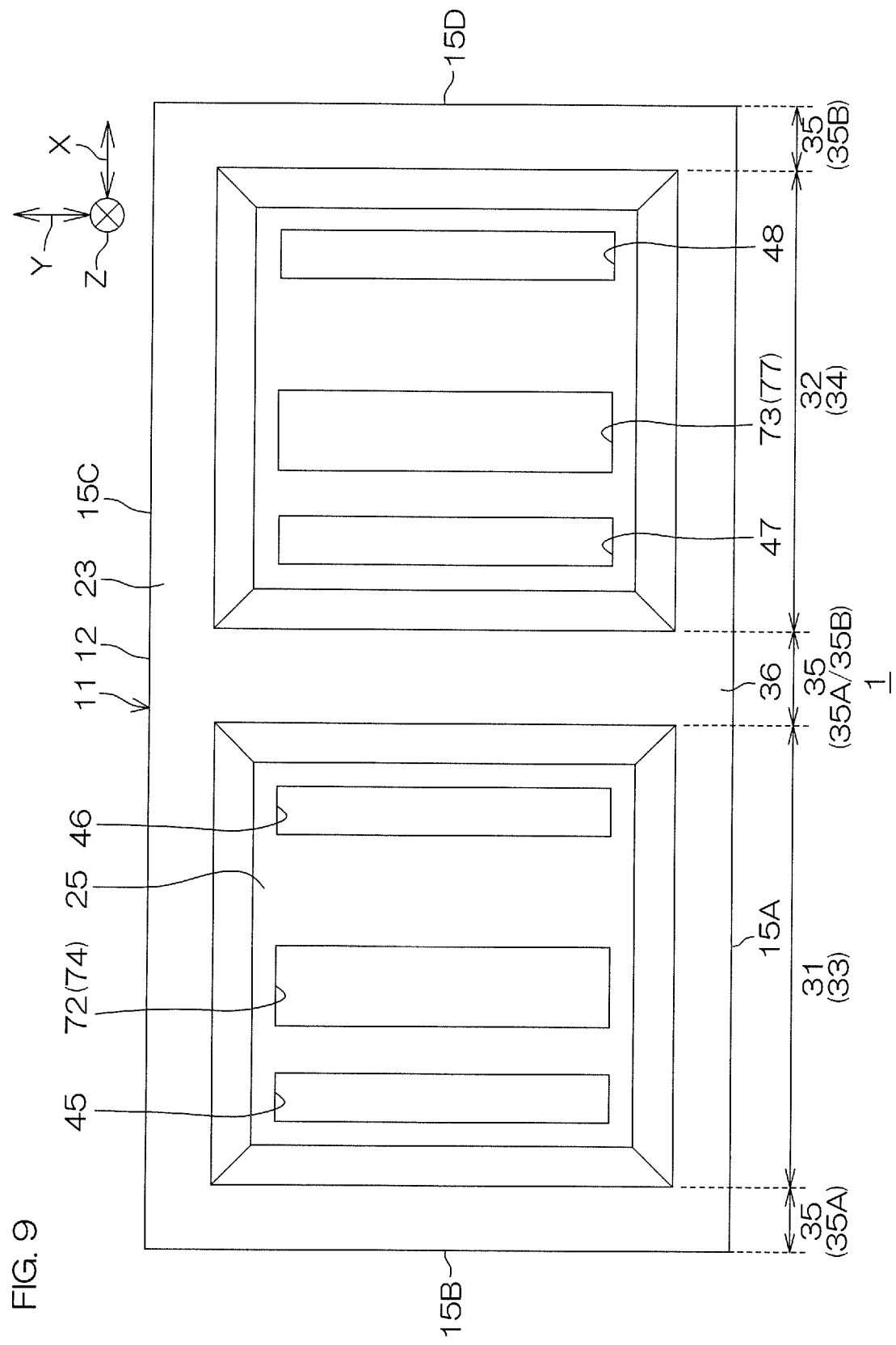
FIG. 9 is a plan view for explaining a mode of a laminated structure portion with structures above the laminated structure portion being removed.

A region separation structure 35 that defines the first device formation region 31 and the second device formation region 32 is formed in the laminated structure portion 12. Hereinafter, referring also to FIG. 9, a mode of the region separation structure 35 shall be described. FIG. 9 is a plan view for explaining the mode of the laminated structure portion 12 with structures above the laminated structure portion 12 being removed.

Referring to FIG. 2 to FIG. 9, the region separation structure 35 is formed in a region between the first device formation region 31 and the second device formation region 32, and separates the first device formation region 31 and the second device formation region 32 from each other.

More specifically, the region separation structure 35 includes a first region separation structure 35A and a second region separation structure 35B. The first region separation structure 35A is formed in an endless shape (an annular quadrangular shape in this preferred embodiment) surrounding the first device formation region 31 in plan view. The second region separation structure 35B is formed in an endless shape (an annular quadrangular shape in this preferred embodiment) surrounding the second device formation region 32 in plan view. The first region separation structure 35A and the second region separation structure 35B communicate with each other in a region between the first device formation region 31 and the second device formation region 32.

The region separation structure 35 includes a region separation trench 36, and an embedded insulator 37 embedded in the region separation trench 36. The region separation trench 36 penetrates the electron supply layer 24 from the main surface of the laminated structure portion 12 and exposes the electron transit layer 23.

The region separation trench 36 has sidewalls and a bottom wall. The top insulating layer 25, the electron supply layer 24 and the electron transit layer 23 are exposed from the sidewalls of the region separation trench 36. The electron transit layer 23 is exposed from the bottom wall of the region separation trench 36.

The region separation trench 36 divides the two-dimensional electron gas region 29 into a first two-dimensional electron gas region 29A of the first device formation region 31 side and a second two-dimensional electron gas region 29B of the second device formation region 32 side. The first HEMT 33 operates with the first two-dimensional electron gas region 29A as a channel. The second HEMT 34 operates with the second two-dimensional electron gas region 29B as a channel.

The region separation trench 36 is formed in a tapered shape that has an opening area greater than a bottom area. A portion along the peripheral edge of the substrate 11 in the bottom wall of the region separation trench 36 communicates with the side surfaces 15A to 15D, in this preferred embodiment.

The region separation trench 36 may have a depth of 3 nm or more and 100 nm or less. The depth of the region separation trench 36 is the distance along the normal direction Z between the main surface of the laminated structure portion 12 and the bottom wall of the region separation trench 36. The region separation trench 36 may have a depth of 3 nm or more and 20 nm or less, 20 nm or more and 40 nm or less, 40 nm or more and 60 nm or less, 60 nm or more and 80 nm or less, or 80 nm or more and 100 nm or less. The region separation trench 36 has a depth of approximately 60 nm, in this preferred embodiment.

The first device formation region 31 has an inclined surface that is downwardly inclined from the main surface of the laminated structure portion 12 toward the bottom wall of the region separation trench 36. Thus, the first device formation region 31 is formed in a frustum shape (a truncated square pyramidal shape in this preferred embodiment). The second device formation region 32 has an inclined surface that is downwardly inclined from the main surface of the laminated structure portion 12 toward the bottom wall of the region separation trench 36. Thus, the second device formation region 32 is formed in a frustum shape (a truncated square pyramidal shape in this preferred embodiment).

The embedded insulator 37 enhances insulation properties of the first two-dimensional electron gas region 29A and the second two-dimensional electron gas region 29B. The embedded insulator 37 has a laminated structure in which a plurality of insulating layers are laminated. The specific structure of the embedded insulator 37 will be described later.

Referring to FIG. 2 to FIG. 8, a protection layer 40 made of an insulator is formed on the laminated structure portion 12. The protection layer 40 is formed in a film shape along the main surface of the laminated structure portion 12 and an inner wall of the region separation trench 36. The protection layer 40 defines a recessed space in the region separation trench 36.

The protection layer 40 has a laminated structure that includes a first protection layer 41 and a second protection layer 42, in this preferred embodiment. The first protection layer 41 is formed in a film shape along the main surface of the laminated structure portion 12 and the inner wall of the region separation trench 36. The second protection layer 42 is formed in a film shape along the main surface of the first protection layer 41.

The first protection layer 41 may have a thickness of 10 nm or more and 100 nm or less. The first protection layer 41 may have a thickness of 10 nm or more and 25 nm or less, 25 nm or more and 50 nm or less, 50 nm or more and 75 nm or less, or 75 nm or more and 100 nm or less. The first protection layer 41 has a thickness of approximately 40 nm, in this preferred embodiment.

The second protection layer 42 may have a thickness of 50 nm or more and 200 nm or less. The second protection layer 42 may have a thickness of 50 nm or more and 75 nm or less, 75 nm or more and 100 nm or less, 100 nm or more and 125 nm or less, or 125 nm or more and 150 nm or less, 150 nm or more and 175 nm or less, or 175 nm or more and 200 nm or less. The thickness of the second protection layer 42 may be equal to or greater than the thickness of the first protection layer 41. The second protection layer 42 has a thickness of approximately 100 nm, in this preferred embodiment.

The first protection layer 41 may include at least one of SiO2 and SiN. The second protection layer 42 may include at least one of SiO2 and SiN.

The second protection layer 42 may have an insulation material having a property that is different from a property of the first protection layer 41. For example, the first protection layer 41 may include CVD-SiO2 formed by a CVD method, while the second protection layer 42 may include TEOS-SiO2 formed by a plasma CVD method.

A first source opening 45, a first drain opening 46, a second source opening 47, and a second drain opening 48 are formed in the protection layer 40 and the top insulating layer 25.

The first source opening 45 and the first drain opening 46 are formed in the first device formation region 31. The first source opening 45 and the first drain opening 46 are formed to be spaced apart from each other along the first direction X. The first source opening 45 and the first drain opening 46 extend in band shapes along the second direction Y. The first source opening 45 and the first drain opening 46 penetrate the protection layer 40 and the top insulating layer 25 such as to expose the electron supply layer 24.

The second source opening 47 and the second drain opening 48 are formed in the second device formation region 32. The second source opening 47 and the second drain opening 48 are formed to be spaced apart from each other along the first direction X. The second source opening 47 and the second drain opening 48 extend in band shapes along the second direction Y. The second source opening 47 and the second drain opening 48 penetrate the protection layer 40 and the top insulating layer 25 such as to expose the electron supply layer 24.

A first source electrode 51 and a first drain electrode 52 are formed in the first device formation region 31. The first source electrode 51 is embedded in the first source opening 45, and the first drain electrode 52 is embedded in the first drain opening 46.

A second source electrode 53 and a second drain electrode 54 are formed in the second device formation region 32. The second source electrode 53 is embedded in the second source opening 47, and the second drain electrode 54 is embedded in the second drain opening 48.

Figure 10:
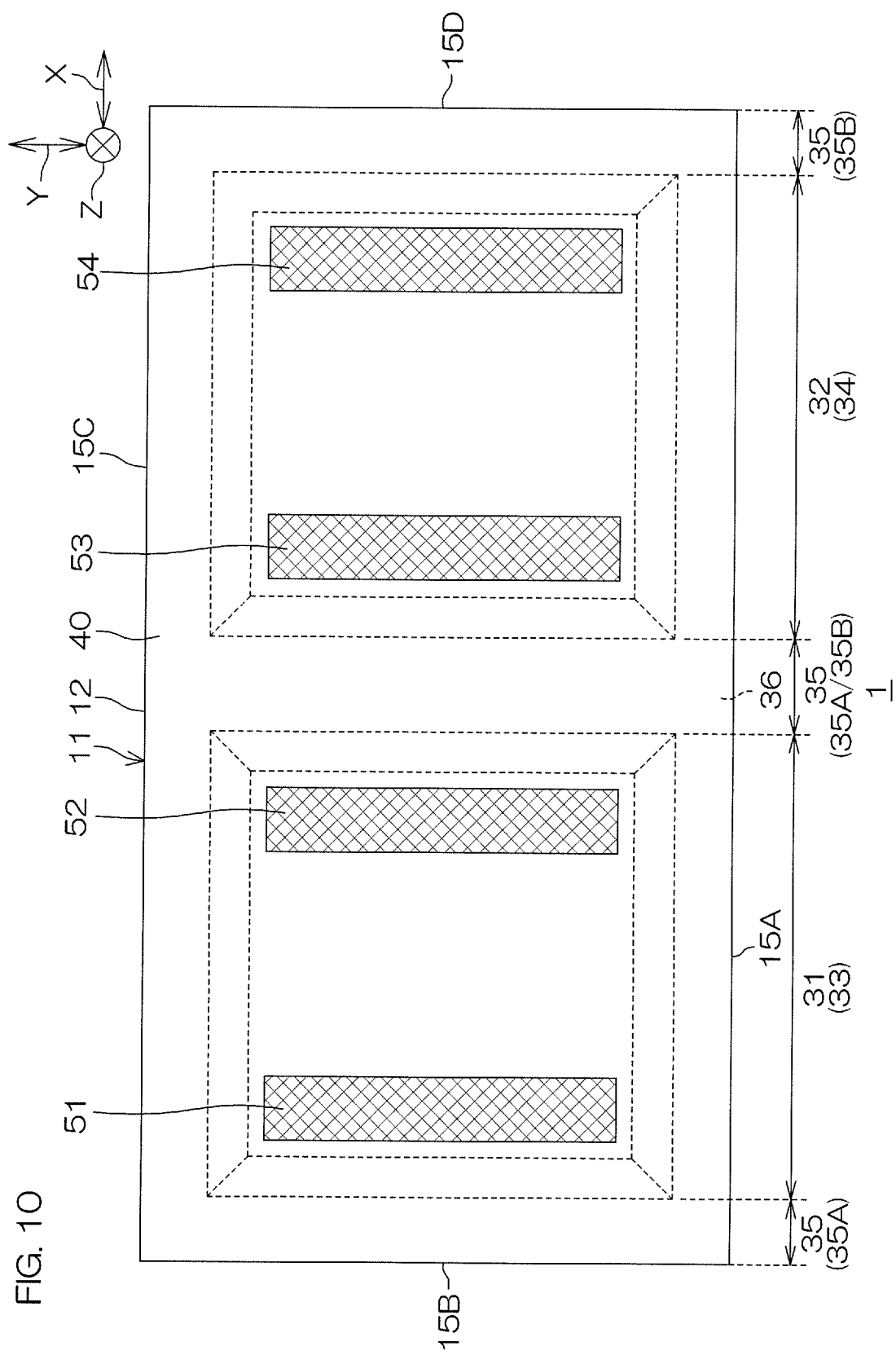
FIG. 10 is a plan view with structures above a first source electrode, a first drain electrode, a second source electrode, and second drain electrode being removed.

Hereinafter, referring also to FIG. 10, modes of the first source electrode 51, the first drain electrode 52, the second source electrode 53, and the second drain electrode 54 shall be described. FIG. 10 is a plan view with structures above the first source electrode 51, the first drain electrode 52, the second source electrode 53, and the second drain electrode 54 being removed.

Referring to FIG. 10, the first source electrode 51 and the first drain electrode 52 are formed to be spaced apart from each other along the first direction X, in this preferred embodiment. The first source electrode 51 and the first drain electrode 52 extend in band shapes along the second direction Y.

The second source electrode 53 and the second drain electrode 54 are formed to be spaced apart from each other along the first direction X, in this preferred embodiment. The second source electrode 53 and the second drain electrode 54 extend in band shapes along the second direction Y.

Referring to FIG. 2 to FIG. 8 (particularly, FIG. 7), the first source electrode 51 includes an embedded electrode layer 61 and a cover electrode layer 62. The embedded electrode layer 61 is embedded in the first source opening 45. The cover electrode layer 62 covers the embedded electrode layer 61. The embedded electrode layer 61 has a laminated structure that includes a first embedded electrode layer 63 and a second embedded electrode layer 64, in this preferred embodiment.

The first embedded electrode layer 63 is formed in a film shape along an inner wall of the first source opening 45. The first embedded electrode layer 63 defines a recessed space in the first source opening 45. The first embedded electrode layer 63 is formed as a barrier electrode layer, in this preferred embodiment. The first embedded electrode layer 63 may include at least one of Ti and TiN. The first embedded electrode layer 63 consists of a Ti layer, in this preferred embodiment.

The first embedded electrode layer 63 may have a thickness of 10 nm or more and 30 nm or less. The first embedded electrode layer 63 may have a thickness of 10 nm or more and 15 nm or less, 15 nm or more and 20 nm or less, 20 nm or more and 25 nm or less, or 25 nm or more and 30 nm or less. The first embedded electrode layer 63 has a thickness of approximately 20 nm, in this preferred embodiment.

The second embedded electrode layer 64 is embedded in the first source opening 45 with the first embedded electrode layer 63 interposed between the second embedded electrode layer 64 and the first source opening 45. The second embedded electrode layer 64 may include at least one of Al, Si and Cu. The second embedded electrode layer 64 may include at least one of a conductive poly-Si layer, an AlSiCu alloy layer, and an AlCu alloy layer. The second embedded electrode layer 64 consists of the AlCu alloy layer, in this preferred embodiment.

The second embedded electrode layer 64 may have a thickness of 1500 nm or more and 2500 nm or less. The second embedded electrode layer 64 may have a thickness of 1500 nm or more and 1750 nm or less, 1750 nm or more and 2000 nm or less, 2000 nm or more and 2250 nm or less, or 2250 nm or more and 2500 nm or less. The thickness of the second embedded electrode layer 64 is equal to or greater than the thickness of the first embedded electrode layer 63.

The second embedded electrode layer 64 has a thickness of approximately 2000 nm, in this preferred embodiment.

The cover electrode layer 62 covers the embedded electrode layer 61 on the protection layer 40. The cover electrode layer 62 overlaps an opening edge portion of the first source opening 45. More specifically, the cover electrode layer 62 overlaps the protection layer 40. The cover electrode layer 62 is formed as a barrier electrode layer, in this preferred embodiment.

The cover electrode layer 62 has a laminated structure that includes a first cover electrode layer 65 and a second cover electrode layer 66 laminated in that order from the embedded electrode layer 61 side, in this preferred embodiment. The cover electrode layer 62 may have a single-layer structure that includes only either one of the first cover electrode layer 65 and the second cover electrode layer 66.

The first cover electrode layer 65 includes a Ti layer, in this preferred embodiment. The first cover electrode layer 65 may have a thickness of 10 nm or more and 30 nm or less. The first cover electrode layer 65 may have a thickness of 10 nm or more and 15 nm or less, 15 nm or more and 20 nm or less, 20 nm or more and 25 nm or less, or 25 nm or more and 30 nm or less. The first cover electrode layer 65 has a thickness of approximately 20 nm, in this preferred embodiment.

The second cover electrode layer 66 includes a TiN layer, in this preferred embodiment. The second cover electrode layer 66 may have a thickness of 10 nm or more and 100 nm or less. The second cover electrode layer 66 may have a thickness of 10 nm or more and 25 nm or less, 25 nm or more and 50 nm or less, 50 nm or more and 75 nm or less, or 75 nm or more and 100 nm or less. The thickness of the second cover electrode layer 66 may be equal to or greater than the thickness of the first cover electrode layer 65. The second cover electrode layer 66 has a thickness of approximately 50 nm, in this preferred embodiment.

The first drain electrode 52, the second source electrode 53, and the second drain electrode 54 each have a structure similar to the structure of the first source electrode 51. The description for the first source electrode 51 is applied mutatis mutandis to the descriptions for the first drain electrode 52, the second source electrode 53, and the second drain electrode 54, respectively. The structures corresponding to the structure of the first source electrode 51 in the first drain electrode 52, the second source electrode 53, and the second drain electrode 54 will be given the same reference symbols and descriptions thereof will be omitted.

Referring to FIG. 2 to FIG. 8, a first interlayer insulating layer 71 is formed on the protection layer 40. A main surface of the first interlayer insulating layer 71 may be a ground surface. The first interlayer insulating layer 71 may include at least one of SiO2 and SiN.

The first interlayer insulating layer 71 may have a thickness of 200 nm or more and 1000 nm or less. The first interlayer insulating layer 71 may have a thickness of 200 nm or more and 500 nm or less, 500 nm or more and 750 nm or less, or 750 nm or more and 1000 nm or less. The first interlayer insulating layer 71 has a thickness of approximately 500 nm, in this preferred embodiment.

The first interlayer insulating layer 71 is formed in a film shape along a main surface of the protection layer 40. The first interlayer insulating layer 71 enters the recessed space defined by the protection layer 40 in the region separation trench 36.

An insulation laminated structure that includes the protection layer 40 and the first interlayer insulating layer 71 laminated in that order from the bottom wall side of the region separation trench 36 is thus formed in the region separation trench 36. The embedded insulator 37 is formed by the insulation laminated structure.

That is, the embedded insulator 37 has an insulation laminated structure in which a plurality of insulating layers are laminated. The first device formation region 31 and the second device formation region 32 are insulated from each other by the embedded insulator 37 that includes the insulation laminated structure.

A first gate opening 72 and a second gate opening 73 are formed in the first interlayer insulating layer 71, the protection layer 40, the top insulating layer 25, and the electron supply layer 24.

The first gate opening 72 is formed in the first device formation region 31. The first gate opening 72 is formed in a region between the first source opening 45 and the first drain opening 46. The first gate opening 72 is formed to be spaced apart from the first source opening 45 and the first drain opening 46 along the first direction X, in this preferred embodiment.

In regard to the first direction X, a distance between the first gate opening 72 and the first source opening 45 is less than a distance between the first gate opening 72 and the first drain opening 46. The first gate opening 72 may be formed in a band shape that extends along the second direction Y in plan view.

The first gate opening 72 penetrates the first interlayer insulating layer 71, the protection layer 40, the top insulating layer 25, and the electron supply layer 24 such as to expose the electron transit layer 23. A formation of the first two-dimensional electron gas region 29A is suppressed at a portion exposed from the bottom wall of the first gate opening 72 in the electron transit layer 23. The first HEMT 33 is thus formed as a normally OFF type device.

The first gate opening 72, more specifically, includes a first gate contact hole 74 and a first through hole 75. The first gate contact hole 74 is formed in the electron supply layer 24 such as to expose the electron transit layer 23. The first through hole 75 is formed in the first interlayer insulating layer 71, the protection layer 40, and the top insulating layer 25 such as to communicate with the first gate contact hole 74.

The second gate opening 73 is formed in the second device formation region 32. The second gate opening 73 is formed in a region between the second source opening 47 and the second drain opening 48. The second gate opening 73 is formed to be spaced apart from the second source opening 47 and the second drain opening 48 along the first direction X, in this preferred embodiment.

In the first direction X, a distance between the second gate opening 73 and the second source opening 47 is less than a distance between the second gate opening 73 and the second drain opening 48. The second gate opening 73 may be formed in a band shape that extends along the second direction Y in plan view.

The second gate opening 73 penetrates the first interlayer insulating layer 71, the protection layer 40, the top insulating layer 25, and the electron supply layer 24 such as to expose the electron transit layer 23. A formation of the second two-dimensional electron gas region 29B is suppressed at a portion exposed from the bottom wall of the second gate opening 73 in the electron transit layer 23. The second HEMT 34 is thus formed as a normally OFF type device.

The second gate opening 73, more specifically, includes a second gate contact hole 76 and a second through hole 77. The second gate contact hole 76 is formed in the electron supply layer 24 such as to expose the electron transit layer 23. The second through hole 77 is formed in the first interlayer insulating layer 71, the protection layer 40, and the top insulating layer 25 such as to communicate with the second gate contact hole 76.

A first gate insulating layer 81 and a first gate electrode 82 is formed in the first device formation region 31. The first gate insulating layer 81 is formed in a film shape along an inner wall of the first gate opening 72. The first gate insulating layer 81 defines a recessed space in the first gate opening 72. The first gate electrode 82 is embedded in the first gate opening 72 with the first gate insulating layer 81 interposed between the first gate electrode 82 and the first gate opening 72. The first gate electrode 82 is embedded in the recessed space defined by the first gate insulating layer 81 in the first gate opening 72.

A second gate insulating layer 83 and a second gate electrode 84 are formed in the second device formation region 32. The second gate insulating layer 83 is formed in a film shape along an inner wall of the second gate opening 73. The second gate insulating layer 83 defines a recessed space in the second gate opening 73. The second gate electrode 84 is embedded in the second gate opening 73 with the second gate insulating layer 83 interposed between the second gate electrode 84 and the second gate opening 73. The second gate electrode 84 is embedded in the recessed space defined by the second gate insulating layer 83 in the second gate opening 73.

Figure 11:
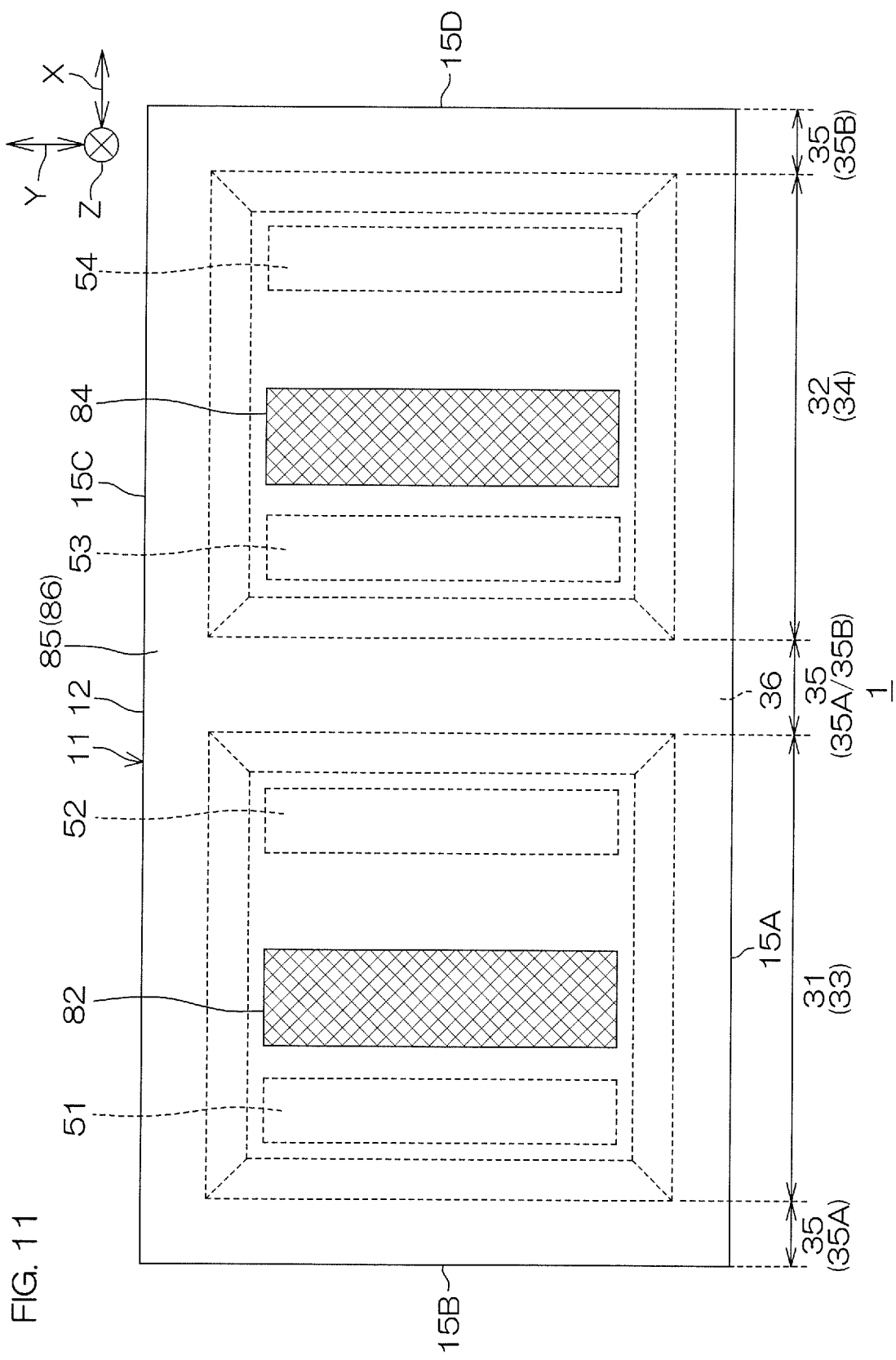
FIG. 11 is a plan view with structures above a first gate electrode and a second gate electrode being removed.

Hereinafter, modes of the first gate electrode 82 and the second gate electrode 84 will be described. FIG. 11 is a plan view with structures above the first gate electrode 82 and the second gate electrode 84 being removed.

Referring to FIG. 11, the first gate electrode 82 is formed in a region between the first source electrode 51 and the first drain electrode 52. The first gate electrode 82 is formed to be spaced apart from the first source electrode 51 and the first drain electrode 52 along the first direction X.

In the first direction X, a distance between the first gate electrode 82 and the first source electrode 51 is less than a distance between the first gate electrode 82 and the first drain electrode 52. The first gate electrode 82 extends in a band shape along the second direction Y.

The second gate electrode 84 is formed in a region between the second source electrode 53 and the second drain electrode 54. The second gate electrode 84 is formed to be spaced apart from the second source electrode 53 and the second drain electrode 54 along the first direction X.

In the first direction X, a distance between the second gate electrode 84 and the second source electrode 53 is less than a distance between the second gate electrode 84 and the second drain electrode 54. The second gate electrode 84 extends in a band shape along the second direction Y.

Referring to FIG. 2 to FIG. 8 (particularly, FIG. 8), a main surface insulating layer 85 is formed on a main surface of the first interlayer insulating layer 71. The main surface insulating layer 85 covers the main surface of the first interlayer insulating layer 71. The main surface insulating layer 85 communicates with the first gate insulating layer 81 and the second gate insulating layer 83.

That is, an insulating layer 86 that integrally includes the first gate insulating layer 81, the second gate insulating layer 83, and the main surface insulating layer 85 is formed on the first interlayer insulating layer 71. The first gate insulating layer 81, the second gate insulating layer 83, and the main surface insulating layer 85 may each include at least one of SiO2 and SiN.

The first gate insulating layer 81, the second gate insulating layer 83, and the main surface insulating layer 85 may each have a thickness of 1 nm or more and 100 nm or less. The first gate insulating layer 81, the second gate insulating layer 83, and the main surface insulating layer 85 may each have a thickness of 1 nm or more and 25 nm or less, 25 nm or more and 50 nm or less, 50 nm or more and 75 nm or less, or 75 nm or more and 100 nm or less. The first gate insulating layer 81, the second gate insulating layer 83 and the main surface insulating layer 85 have a thickness of approximately 20 nm, in this preferred embodiment.

The first gate electrode 82 includes an embedded electrode layer 91 and a cover electrode layer 92. The embedded electrode layer 91 is embedded in the first gate opening 72. The cover electrode layer 92 covers the embedded electrode layer 91.

The embedded electrode layer 91 has a laminated structure that includes a first embedded electrode layer 93 and a second embedded electrode layer 94, in this preferred embodiment. The first embedded electrode layer 93 is formed in a film shape along the inner wall of the first gate opening 72. The first embedded electrode layer 93 defines a recessed space in the first gate opening 72.

The first embedded electrode layer 93 is formed as a barrier electrode layer, in this preferred embodiment. The first embedded electrode layer 93 may include at least one of Ti and TiN. The first embedded electrode layer 93 consists of a TiN layer, in this preferred embodiment.

The first embedded electrode layer 93 may have a thickness of 50 nm or more and 200 nm or less. The first embedded electrode layer 93 may have a thickness of 50 nm or more and 75 nm or less, 75 nm or more and 100 nm or less, 100 nm or more and 125 nm or less, 125 nm or more and 150 nm or less, 150 nm or more and 175 nm or less, or 175 nm or more and 200 nm or less. The first embedded electrode layer 93 has a thickness of approximately 100 nm, in this preferred embodiment.

The second embedded electrode layer 94 is embedded in the first gate opening 72 with the first embedded electrode layer 93 interposed between the second embedded electrode layer 94 and the first gate opening 72. The second embedded electrode layer 94 is embedded in the recessed space defined by the first embedded electrode layer 93 in the first gate opening 72. The second embedded electrode layer 94 includes a W (tungsten) layer, in this preferred embodiment.

The second embedded electrode layer 94 may have a thickness of 100 nm or more and 1000 nm or less. The second embedded electrode layer 94 may have a thickness of 100 nm or more and 250 nm or less, 250 nm or more and 500 nm or less, 500 nm or more and 750 nm or less, or 750 nm or more and 1000 nm or less. The thickness of the second embedded electrode layer 94 may be equal to or greater than the thickness of the first embedded electrode layer 93. The second embedded electrode layer 94 has a thickness of approximately 500 nm, in this preferred embodiment.

The cover electrode layer 92 covers the embedded electrode layer 91 on the main surface insulating layer 85. The cover electrode layer 92 overlaps an opening edge portion of the first gate opening 72. More specifically, the cover electrode layer 92 overlaps the main surface insulating layer 85.

The cover electrode layer 92 has a laminated structure that includes a first cover electrode layer 95 and a second cover electrode layer 96 laminated in that order from the embedded electrode layer 91 side, in this preferred embodiment. The cover electrode layer 92 may include only either one of the first cover electrode layer 95 and the second cover electrode layer 96.

The first cover electrode layer 95 may include at least one of Al, Si, and Cu. The first cover electrode layer 95 may include at least one of a conductive Poly-Si layer, an AlSiCu alloy layer, and an AlCu alloy layer. The first cover electrode layer 95 consists of the AlCu alloy layer, in this preferred embodiment.

The first cover electrode layer 95 may have a thickness of 100 nm or more and 1000 nm or less. The first cover electrode layer 95 may have a thickness of 100 nm or more and 250 nm or less, 250 nm or more and 500 nm or less, 500 nm or more and 750 nm or less, or 750 nm or more and 1000 nm or less. The first cover electrode layer 95 has a thickness of approximately 500 nm, in this preferred embodiment.

The second cover electrode layer 96 is formed as a barrier electrode layer, in this preferred embodiment. The second cover electrode layer 96 may include at least one of Ti and TiN. The second cover electrode layer 96 consists of a TiN layer, in this preferred embodiment.

The second cover electrode layer 96 may have a thickness of 10 nm or more and 100 nm or less. The second cover electrode layer 96 may have a thickness of 10 nm or more and 25 nm or less, 25 nm or more and 50 nm or less, 50 nm or more and 75 nm or less, or 75 nm or more and 100 nm or less. The thickness of the second cover electrode layer 96 may be equal to or less than the thickness of the first cover electrode layer 95. The second cover electrode layer 96 has a thickness of approximately 50 nm, in this preferred embodiment.

The second gate electrode 84 has a structure similar to the structure of the first gate electrode 82. The description for the first gate electrode 82 is applied mutatis mutandis to the description for the second gate electrode 84. The structures corresponding to the structure of the first gate electrode 82 in the second gate electrode 84 will be given the same reference symbols and descriptions thereof will be omitted.

Referring to FIG. 2 to FIG. 8, a first source field electrode layer 101 and a first floating electrode layer 102 is formed in the first device formation region 31. The first source field electrode layer 101 and the first floating electrode layer 102 relieve an electric field with respect to the first gate electrode 82.

The first source field electrode layer 101 is formed in a region between the first source electrode 51 and the first gate electrode 82. The first source field electrode layer 101 is formed to be spaced apart from the first source electrode 51 and the first gate electrode 82 along the first direction X. The first source field electrode layer 101 is formed closer to the first gate electrode 82 than the first source electrode 51. The first source field electrode layer 101 may extend in a band shape along the second direction Y. A reference voltage (e.g., a source voltage or a ground voltage) is applied to the first source field electrode layer 101.

The first floating electrode layer 102 is formed in a region between the first drain electrode 52 and the first gate electrode 82. The first source field electrode layer 101 is formed to be spaced apart from the first drain electrode 52 and the first gate electrode 82 along the first direction X. The first floating electrode layer 102 is formed closer to the first gate electrode 82 than the first drain electrode 52. The first floating electrode layer 102 may extend in a band shape along the second direction Y. The first floating electrode layer 102 is formed in an electrically floating state.

The first source field electrode layer 101 and the first floating electrode layer 102 oppose each other along the first direction X with the first gate electrode 82 interposed between the source field electrode layer 101 and the first floating electrode layer 102. The first source field electrode layer 101 and the first floating electrode layer 102 are formed in the protection layer 40, in this preferred embodiment. More specifically, the first source field electrode layer 101 and the first floating electrode layer 102 are interposed in a region between the first protection layer 41 and the second protection layer 42.

A second source field electrode layer 103 and a second floating electrode layer 104 are formed in the second device formation region 32. The second source field electrode layer 103 and the second floating electrode layer 104 relieve an electric field with respect to the second gate electrode 84.

The second source field electrode layer 103 is formed in a region between the second source electrode 53 and the second gate electrode 84. The second source field electrode layer 103 is formed to be spaced apart from the second source electrode 53 and the second gate electrode 84 in the first direction X. The second source field electrode layer 103 is formed closer to the second gate electrode 84 than the second source electrode 53. The second source field electrode layer 103 may extend in a band shape along the second direction Y. A reference voltage (e.g., a source voltage or a ground voltage) is applied to the second source field electrode layer 103.

The second floating electrode layer 104 is formed in a region between the second drain electrode 54 and the second gate electrode 84. The second floating electrode layer 104 is formed to be spaced apart from the second drain electrode 54 and the second gate electrode 84 in the first direction X. The second floating electrode layer 104 is formed closer to the second gate electrode 84 than the second drain electrode 54. The second floating electrode layer 104 may extend in a band shape along the second direction Y. The second floating electrode layer 104 is formed in an electrically floating state.

The second source field electrode layer 103 and the second floating electrode layer 104 oppose each other in the first direction X with the second gate electrode 84 interposed between the second source field electrode layer 103 and the second floating electrode layer 104. The second source field electrode layer 103 and the second floating electrode layer 104 are formed in the protection layer 40, in this preferred embodiment. More specifically, the second source field electrode layer 103 and the second floating electrode layer 104 are interposed in a region between the first protection layer 41 and the second protection layer 42.

The first source field electrode layer 101, the first floating electrode layer 102, the second source field electrode layer 103, and the second floating electrode layer 104 may include a conductive material of the same type.

The first source field electrode layer 101, the first floating electrode layer 102, the second source field electrode layer 103, and the second floating electrode layer 104 may include at least one of Ti and TiN. The first source field electrode layer 101, the first floating electrode layer 102, the second source field electrode layer 103, and the second floating electrode layer 104 respectively consists of a TiN layer, in this preferred embodiment.

The first floating electrode layer 102, the first source field electrode layer 101, the second floating electrode layer 104, and the second source field electrode layer 103 may have a thickness of 50 nm or more and 200 nm or less.

The first floating electrode layer 102, the first source field electrode layer 101, the second floating electrode layer 104, and the second source field electrode layer 103 may have a thickness of 50 nm or more and 75 nm or less, 75 nm or more and 100 nm or less, 100 nm or more and 125 nm or less, 125 nm or more and 150 nm or less, 150 nm or more and 175 nm or less, or 175 nm or more and 200 nm or less.

The first floating electrode layer 102, the first source field electrode layer 101, the second floating electrode layer 104, and the second source field electrode layer 103 have a thickness of approximately 100 nm, in this preferred embodiment.

The first floating electrode layer 102, the first source field electrode layer 101, the second floating electrode layer 104, and the second source field electrode layer 103 may be the substantially same in thickness.

Referring to FIG. 2 to FIG. 8 (particularly, FIG. 8), an opening portion of the first gate opening 72 is defined by a first sidewall insulating layer 105 in the first device formation region 31. The first sidewall insulating layer 105 defines an inner wall of the first through hole 75. The first sidewall insulating layer 105 extends from the opening portion of the first gate opening 72 toward the bottom wall of the first gate opening 72.

The first sidewall insulating layer 105 is interposed in a region between the first gate insulating layer 81 and the first source field electrode layer 101 and in a region between the first gate insulating layer 81 and the first floating electrode layer 102 such as to be connected to the protection layer 40 (the first protection layer 41). The first sidewall insulating layer 105 may penetrate the first protection layer 41 such as to be connected to the electron supply layer 24.

An upper end portion of the first sidewall insulating layer 105 is R-chamfered. The upper end portion of the first sidewall insulating layer 105 is formed in a convexly curved shape toward an inner side of the first gate opening 72. The upper end portion of the first sidewall insulating layer 105 is a portion located at the opening portion side of the first gate opening 72 in the first sidewall insulating layer 105.

An opening area of the first gate opening 72 is greater than a bottom area of the first gate opening 72. The first gate insulating layer 81 and the first gate electrode 82 enter the first gate opening 72 along a curved surface of the first sidewall insulating layer 105.

An opening portion of the second gate opening 73 is defined by a second sidewall insulating layer 106 in the second device formation region 32. The second sidewall insulating layer 106 defines an inner wall of the second through hole 77. The second sidewall insulating layer 106 extends from the opening portion of the second gate opening 73 toward the bottom wall of the second gate opening 73.

The second sidewall insulating layer 106 is interposed in a region between the second gate insulating layer 83 and the second source field electrode layer 103 and in a region between the second gate insulating layer 83 and the second floating electrode layer 104 such as to be connected to the protection layer 40 (the first protection layer 41). The second sidewall insulating layer 106 may penetrate the first protection layer 41 such as to be connected to the electron supply layer 24.

An upper end portion of the second sidewall insulating layer 106 is R-chamfered. The upper end portion of the second sidewall insulating layer 106 is formed in a convexly curved shape toward an inner side of the second gate opening 73. The upper end portion of the second sidewall insulating layer 106 is a portion located at the opening portion side of the second gate opening 73 in the second sidewall insulating layer 106.

An opening area of the second gate opening 73 is greater than a bottom area of the second gate opening 73. The second gate insulating layer 83 and the second gate electrode 84 enter the second gate opening 73 along a curved surface of the second sidewall insulating layer 106.

Referring to FIG. 2 to FIG. 8, a second interlayer insulating layer 111 is formed on the main surface insulating layer 85. A main surface of the second interlayer insulating layer 111 may be a ground surface. The second interlayer insulating layer 111 is formed in a film shape along a main surface of the main surface insulating layer 85. The second interlayer insulating layer 111 covers the first gate electrode 82 and the second gate electrode 84.

The second interlayer insulating layer 111 may include at least one of SiO2 and SiN. The second interlayer insulating layer 111 may have a thickness of 50 nm or more and 500 nm or less. The second interlayer insulating layer 111 may have a thickness of 50 nm or more and 100 nm or less, 100 nm or more and 200 nm or less, 200 nm or more and 300 nm or less, 300 nm or more and 400 nm or less, or 400 nm or more and 500 nm or less. The second interlayer insulating layer 111 has a thickness of approximately 200 nm, in this preferred embodiment.

A first source contact opening 112, a first drain contact opening 113, a second source contact opening 114, and a second drain contact opening 115 are formed in the second interlayer insulating layer 111, the main surface insulating layer 85, and the first interlayer insulating layer 71.

The first source contact opening 112 and the first drain contact opening 113 are formed in the first device formation region 31. The first source contact opening 112 and the first drain contact opening 113 are formed to be spaced apart from each other along the first direction X. The first source contact opening 112 and the first drain contact opening 113 extend in band shapes along the second direction Y.

The first source contact opening 112 penetrates the second interlayer insulating layer 111, the main surface insulating layer 85, and the first interlayer insulating layer 71 such as to expose the first source electrode 51. The first drain contact opening 113 penetrates the second interlayer insulating layer 111, the main surface insulating layer 85, and the first interlayer insulating layer 71 such as to expose the first drain electrode 52.

The second source contact opening 114 and the second drain contact opening 115 are formed in the second device formation region 32. The second source contact opening 114 and the second drain contact opening 115 are formed to be spaced apart from each other along the first direction X. The second source contact opening 114 and the second drain contact opening 115 extend in band shapes along the second direction Y.

The second source contact opening 114 penetrates the second interlayer insulating layer 111, the main surface insulating layer 85, and the first interlayer insulating layer 71 such as to expose the second source electrode 53. The second drain contact opening 115 penetrates the second interlayer insulating layer 111, the main surface insulating layer 85, and the first interlayer insulating layer 71 such as to expose the second drain electrode 54.

A first source contact electrode 121 and a first drain contact electrode 122 are formed in the first device formation region 31. The first source contact electrode 121 is embedded in the first source contact opening 112. The first drain contact electrode 122 is embedded in the first drain contact opening 113.

A second source contact electrode 123 and a second drain contact electrode 124 are formed in the second device formation region 32. The second source contact electrode 123 is embedded in the second source contact opening 114. The second drain contact electrode 124 is embedded in the second drain contact opening 115.

Figure 12:
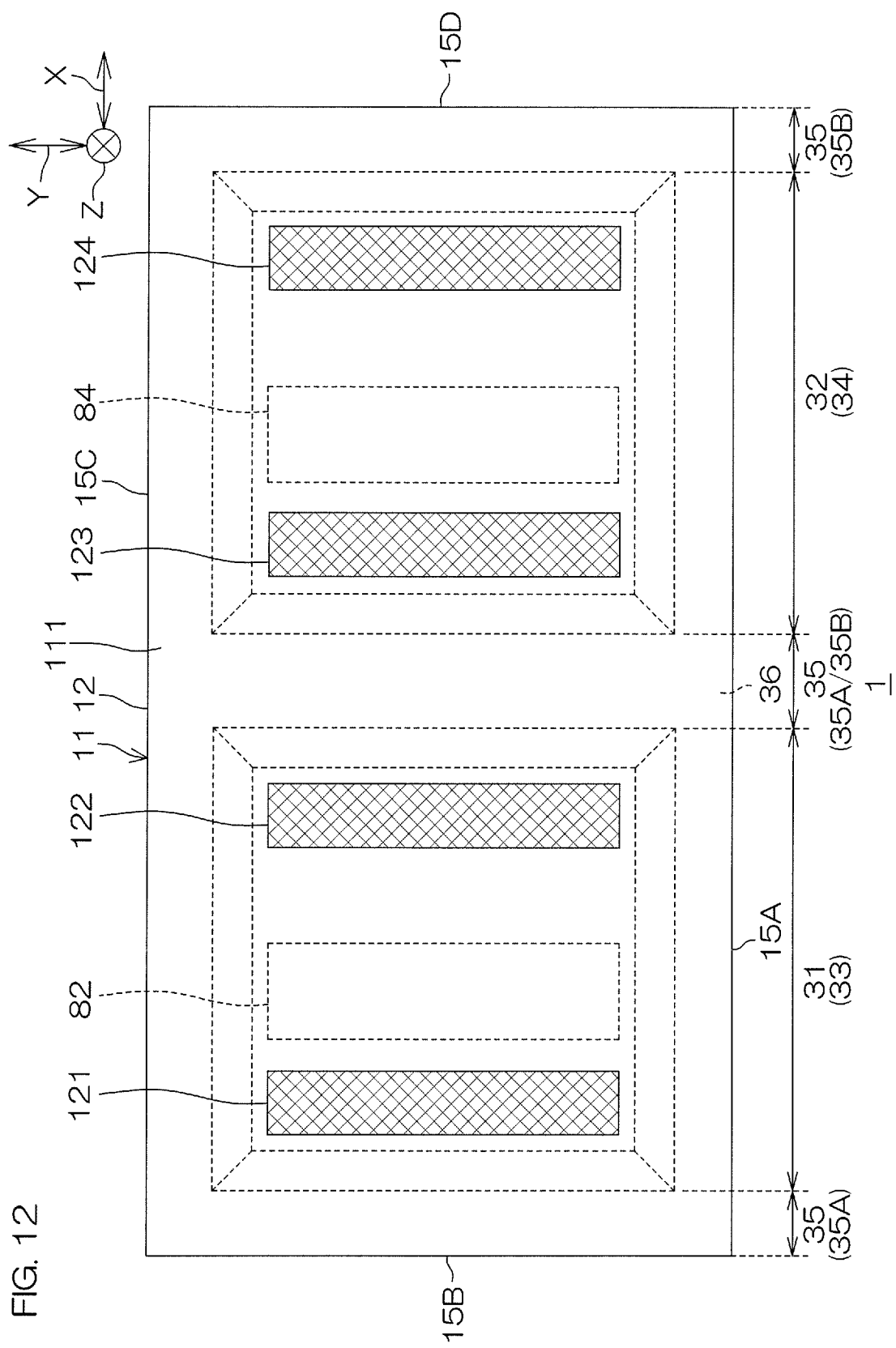
FIG. 12 is a plan view with structures above a first source contact electrode, a first drain contact electrode, a second source contact electrode, and a second drain contact electrode being removed.

Hereinafter, referring also to FIG. 12, modes of the first source contact electrode 121, the first drain contact electrode 122, the second source contact electrode 123, and the second drain contact electrode 124 will be described. FIG. 12 is a plan view with structures above the first source contact electrode 121, the first drain contact electrode 122, the second source contact electrode 123, and the second drain contact electrode 124 being removed.

Referring to FIG. 12, the first source contact electrode 121 and the first drain contact electrode 122 are formed to be spaced apart from each other along the first direction X. The first source contact electrode 121 and the first drain contact electrode 122 extend in band shapes along the second direction Y.

The second source contact electrode 123 and the second drain contact electrode 124 are formed to be spaced apart from each other along the first direction X. The second source contact electrode 123 and the second drain contact electrode 124 extend in band shapes along the second direction Y.

Referring to FIG. 2 to FIG. 8 (particularly, FIG. 7), the first source contact electrode 121 includes an embedded electrode layer 131 and a cover electrode layer 132. The embedded electrode layer 131 is embedded in the first source contact opening 112. The cover electrode layer 132 covers the embedded electrode layer 131.

The embedded electrode layer 131 has a laminated structure that includes a first embedded electrode layer 133 and a second embedded electrode layer 134, in this preferred embodiment. The first embedded electrode layer 133 is formed in a film shape along an inner wall of the first source contact opening 112. The first embedded electrode layer 133 defines a recessed space in the first source contact opening 112.

The first embedded electrode layer 133 is formed as a barrier electrode layer, in this preferred embodiment. The first embedded electrode layer 133 may include at least one of Ti and TiN. The first embedded electrode layer 133 consists of a TiN layer, in this preferred embodiment.

The first embedded electrode layer 133 may have a thickness of 10 nm or more and 200 nm or less. The first embedded electrode layer 133 may have a thickness of 10 nm or more and 50 nm or less, 50 nm or more and 100 nm or less, 100 nm or more and 150 nm or less, or 150 nm or more and 200 nm or less. The first embedded electrode layer 133 has a thickness of approximately 100 nm, in this preferred embodiment.

The second embedded electrode layer 134 is embedded in the first source contact opening 112 with the first embedded electrode layer 133 interposed between the second embedded electrode layer 134 and the first source contact opening 112. The second embedded electrode layer 134 is embedded in the recessed space defined by the first embedded electrode layer 133 in the first source contact opening 112. The second embedded electrode layer 134 includes a W (tungsten) layer, in this preferred embodiment.

The second embedded electrode layer 134 may have a thickness of 100 nm or more and 1000 nm or less. The second embedded electrode layer 134 may have a thickness of 100 nm or more and 250 nm or less, 250 nm or more and 500 nm or less, 500 nm or more and 750 nm or less, or 750 nm or more and 1000 nm or less. The thickness of the second embedded electrode layer 134 may be equal to or greater than the thickness of the first embedded electrode layer 133. The second embedded electrode layer 134 has a thickness of approximately 500 nm, in this preferred embodiment.

The cover electrode layer 132 covers the embedded electrode layer 131 on the second interlayer insulating layer 111. The cover electrode layer 132 overlaps an opening edge portion of the first source contact opening 112. More specifically, the cover electrode layer 132 overlaps the second interlayer insulating layer 111.

The cover electrode layer 132 has a laminated structure that includes a first cover electrode layer 135 and a second cover electrode layer 136 laminated in that order from the embedded electrode layer 131 side, in this preferred embodiment. The cover electrode layer 132 may include only either one of the first cover electrode layer 135 and the second cover electrode layer 136.

The first cover electrode layer 135 may include at least one of Al, Si, and Cu. The first cover electrode layer 135 may include at least one of a conductive Poly-Si layer, an AlSiCu alloy layer, and an AlCu alloy layer. The first cover electrode layer 135 consists of the AlCu alloy layer, in this preferred embodiment.

The first cover electrode layer 135 may have a thickness of 100 nm or more and 1000 nm or less. The first cover electrode layer 135 may have a thickness of 100 nm or more and 250 nm or less, 250 nm or more and 500 nm or less, 500 nm or more and 750 nm or less, or 750 nm or more and 1000 nm or less. The first cover electrode layer 135 has a thickness of approximately 500 nm, in this preferred embodiment.

The second cover electrode layer 136 is formed as a barrier electrode layer, in this preferred embodiment. The second cover electrode layer 136 may include at least one of Ti and TiN. The second cover electrode layer 136 consists of a TiN layer, in this preferred embodiment.

The second cover electrode layer 136 may have a thickness of 10 nm or more and 200 nm or less. The second cover electrode layer 136 may have a thickness of 10 nm or more and 50 nm or less, 50 nm or more and 100 nm or less, 100 nm or more and 150 nm or less, or 150 nm or more and 200 nm or less. The thickness of the second cover electrode layer 136 may be equal to or less than the thickness of the first cover electrode layer 135. The second cover electrode layer 136 has a thickness of approximately 100 nm, in this preferred embodiment.

The first drain contact electrode 122, the second source contact electrode 123, and the second drain contact electrode 124 each have a structure similar to the structure of the first source contact electrode 121. The description for the first source contact electrode 121 is applied mutatis mutandis to the descriptions for the first drain contact electrode 122, the second source contact electrode 123, and the second drain contact electrode 124, respectively. The structures corresponding to the first source contact electrode 121 in the structure of the first drain contact electrode 122, the second source contact electrode 123, and the second drain contact electrode 124 will be given the same reference symbols and descriptions thereof will be omitted.

Referring to FIG. 2 to FIG. 8, a third interlayer insulating layer 141 is formed on the second interlayer insulating layer 111. A main surface of the third interlayer insulating layer 141 may be a ground surface. The third interlayer insulating layer 141 is formed in a film shape along the main surface of the second interlayer insulating layer 111.

The third interlayer insulating layer 141 covers the first source contact electrode 121, the first drain contact electrode 122, the second source contact electrode 123, and the second drain contact electrode 124. The third interlayer insulating layer 141 may include at least one of SiO2 and SiN.

The third interlayer insulating layer 141 may have a thickness of 100 nm or more and 1000 nm or less. The third interlayer insulating layer 141 may have a thickness of 100 nm or more and 250 nm or less, 250 nm or more and 500 nm or less, 500 nm or more and 750 nm or less, or 750 nm or more and 1000 nm or less. The third interlayer insulating layer 141 has a thickness of approximately 500 nm, in this preferred embodiment.

Referring to FIG. 2 to FIG. 6, a first gate contact hole 142, a first source contact hole 143, a first drain contact hole 144, a second gate contact hole 145, a second source contact hole 146, and a second drain contact hole 147 are formed in the third interlayer insulating layer 141 and the second interlayer insulating layer 111.

The first gate contact hole 142, the first source contact hole 143, and the first drain contact hole 144 are formed in the first device formation region 31. The second gate contact hole 145, the second source contact hole 146, and the second drain contact hole 147 are formed in the second device formation region 32.

The first gate contact hole 142 penetrates the third interlayer insulating layer 141 and the second interlayer insulating layer 111 such as to expose the first gate electrode 82. The first source contact hole 143 penetrates the third interlayer insulating layer 141 such as to expose the first source contact electrode 121. The first drain contact hole 144 penetrates the third interlayer insulating layer 141 such as to expose the first drain contact electrode 122.

The second gate contact hole 145 penetrates the third interlayer insulating layer 141 and the second interlayer insulating layer 111 such as to expose the second gate electrode 84. The second source contact hole 146 penetrates the third interlayer insulating layer 141 such as to expose the second source contact electrode 123. The second drain contact hole 147 penetrates the third interlayer insulating layer 141 such as to expose the second drain contact electrode 124.

The first source contact hole 143 and the second drain contact hole 147 oppose each other along the first direction X. The first gate contact hole 142, the first drain contact hole 144, the second gate contact hole 145, and the second source contact hole 146 are formed to be spaced apart from each other along the second direction Y such as not to oppose each other along the first direction X, in this preferred embodiment.

A source-drain wiring layer 151, a first gate wiring layer 152, a drain wiring layer 153, a second gate wiring layer 154, and a source wiring layer 155 are formed on the third interlayer insulating layer 141. The source-drain wiring layer 151, the first gate wiring layer 152, the drain wiring layer 153, the second gate wiring layer 154, and the source wiring layer 155 are all formed above the first source electrode 51, the first drain electrode 52, the second source electrode 53, the second drain electrode 54, the first gate electrode 82, and the second gate electrode 84.

Figure 13:
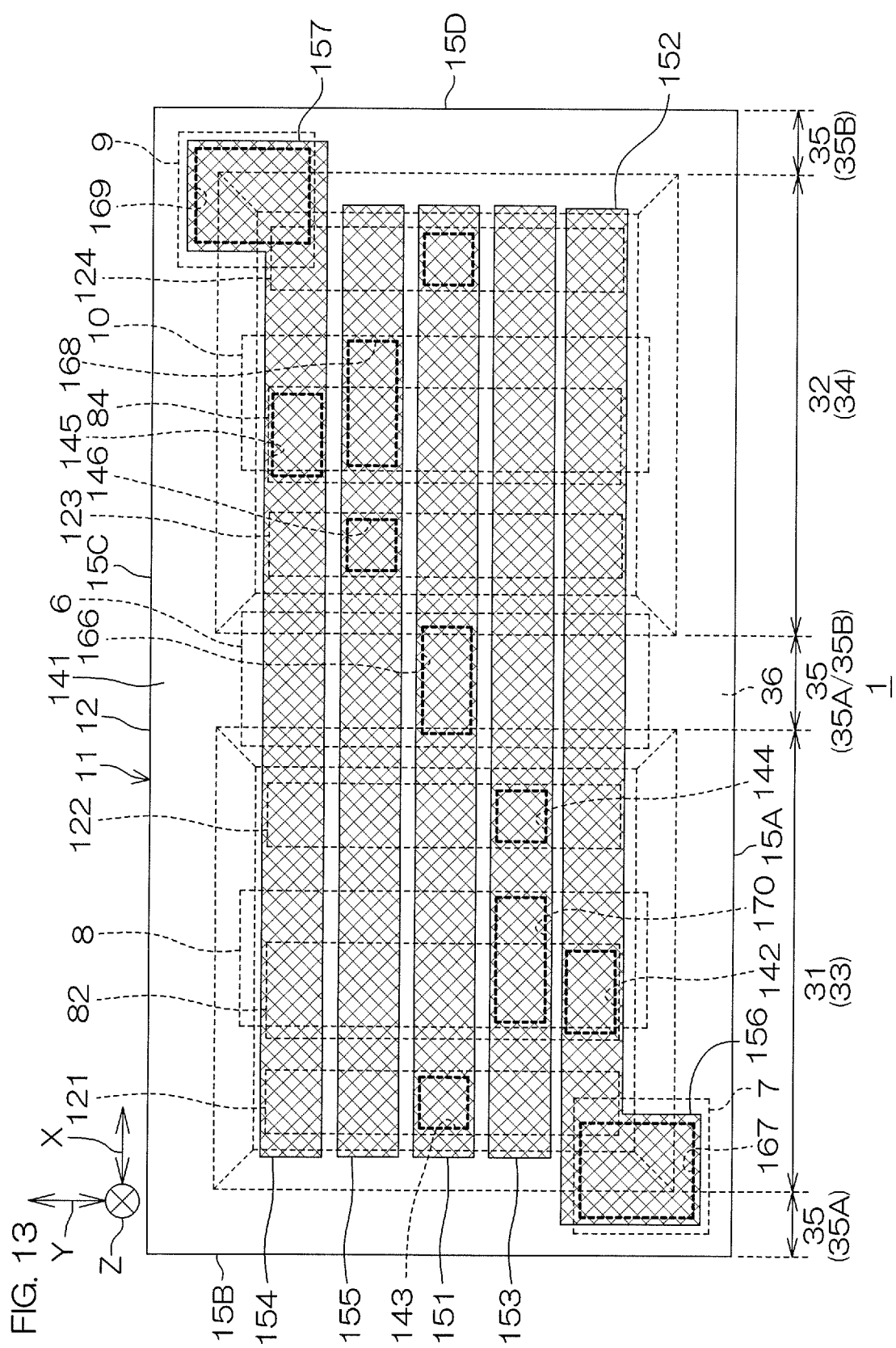
FIG. 13 is a plan view with structures above a source-drain wiring layer, a first gate wiring layer, a drain wiring layer, a second gate wiring layer, and a source wiring layer being removed.

Hereinafter, referring also to FIG. 13, modes of the source-drain wiring layer 151, the first gate wiring layer 152, the drain wiring layer 153, the second gate wiring layer 154, and the source wiring layer 155 will be described. FIG. 13 is a plan view with structures above the source-drain wiring layer 151, the first gate wiring layer 152, the drain wiring layer 153, the second gate wiring layer 154, and the source wiring layer 155 being removed.

The source-drain wiring layer 151, the first gate wiring layer 152, the drain wiring layer 153, the second gate wiring layer 154, and the source wiring layer 155 are formed to be spaced apart from each other along the second direction Y in plan view.

The source-drain wiring layer 151, the first gate wiring layer 152, the drain wiring layer 153, the second gate wiring layer 154, and the source wiring layer 155 are formed in band shapes that extends along the first direction X in plan view. The source-drain wiring layer 151, the first gate wiring layer 152, the drain wiring layer 153, the second gate wiring layer 154, and the source wiring layer 155 are thus formed in a stripe shape that extends along the first direction X in plan view.

The arrangement orders of the source-drain wiring layer 151, the first gate wiring layer 152, the drain wiring layer 153, the second gate wiring layer 154, and the source wiring layer 155 is arbitrary and thus not limited to the order shown in FIG. 13 and the like.

Referring to FIG. 2 and FIG. 13, the source-drain wiring layer 151 intersects the first source electrode 51 (the first source contact electrode 121) and the second drain electrode 54 (the second drain contact electrode 124) in plan view. The source-drain wiring layer 151 extends along a direction in which the first source electrode 51 (the first source contact electrode 121) and the second drain electrode 54 (the second drain contact electrode 124) oppose each other in plan view.

The source-drain wiring layer 151 linearly connects between the first source electrode 51 (the first source contact electrode 121) and the second drain electrode 54 (the second drain contact electrode 124) in plan view. The source-drain wiring layer 151 connects the first source electrode 51 (the first source contact electrode 121) and the second drain electrode 54 (the second drain contact electrode 124) with the shortest distance.

The source-drain wiring layer 151 enters the first source contact hole 143 from on the third interlayer insulating layer 141. The source-drain wiring layer 151 is electrically connected to the first source contact electrode 121 in the first source contact hole 143. The source-drain wiring layer 151 is thereby electrically connected to the first source electrode 51 via the first source contact electrode 121.

The source-drain wiring layer 151 enters the second drain contact hole 147 from on the third interlayer insulating layer 141. The source-drain wiring layer 151 is electrically connected to the second drain contact electrode 124 in the second drain contact hole 147. The source-drain wiring layer 151 is thereby electrically connected to the second drain electrode 54 via the second drain contact electrode 124.

Referring to FIG. 3 and FIG. 13, the first gate wiring layer 152 extends in a band shape along the first direction X and intersects the first gate electrode 82 in plan view. The first gate wiring layer 152 enters the first gate contact hole 142 from on the third interlayer insulating layer 141. The first gate wiring layer 152 is electrically connected to the first gate electrode 82 in the first gate contact hole 142.

The first gate wiring layer 152 has one end portion that is located at one side in the first direction X and the other end portion that is located at the other side in the first direction X. The one end portion of the first gate wiring layer 152 is an end portion located at the side surface 15B side of the substrate 11. The other end portion of the first gate wiring layer 152 is an end portion located at the side surface 15D side of the substrate 11.

The first gate wiring layer 152 intersects the first drain electrode 52, the second source electrode 53, the second gate electrode 84, and the second drain electrode 54 in plan view, in this preferred embodiment. The first gate wiring layer 152 may have an arbitrary length and may not be always required to intersect all of the first drain electrode 52, the second source electrode 53, the second gate electrode 84, and the second drain electrode 54.

Referring to FIG. 4 and FIG. 13, the drain wiring layer 153 extends in a band shape along the first direction X and intersects the first drain electrode 52 in plan view. The drain wiring layer 153 enters the first drain contact hole 144 from on the third interlayer insulating layer 141.

The drain wiring layer 153 is electrically connected to the first drain contact electrode 122 in the first drain contact hole 144. The drain wiring layer 153 is thereby electrically connected to the first drain electrode 52 via the first drain contact electrode 122.

The drain wiring layer 153 intersects the first source electrode 51, the first gate electrode 82, the second source electrode 53, the second gate electrode 84, and the second drain electrode 54 in plan view, in this preferred embodiment. The drain wiring layer 153 may have an arbitrary length and may not be always required to intersect all of the first source electrode 51, the first gate electrode 82, the second source electrode 53, the second gate electrode 84, and the second drain electrode 54.

Referring to FIG. 5 and FIG. 13, the second gate wiring layer 154 extends in a band shape along the first direction X and intersects the second gate electrode 84 in plan view. The second gate wiring layer 154 enters the second gate contact hole 145 from on the third interlayer insulating layer 141. The second gate wiring layer 154 is electrically connected to the second gate electrode 84 in the second gate contact hole 145.

The second gate wiring layer 154 has one end portion that is located at one side in the first direction X and the other end portion that is located at the other side in the first direction X. The one end portion of the second gate wiring layer 154 is a portion located at the side surface 15B side of the substrate 11. The other end portion of the second gate wiring layer 154 is a portion located at the side surface 15D side of the substrate 11.

The second gate wiring layer 154 intersects the first source electrode 51, the first gate electrode 82, the first drain electrode 52, and the second source electrode 53 in plan view, in this preferred embodiment. The second gate wiring layer 154 may have an arbitrary length and may not be always required to intersect all of the first source electrode 51, the first gate electrode 82, the first drain electrode 52, and the second source electrode 53.

Referring to FIG. 6 and FIG. 13, the source wiring layer 155 extends in a band shape along the first direction X and intersects the second source electrode 53 in plan view. The source wiring layer 155 enters the second source contact hole 146 from on the third interlayer insulating layer 141.

The source wiring layer 155 is electrically connected to the second source contact electrode 123 in the second source contact hole 146. The source wiring layer 155 is thereby electrically connected to the second source electrode 53 via the second source contact electrode 123.

The source wiring layer 155 intersects the first source electrode 51, the first gate electrode 82, the first drain electrode 52, the second gate electrode 84, and the second drain electrode 54 in plan view, in this preferred embodiment. The source wiring layer 155 may have an arbitrary length and may not be always required to intersect all of the first source electrode 51, the first gate electrode 82, the first drain electrode 52, the second gate electrode 84, and the second drain electrode 54.

Referring to FIG. 13, a first gate lead wiring layer 156 is connected to the one end portion of the first gate wiring layer 152 in this preferred embodiment. The first gate lead wiring layer 156 is formed as a partial region of the first gate wiring layer 152.

The first gate lead wiring layer 156 is led out from the one end of the first gate wiring layer 152 toward a corner portion of the substrate 11 along the second direction Y. The first gate lead wiring layer 156 is led out toward a corner portion that connects the side surface 15A and the side surface 15B of the substrate 11 in plan view, in this preferred embodiment.

A second gate lead wiring layer 157 is connected to the one end portion of the second gate wiring layer 154, in this preferred embodiment. The second gate lead wiring layer 157 is formed as a partial region of the second gate wiring layer 154.

The second gate lead wiring layer 157 is led out from the one end of the second gate wiring layer 154 toward a corner portion of the substrate 11 along the second direction Y. The second gate lead wiring layer 157 is led out toward a corner portion that connects the side surface 15C and the side surface 15D of the substrate 11 in plan view, in this preferred embodiment.

Referring to FIG. 2, more specifically, the source-drain wiring layer 151 has a laminated structure that includes a first wiring layer 161, a second wiring layer 162, and a third wiring layer 163 laminated in that order from the third interlayer insulating layer 141.

The first wiring layer 161 is formed as a barrier electrode layer, in this preferred embodiment. The first wiring layer 161 includes at least one of Ti and TiN. The first wiring layer 161 consists of a TiN layer, in this preferred embodiment.

The first wiring layer 161 may have a thickness of 10 nm or more and 100 nm or less. The first wiring layer 161 may have a thickness of 10 nm or more and 25 nm or less, 25 nm or more and 50 nm or less, 50 nm or more and 75 nm or less, or 75 nm or more and 100 nm or less. The first wiring layer 161 has a thickness of approximately 40 nm, in this preferred embodiment.

The second wiring layer 162 may include at least one of Al, Si, and Cu. The second wiring layer 162 may include at least one of a conductive Poly-Si layer, an AlSiCu alloy layer, and an AlCu alloy layer. The thickness of the second wiring layer 162 may be equal to or greater than that of the first wiring layer 161. The second wiring layer 162 consists of the AlCu alloy layer, in this preferred embodiment.

The second wiring layer 162 may have a thickness of 500 nm or more and 1500 nm or less. The second wiring layer 162 may have a thickness of 500 nm or more and 750 nm or less, 750 nm or more and 1000 nm or less, 1000 nm or more and 1250 nm or less, or 1250 nm or more and 1500 nm or less. The thickness of the second wiring layer 162 exceeds the thickness of the first wiring layer 161. The thickness of the second wiring layer 162 is approximately 1000 nm, in this preferred embodiment.

The third wiring layer 163 is formed as a barrier electrode layer, in this preferred embodiment. The third wiring layer 163 includes at least one Ti and TiN. The third wiring layer 163 consists of a TiN layer, in this preferred embodiment.

The third wiring layer 163 may have a thickness of 10 nm or more and 100 nm or less. The third wiring layer 163 may have a thickness of 10 nm or more and 25 nm or less, 25 nm or more and 50 nm or less, 50 nm or more and 75 nm or less, or 75 nm or more and 100 nm or less. The thickness of the third wiring layer 163 is less than the thickness of the second wiring layer 162. The third wiring layer 163 has a thickness of approximately 40 nm, in this preferred embodiment.

Referring to FIG. 3 to FIG. 6, the first gate wiring layer 152, the drain wiring layer 153, the second gate wiring layer 154, and the source wiring layer 155 each have a structure similar to the structure of the source-drain wiring layer 151. The description for the source-drain wiring layer 151 is applied mutatis mutandis to the descriptions for the first gate wiring layer 152, the drain wiring layer 153, the second gate wiring layer 154, and the source wiring layer 155, respectively. The structures corresponding to the source-drain wiring layer 151 in the first gate wiring layer 152, the drain wiring layer 153, the second gate wiring layer 154, and the source wiring layer 155 will be given the same reference symbols and descriptions thereof will be omitted.

Referring to FIG. 2 to FIG. 6, a fourth interlayer insulating layer 164 is formed on the third interlayer insulating layer 141. The fourth interlayer insulating layer 164 is formed in a film shape along the main surface of the third interlayer insulating layer 141. The fourth interlayer insulating layer 164 covers the source-drain wiring layer 151, the first gate wiring layer 152, the drain wiring layer 153, the second gate wiring layer 154, and the source wiring layer 155. The fourth interlayer insulating layer 164 may include at least one of SiO2 and SiN.

The fourth interlayer insulating layer 164 may have a thickness of 500 nm or more and 2500 nm or less. The fourth interlayer insulating layer 164 may have a thickness of 500 nm or more and 1000 nm or less, 1000 nm or more and 1500 nm or less, or 1500 nm or more and 2000 nm or less. The fourth interlayer insulating layer 164 has a thickness of approximately 1500 nm, in this preferred embodiment.

A resin layer 165 is formed on the fourth interlayer insulating layer 164. The resin layer 165 forms the first chip main surface 3. The resin layer 165 is formed in a film shape along a main surface of the fourth interlayer insulating layer 164. The resin layer 165 may include polyimide.

The resin layer 165 may have a thickness of 1 μm or more and 50 μm or less. The resin layer 165 may have a thickness of 1 μm or more and 10 μm or less, 10 μm or more and 20 μm or less, 20 μm or more and 30 μm or less, 30 μm or more and 40 μm or less, or 40 μm or more and 50 μm or less. The resin layer 165 has a thickness of approximately 10 μm, in this preferred embodiment.

A source-drain pad opening 166, a first gate pad opening 167, a drain pad opening 168, a second gate pad opening 169, and a source pad opening 170 are formed in the fourth interlayer insulating layer 164 and the resin layer 165.

The source-drain pad opening 166 exposes an arbitrary region of the source-drain wiring layer 151 as a source-drain pad region. The arbitrary region of the source-drain wiring layer 151 is a region in which the source-drain external terminal 6 is to be connected.

The first gate pad opening 167 exposes an arbitrary region of the first gate wiring layer 152 as a first gate pad region. The arbitrary region of the first gate wiring layer 152 is a region in which the first gate external terminal 7 is to be connected. The first gate pad opening 167 exposes the first gate lead wiring layer 156, in this preferred embodiment.

The drain pad opening 168 exposes an arbitrary region of the drain wiring layer 153 as a drain pad region. The arbitrary region of the drain wiring layer 153 is a region in which the drain external terminal 8 is to be connected.

The second gate pad opening 169 exposes an arbitrary region of the second gate wiring layer 154 as a second gate pad region. The arbitrary region of the second gate wiring layer 154 is a region in which the second gate external terminal 9 is to be connected. The second gate pad opening 169 exposes the second gate lead wiring layer 157, in this preferred embodiment.

The source pad opening 170 exposes an arbitrary region of the source wiring layer 155 as the source external terminal 10. The arbitrary region of the source wiring layer 155 is a region in which the source external terminal 10 is to be connected.

Referring to FIG. 2, the source-drain external terminal 6 is formed in the source-drain pad opening 166. More specifically, the source-drain external terminal 6 enters the source-drain pad opening 166 from on the resin layer 165. The source-drain external terminal 6 upwardly protrudes from a main surface of the resin layer 165.

The source-drain external terminal 6 is electrically connected to the source-drain wiring layer 151 in the source-drain pad opening 166. The source-drain external terminal 6 is thereby electrically connected to the first source electrode 51 and the second drain electrode 54 via the source-drain wiring layer 151.

Referring to FIG. 3, the first gate external terminal 7 is formed in the first gate pad opening 167. More specifically, the first gate external terminal 7 enters the first gate pad opening 167 from on the resin layer 165. The first gate external terminal 7 upwardly protrudes from the main surface of the resin layer 165.

The first gate external terminal 7 is electrically connected to the first gate lead wiring layer 156 in the first gate pad opening 167. The first gate external terminal 7 is thereby electrically connected to the first gate electrode 82 via the first gate wiring layer 152.

Referring to FIG. 4, the drain external terminal 8 is formed in the drain pad opening 168. More specifically, the drain external terminal 8 enters the drain pad opening 168 from on the resin layer 165. The drain external terminal 8 upwardly protrudes from the main surface of the resin layer 165.

The drain external terminal 8 is electrically connected to the drain wiring layer 153 in the drain pad opening 168. The drain external terminal 8 is thereby electrically connected to the first drain electrode 52 via the drain wiring layer 153.

Referring to FIG. 5, the second gate external terminal 9 is formed in the second gate pad opening 169. More specifically, the second gate external terminal 9 enters the second gate pad opening 169 from on the resin layer 165. The second gate external terminal 9 upwardly protrudes from the main surface of the resin layer 165.

The second gate external terminal 9 is electrically connected to the second gate lead wiring layer 157 in the second gate pad opening 169. The second gate external terminal 9 is thereby electrically connected to the second gate electrode 84 via the second gate wiring layer 154.

Referring to FIG. 6, the source external terminal 10 is formed in the source pad opening 170. More specifically, the source external terminal 10 enters the source pad opening 170 from on the resin layer 165. The source external terminal 10 upwardly protrudes from the main surface of the resin layer 165.

The source external terminal 10 is electrically connected to the source wiring layer 155 in the source pad opening 170. The source external terminal 10 is thereby electrically connected to the second source electrode 53 via the source wiring layer 155.

Referring to FIG. 2, more specifically, the source-drain external terminal 6 has a laminated structure that includes a base electrode layer 171 and a conductive bonding material layer 172. The base electrode layer 171 enters the source-drain pad opening 166 from on the resin layer 165.

The base electrode layer 171 is formed in a film shape along the main surface of the resin layer 165 and an inner wall of the source-drain pad opening 166. The base electrode layer 171 defines a recessed space in the source-drain pad opening 166. The base electrode layer 171 is formed as a barrier electrode layer, in this preferred embodiment. The base electrode layer 171 may include at least one of Ti and TiN. The base electrode layer 171 consists of a TiN layer, in this preferred embodiment.

The conductive bonding material layer 172 is formed on the base electrode layer 171. The conductive bonding material layer 172 is embedded in the source-drain pad opening 166 with the base electrode layer 171 interposed between the conductive bonding material layer 172 and the source-drain pad opening 166. The conductive bonding material layer 172 upwardly protrudes from the main surface of the resin layer 165. The conductive bonding material layer 172 includes a portion that opposes the main surface of the resin layer 165 with the base electrode layer 171 interposed between the conductive bonding material layer 172 and the main surface of the resin layer 165. The conductive bonding material layer 172 may include solder.

Referring to FIG. 3 to FIG. 6, the first gate external terminal 7, the drain external terminal 8, the second gate external terminal 9, and the source external terminal 10 each have a structure similar to the structure of the source-drain external terminal 6. The description for the source-drain external terminal 6 is applied mutatis mutandis to the descriptions for the first gate external terminal 7, the drain external terminal 8, the second gate external terminal 9, and the source external terminal 10, respectively. The structures corresponding to the structure of the source-drain external terminal 6 in the first gate external terminal 7, the drain external terminal 8, the second gate external terminal 9, and the source external terminal 10 will be given the same reference symbols and descriptions thereof will be omitted.

Figure 14:
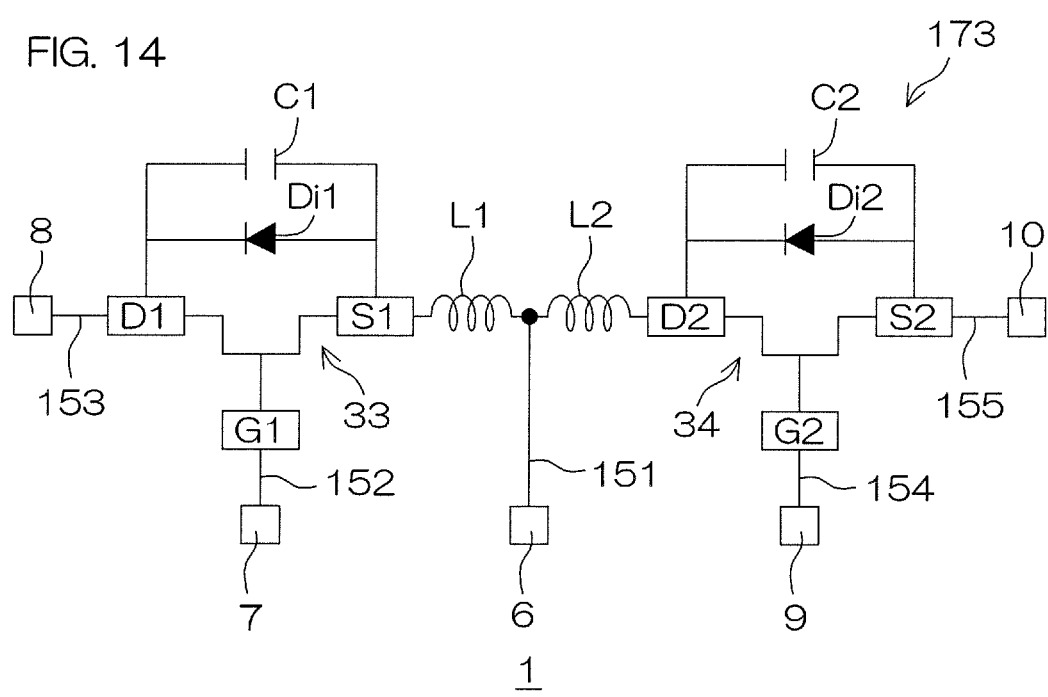
FIG. 14 is a circuit diagram for explaining an electrical structure of the semiconductor device shown in FIG. 1.

FIG. 14 is a circuit diagram for explaining an electrical structure of the semiconductor device 1 shown in FIG. 1.

Referring to FIG. 14, the semiconductor device 1 includes the first HEMT 33 and the second HEMT 34. The first HEMT 33 includes a first gate G1, a first source S1, and a first drain D1. The second HEMT 34 includes a second gate G2, a second source S2, and a second drain D2.

The first gate G1 of the first HEMT 33 includes the first gate electrode 82. The first source S1 of the first HEMT 33 includes the first source electrode 51 (the first source contact electrode 121). The first drain D1 of the first HEMT 33 includes the first drain electrode 52 (the first drain contact electrode 122).

The second gate G2 of the second HEMT 34 includes the second gate electrode 84. The second source S2 of the second HEMT 34 includes the second source electrode 53 (the second source contact electrode 123). The second drain D2 of the second HEMT 34 includes the second drain electrode 54 (the second drain contact electrode 124).

The source-drain external terminal 6 is connected to the first source S1 of the first HEMT 33 and the second drain D2 of the second HEMT 34 via the source-drain wiring layer 151. The first gate external terminal 7 is connected to the first gate G1 of the first HEMT 33 via the first gate wiring layer 152.

The drain external terminal 8 is connected to the first drain D1 of the first HEMT 33 via the drain wiring layer 153. The second gate external terminal 9 is connected to the second gate G2 of the second HEMT 34 via the second gate wiring layer 154. The source external terminal 10 is connected to the second source S2 of the second HEMT 34 via the source wiring layer 155.

The semiconductor device 1 thus has a half bridge circuit 173 that includes the first HEMT 33 and the second HEMT 34. The half bridge circuit 173 may be used in a power conversion circuit such as an inverter circuit or a DC-DC converter circuit.

The half bridge circuit 173 may be employed in a DC-DC converter circuit for high-frequency operation having an operation frequency of 1 MHz or more among DC-DC converter circuits. In the half bridge circuit 173, the first HEMT 33 may constitute a HEMT of a high-voltage side, while the second HEMT 34 may constitute a HEMT of a low-voltage.

A first parasitic diode Di1, a first parasitic capacitance C1, and a first parasitic inductance L1 are connected to the first HEMT 33 is connected. The first parasitic diode Di1 is connected in parallel between the first source S1 and the first drain D1 in a direction in which a forward current flows through the first drain D1. The first parasitic capacitance C1 is connected in parallel between the first source S1 and the first drain D1. The first parasitic inductance L1 is connected between the source-drain external terminal 6 and the first source S1.

A second parasitic diode Di2, a second parasitic capacitance C2, and a second parasitic inductance L2 are connected to the second HEMT 34. The second parasitic diode Di2 is connected in parallel between the second source S2 and the second drain D2 in a direction in which a forward current flows through the second drain D2. The second parasitic capacitance C2 is connected in parallel between the second source S2 and the second drain D2. The second parasitic inductance L2 is connected between the source-drain external terminal 6 and the second drain D2.

As described above, the semiconductor device 1 includes the first HEMT 33 and the second HEMT 34 that can be controlled independently each other. The first HEMT 33 and the second HEMT 34 are incorporated into the single laminated structure portion 12 (the semiconductor laminated structure portion 26). This enables the first HEMT 33 and the second HEMT 34 to be confined in a limited region of the laminated structure portion 12 (the semiconductor laminated structure portion 26), thus making it possible to reduce the semiconductor device 1 in size.

Furthermore, in a case in which the first HEMT 33 and the second HEMT 34 are electrically connected each other, a wiring layer connected to the first HEMT 33 and the second HEMT 34 can be confined in the limited region of the laminated structure portion 12 (the semiconductor laminated structure portion 26). More specifically, the source-drain wiring layer 151, the first gate wiring layer 152, the drain wiring layer 153, the second gate wiring layer 154, and the source wiring layer 155 can be confined in a region surrounded by a peripheral edge of the laminated structure portion 12 (the semiconductor laminated structure portion 26) in plan view.

This enables a wiring distance between the first HEMT 33 and the second HEMT 34 to be shortened and thus the wiring resistance, the first parasitic inductance L1, the second parasitic inductance L2 and the like to be reduced. It is thus possible to provide a semiconductor device 1 that can improve performance by taking advantage of the size reduction.

Particularly, according to the semiconductor device 1, the source-drain wiring layer 151 is formed as a connection wiring layer to be electrically connected to the first source electrode 51 of the first HEMT 33 and the second drain electrode 54 of the second HEMT 34. This enables the wiring distance between the first source electrode 51 of the first HEMT 33 and the second drain electrode 54 of the second HEMT 34 to be appropriately shortened.

This makes it possible to properly reduce the wiring resistance which exist between the first source electrode 51 of the first HEMT 33 and the second drain electrode 54 of the second HEMT 34, the first parasitic inductance L1, the second parasitic inductance L2 and the like.

In the semiconductor device 1, the source-drain wiring layer 151 especially is formed in a line shape that linearly connects between the first source electrode 51 of the first HEMT 33 and the second drain electrode 54 of the second HEMT 34. More specifically, the source-drain wiring layer 151 extends along the first direction X such as to intersect the first source electrode 51 and the second drain electrode 54 that extend along the second direction Y.

This enables the first source electrode 51 of the first HEMT 33 and the second drain electrode 54 of the second HEMT 34 to be connected with the shortest distance. As a result, since the wiring distance of the source-drain wiring layer 151 can be effectively shortened, the wiring resistance, the first parasitic inductance L1, the second parasitic inductance L2, and the like can be effectively reduced. It is also effective in reducing the wiring resistance, the first parasitic inductance L1, the second parasitic inductance L2 and the like to form the first gate wiring layer 152, the drain wiring layer 153, the second gate wiring layer 154 and the source wiring layer 155 in band shapes (linear shapes).

Figure 15:
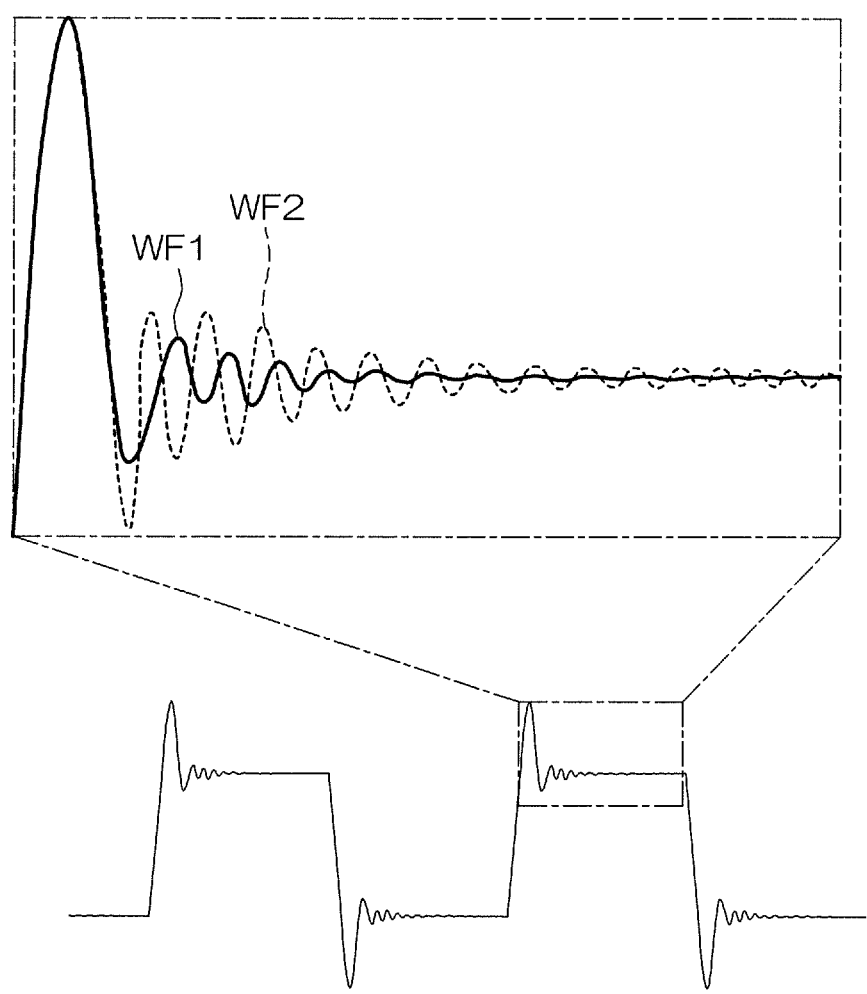
FIG. 15 is a switching waveform for explaining the switching property of the semiconductor device shown in FIG. 1.

According to the semiconductor device 1, it is possible to obtain the effects shown in FIG. 15. FIG. 15 is a switching waveform for explaining the switching property of the semiconductor device 1 shown in FIG. 1.

A first waveform WF1 (see the solid line) and a second waveform WF2 (see the broken line) are shown in FIG. 15. The first waveform WF1 shows a ringing noise when the semiconductor device 1 operates at high frequencies. The second waveform WF2 shows a ringing noise when a source of a semiconductor device having only the first HEMT 33 and a drain of a semiconductor device having only the second HEMT 34 are externally connected.

Referring to the first waveform WF1 and the second waveform WF2, according to the semiconductor device 1, the wiring resistance, the first parasitic inductance L1, and the second parasitic inductance L2 can be reduced, thus making it possible to accordingly reduce the ringing noise.

Figure 16B:
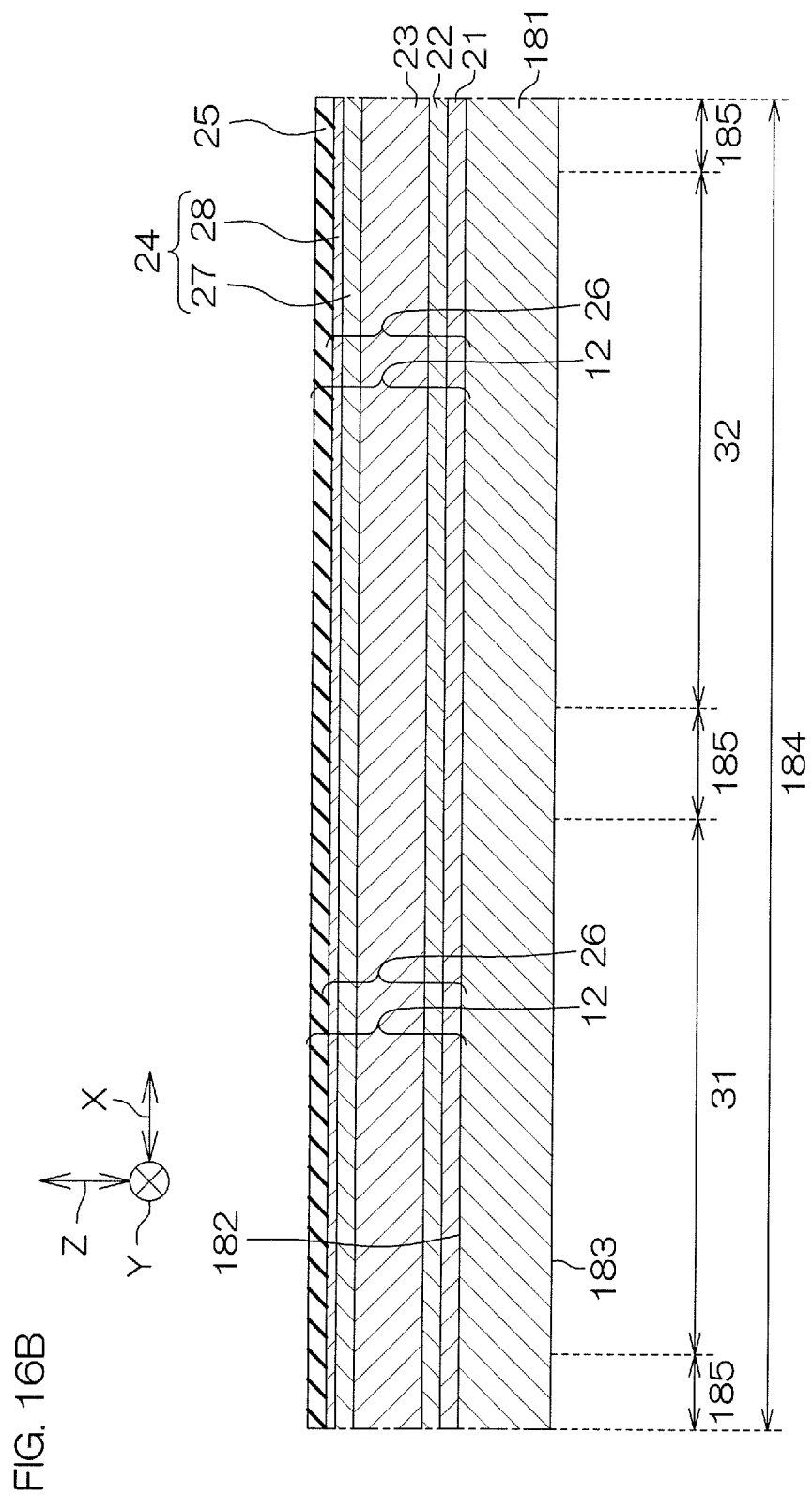
FIGS. 16A to 16Z are cross-sectional views for explaining of an example of a method of manufacturing the semiconductor device of FIG. 1.
Figure 16D:
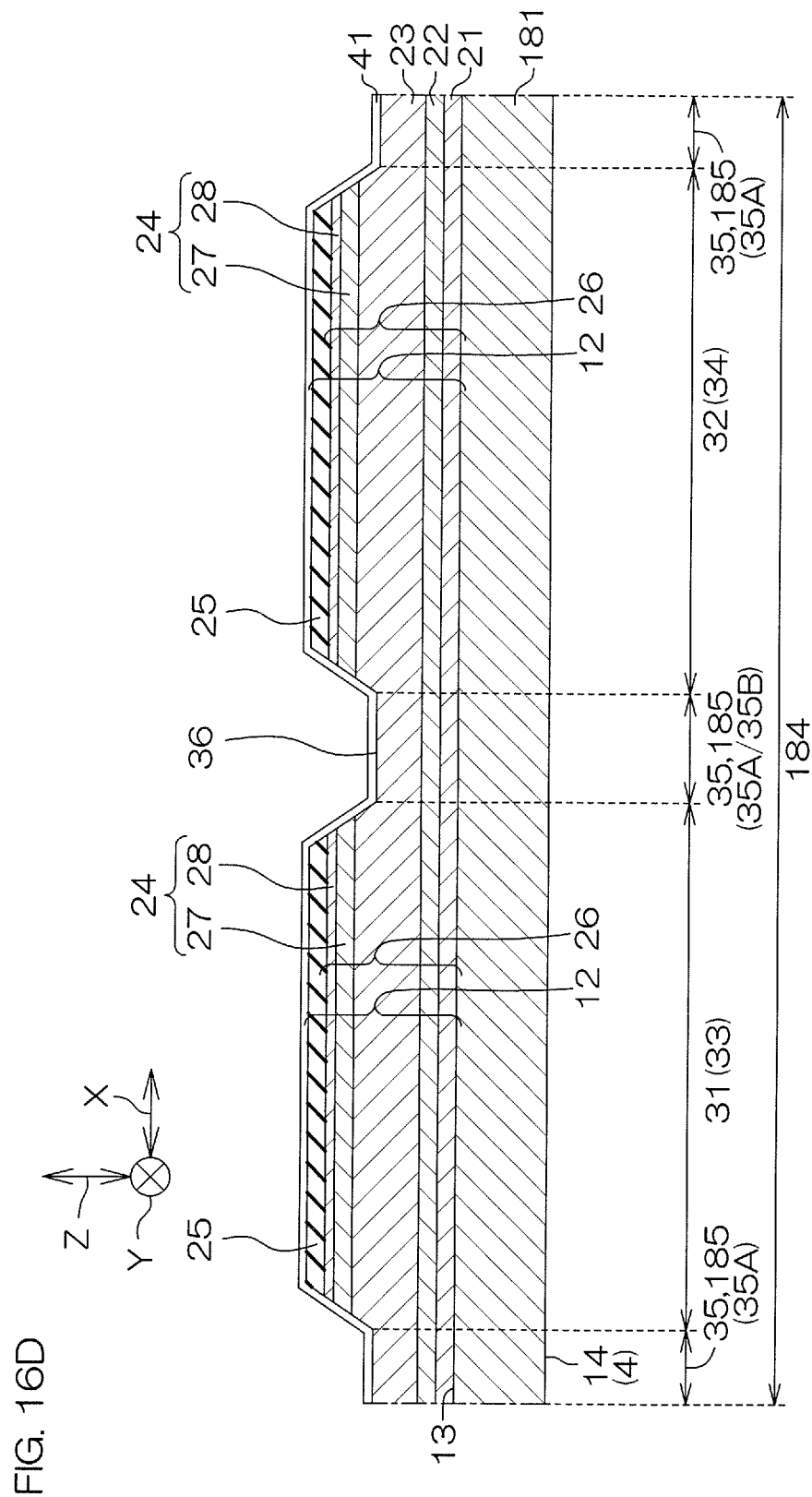
Figure 16E:
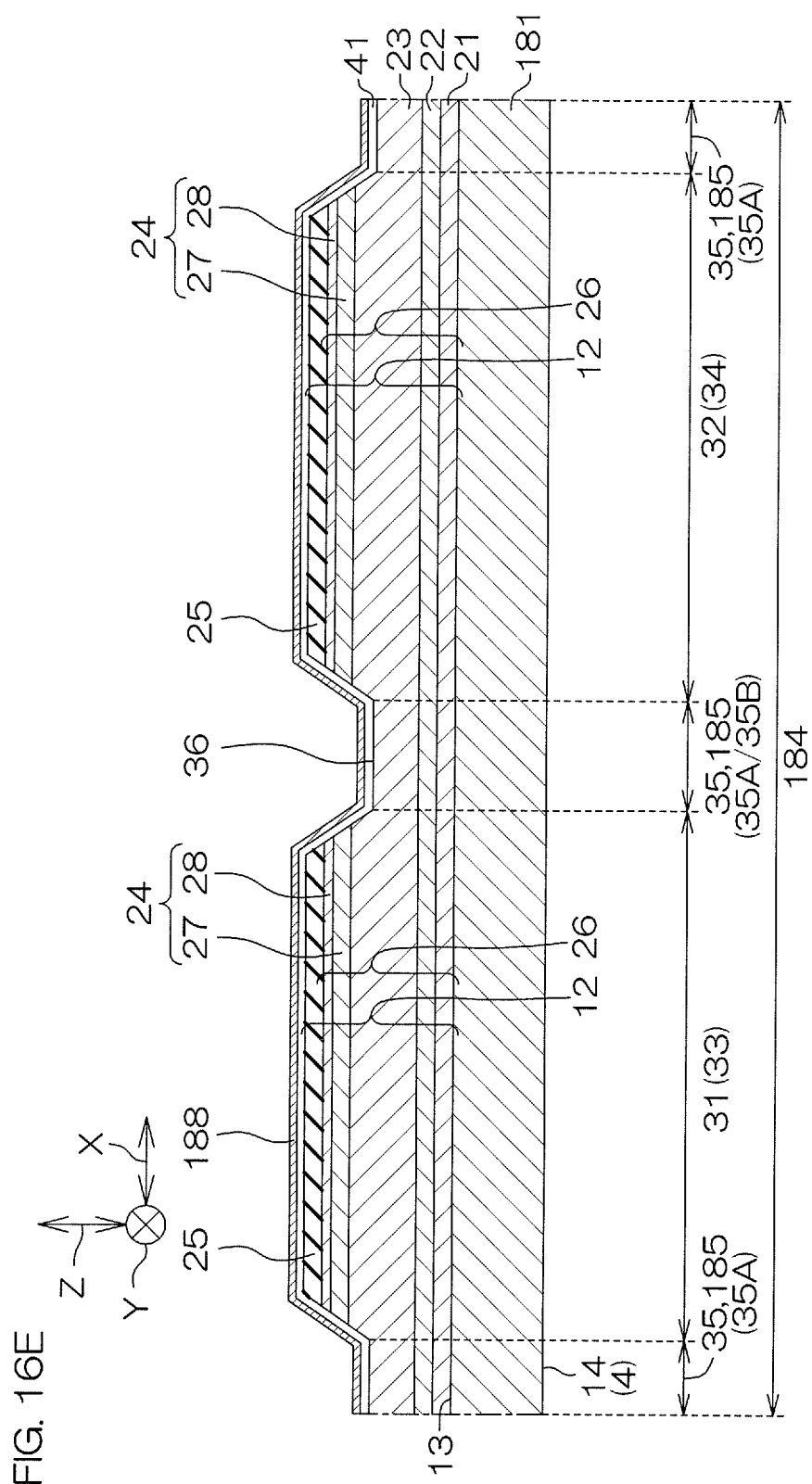
Figure 16F:
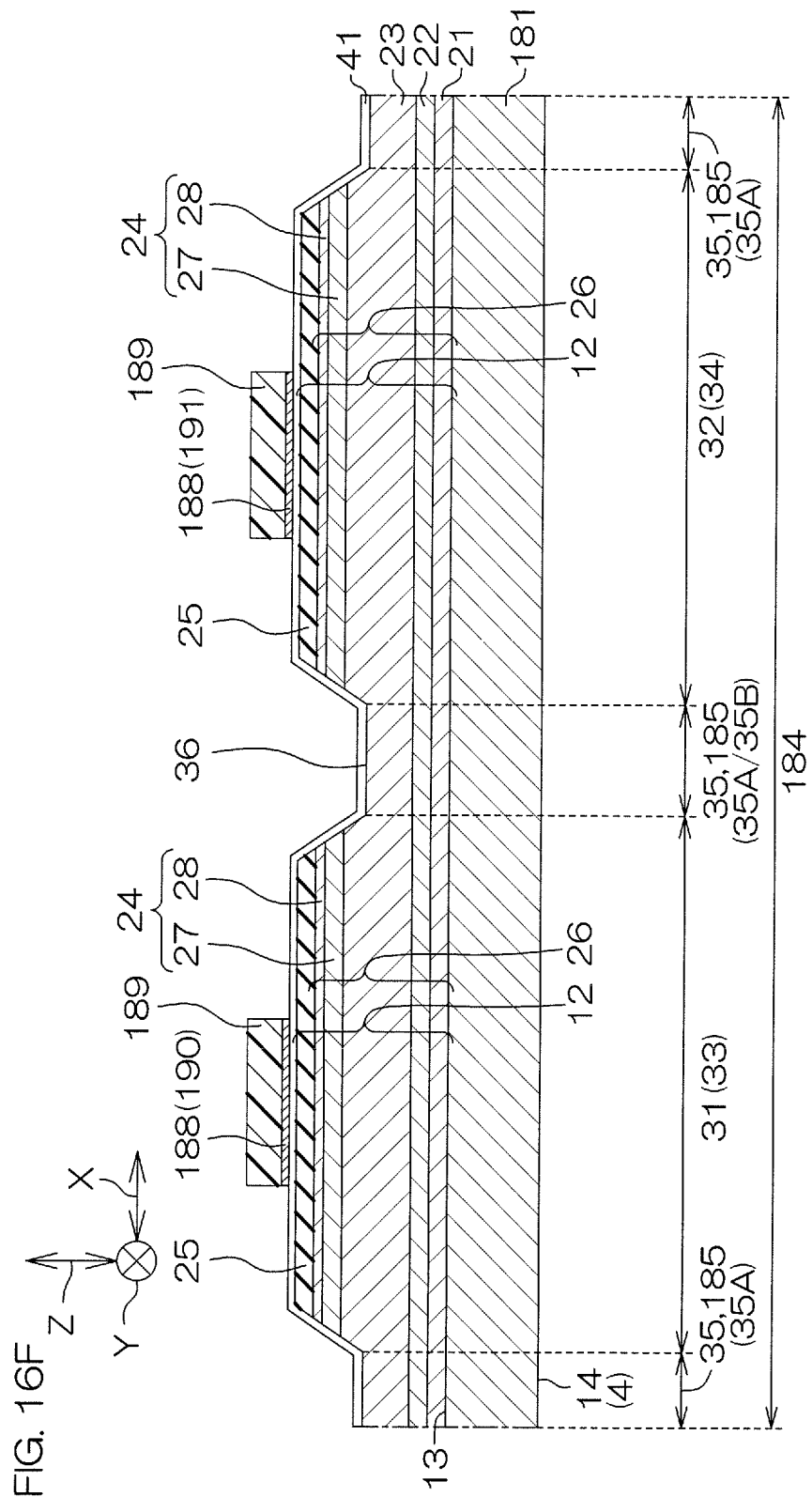
Figure 16G:
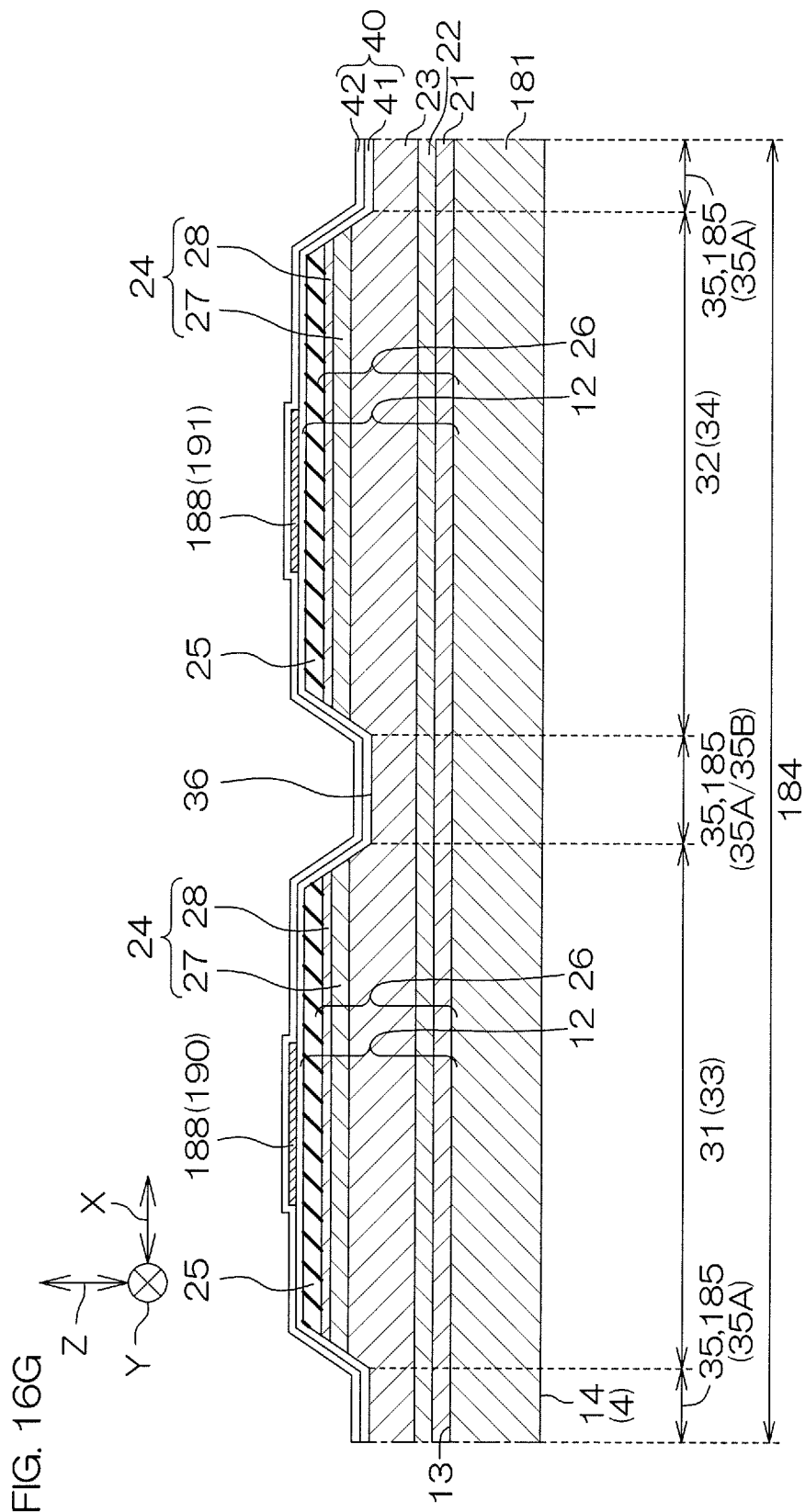
Figure 16H:
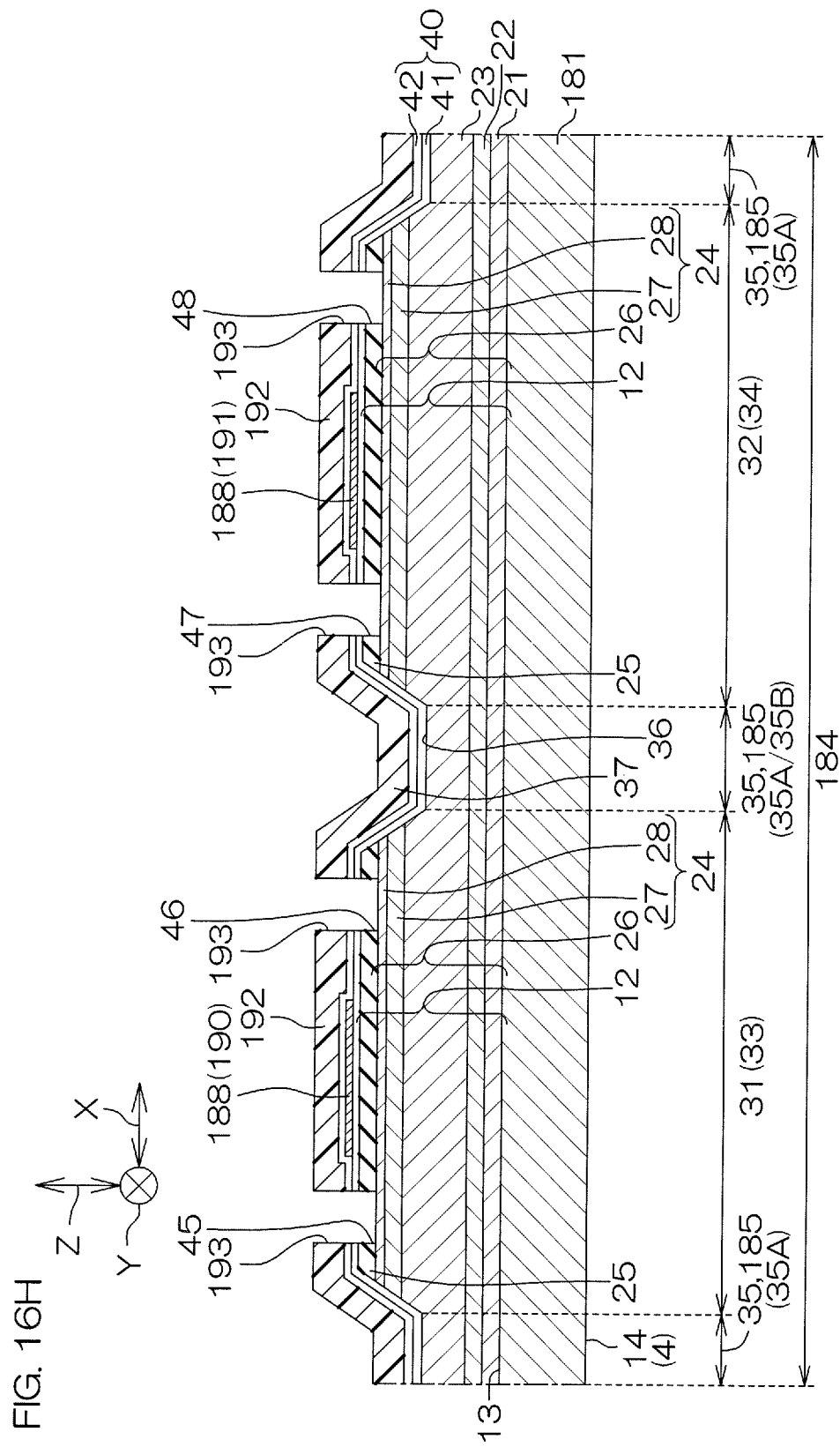
Figure 16I:
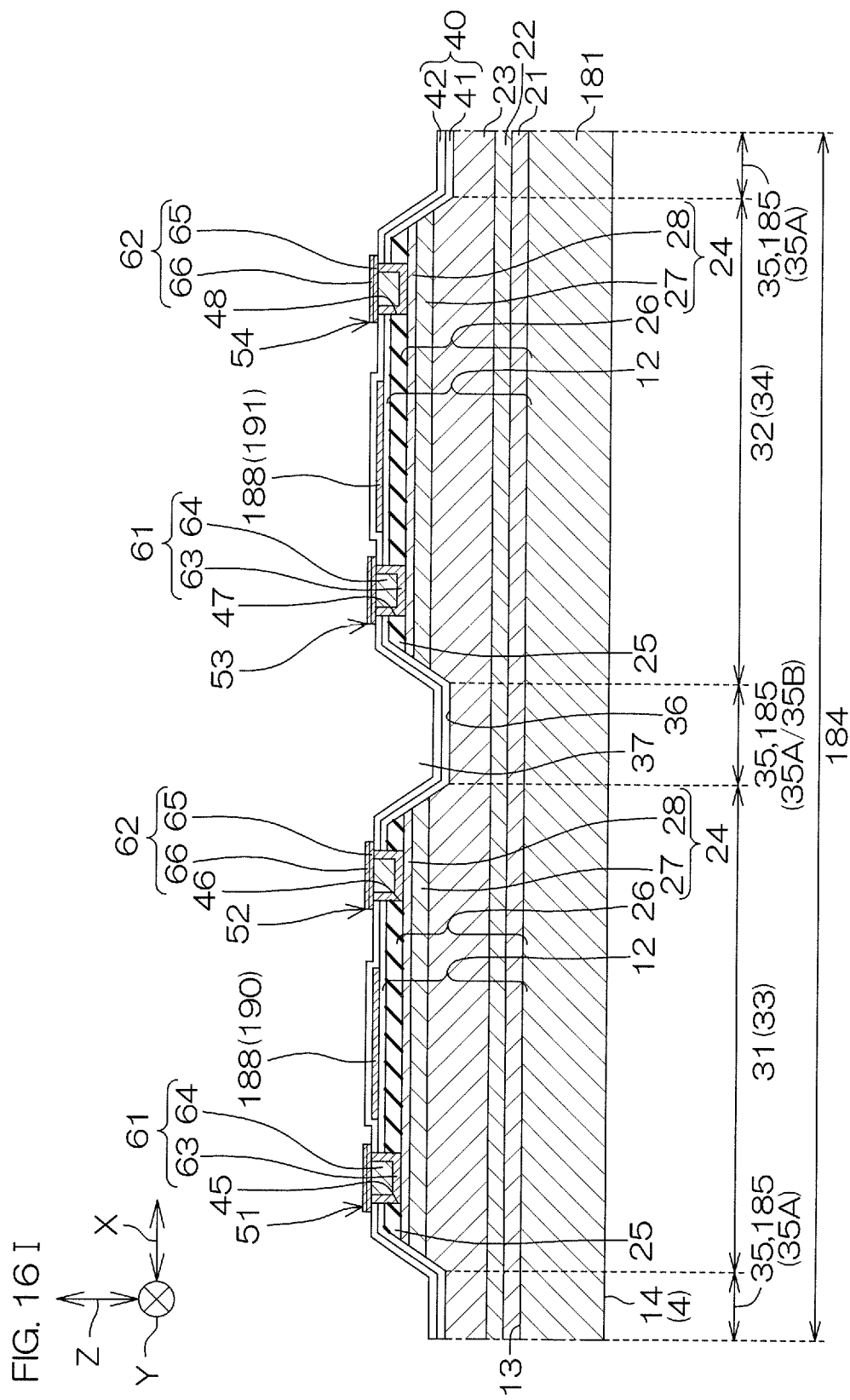
Figure 16J:
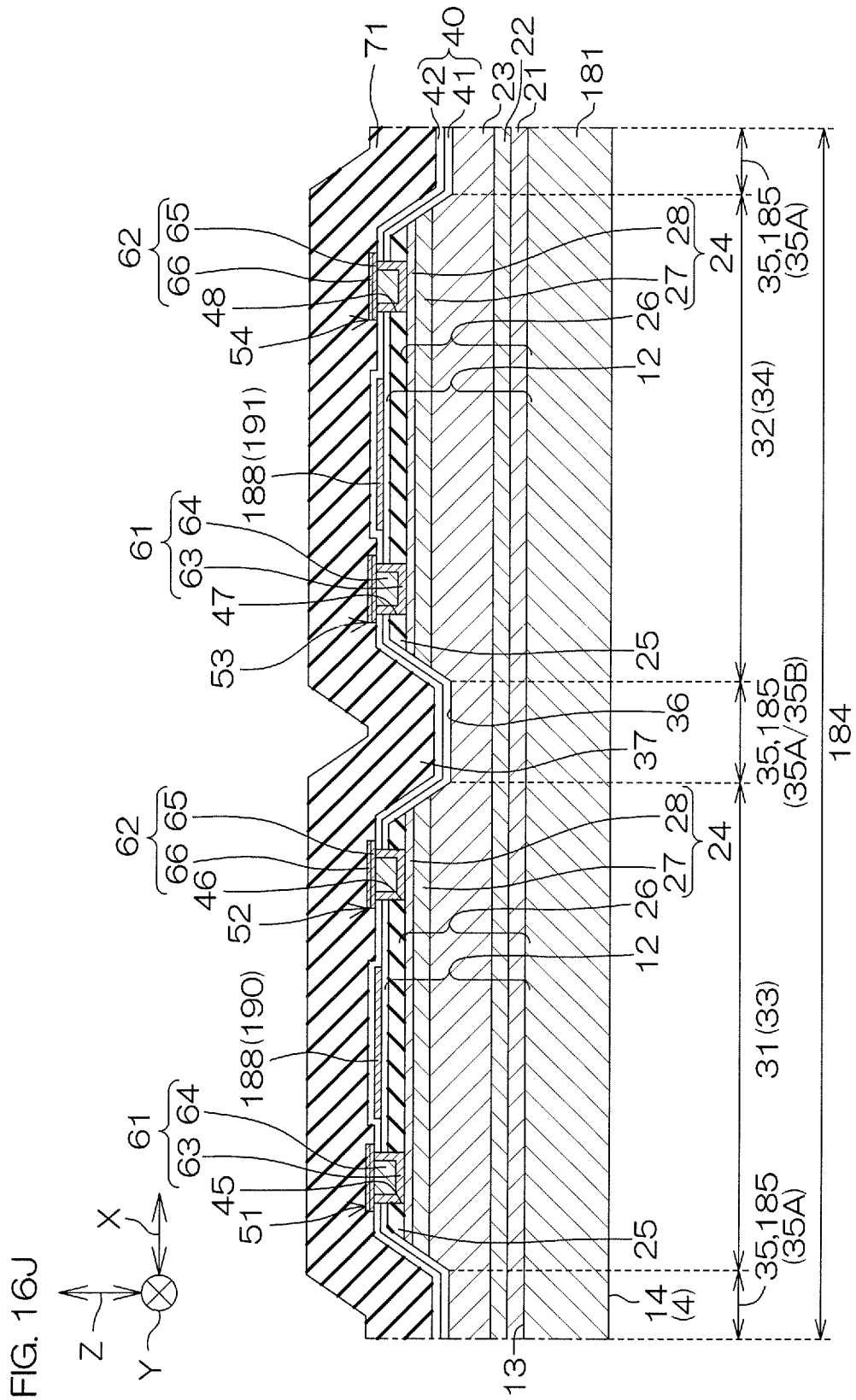
Figure 16K:
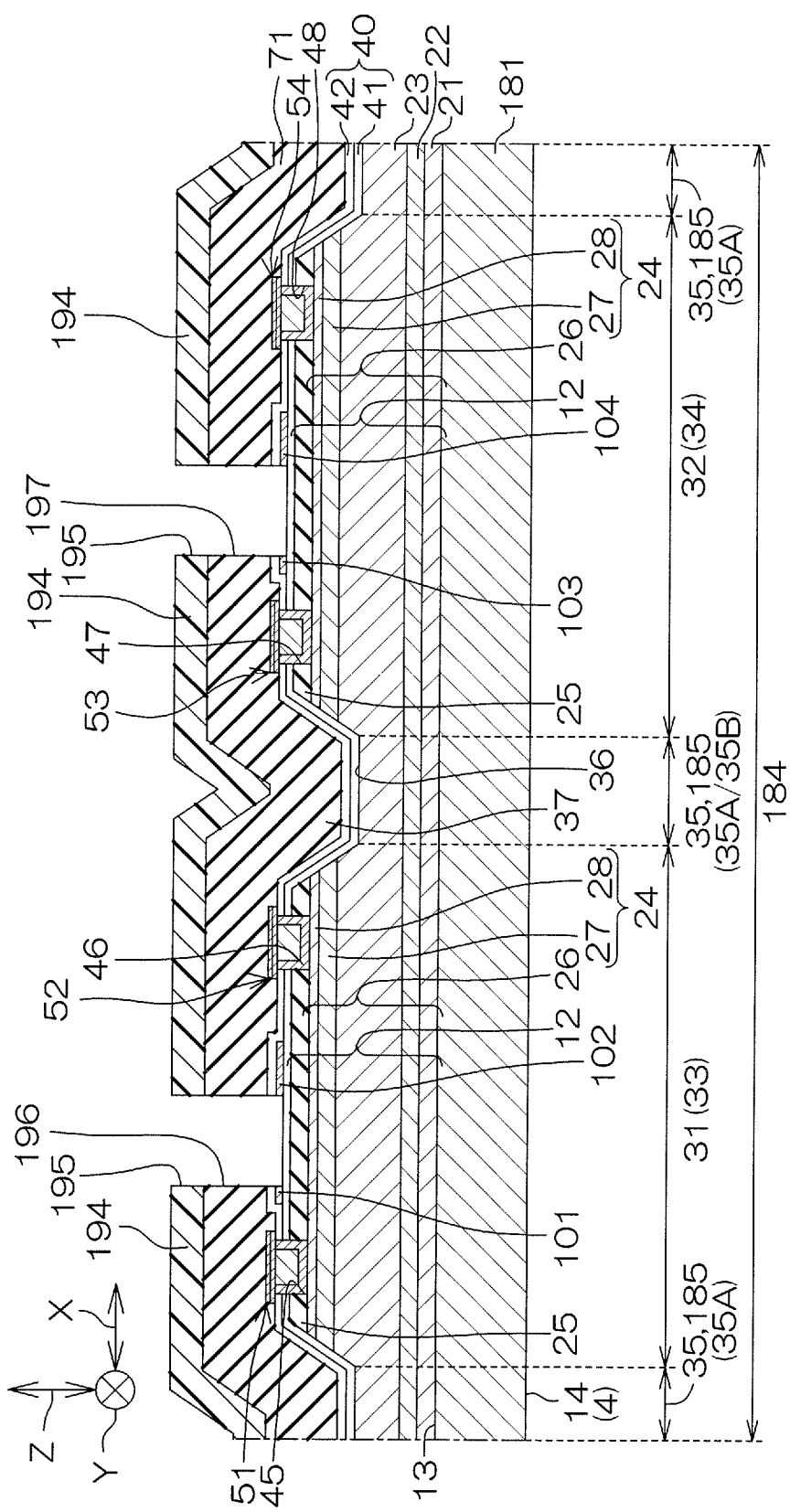
Figure 16L:
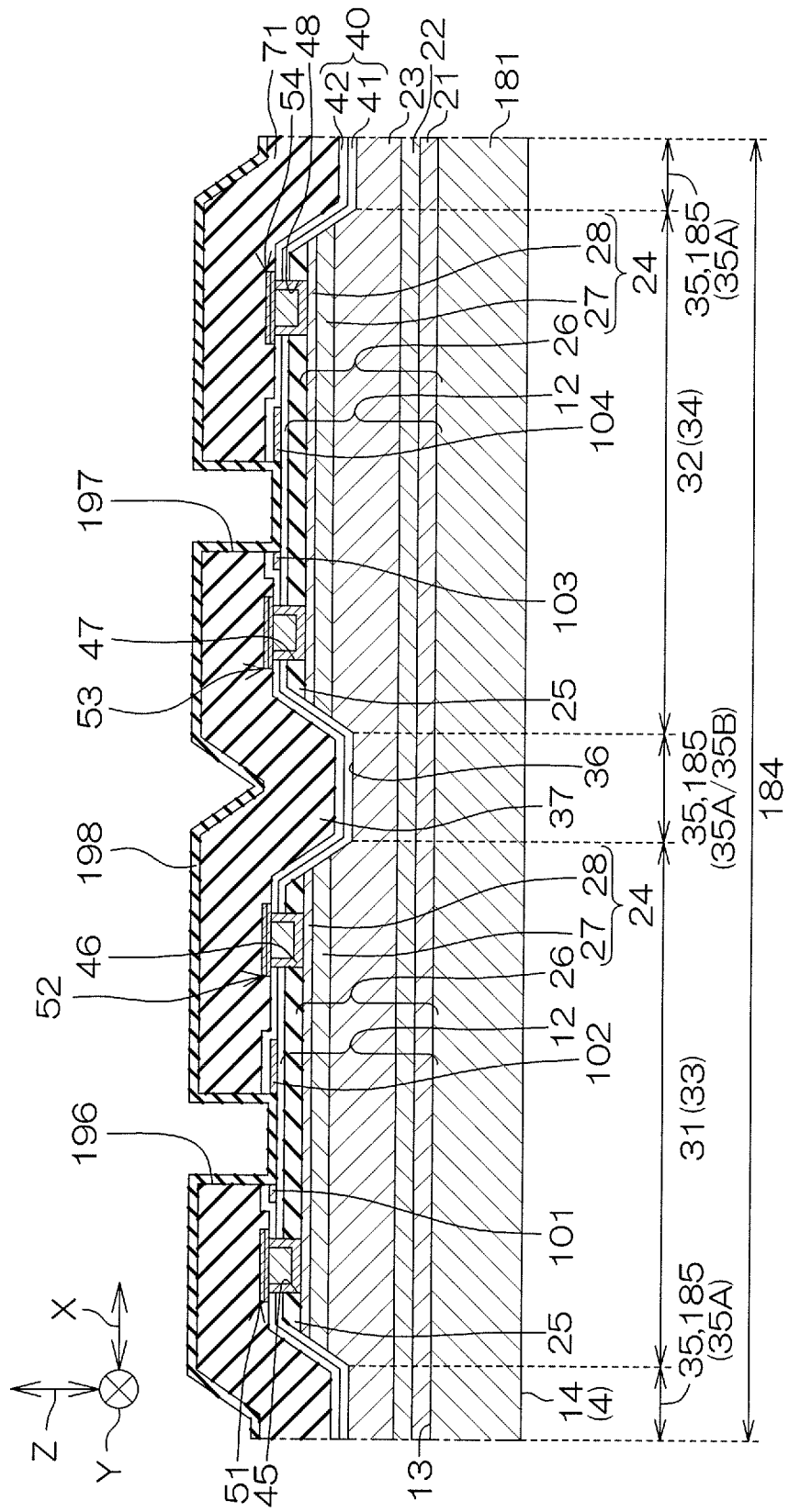
Figure 16M:
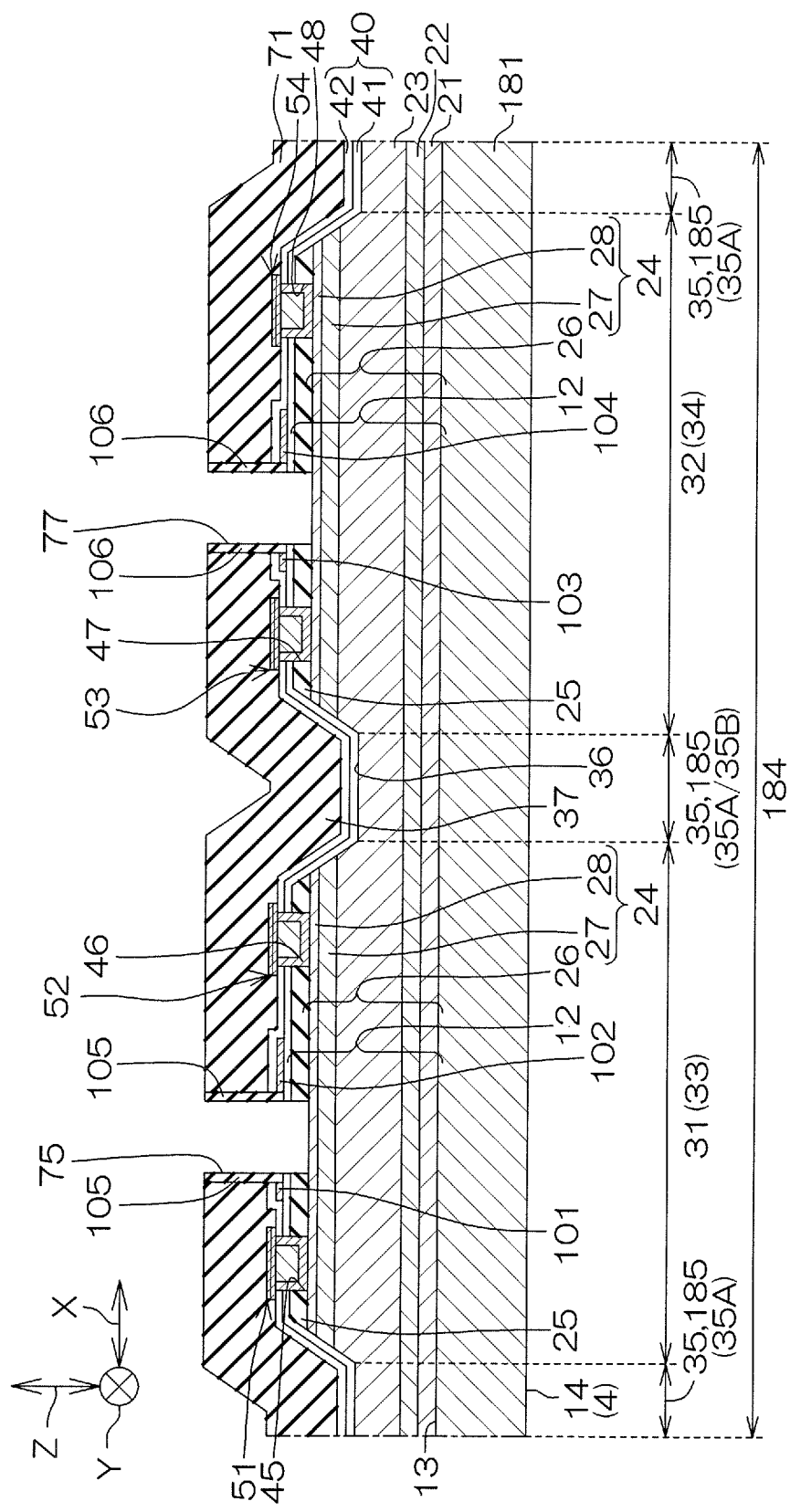
Figure 16N:
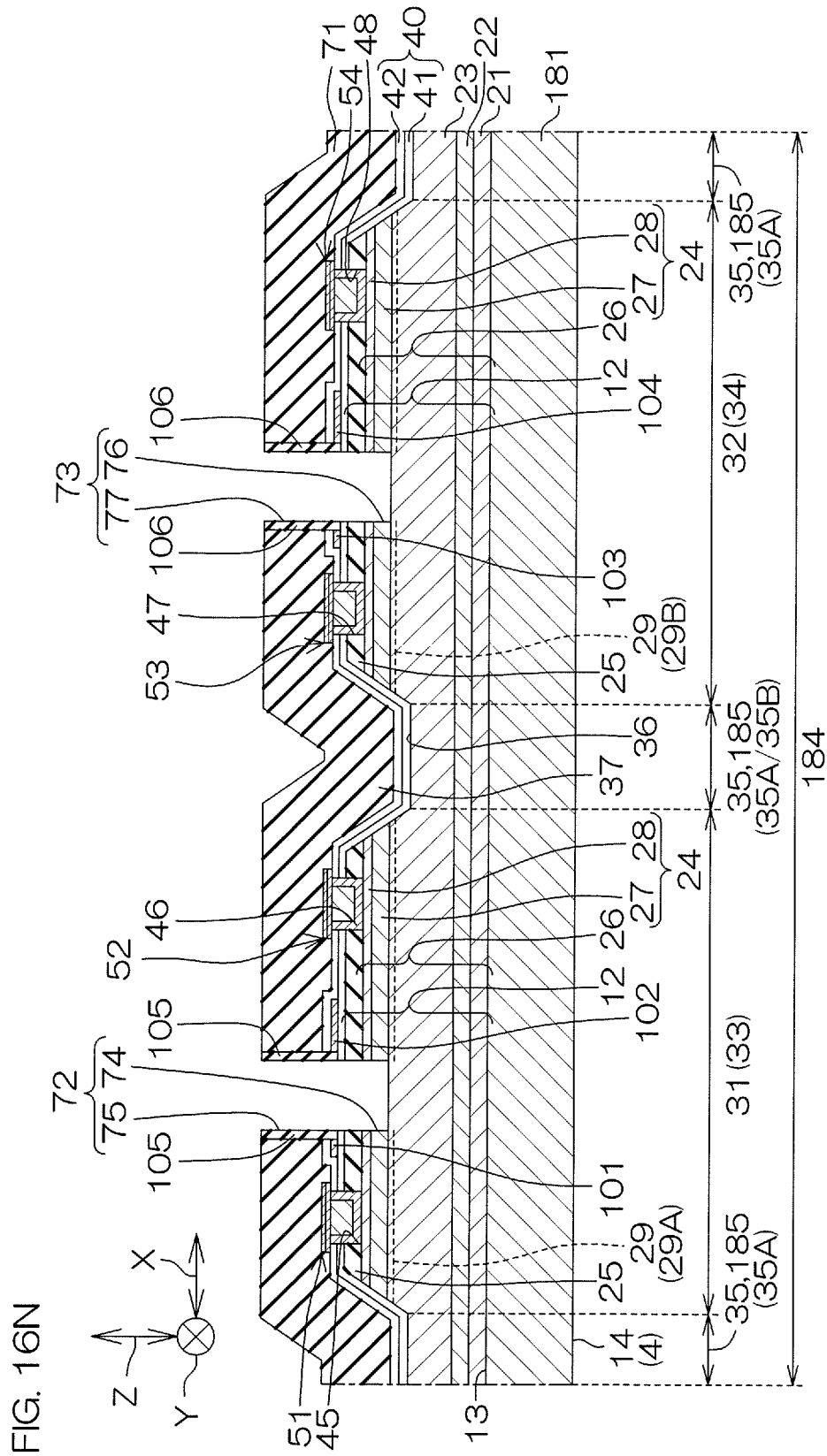
Figure 16O:
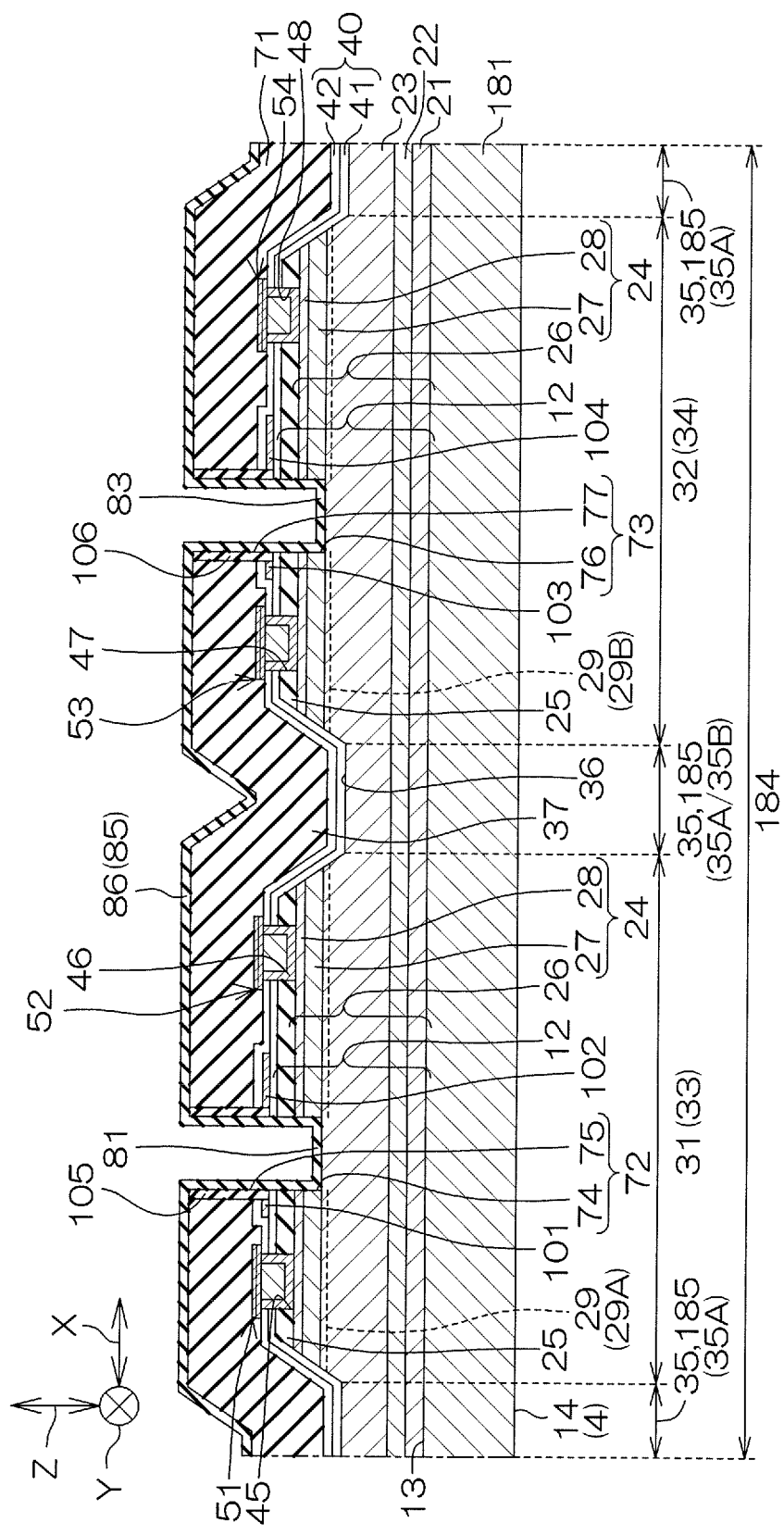
Figure 16P:
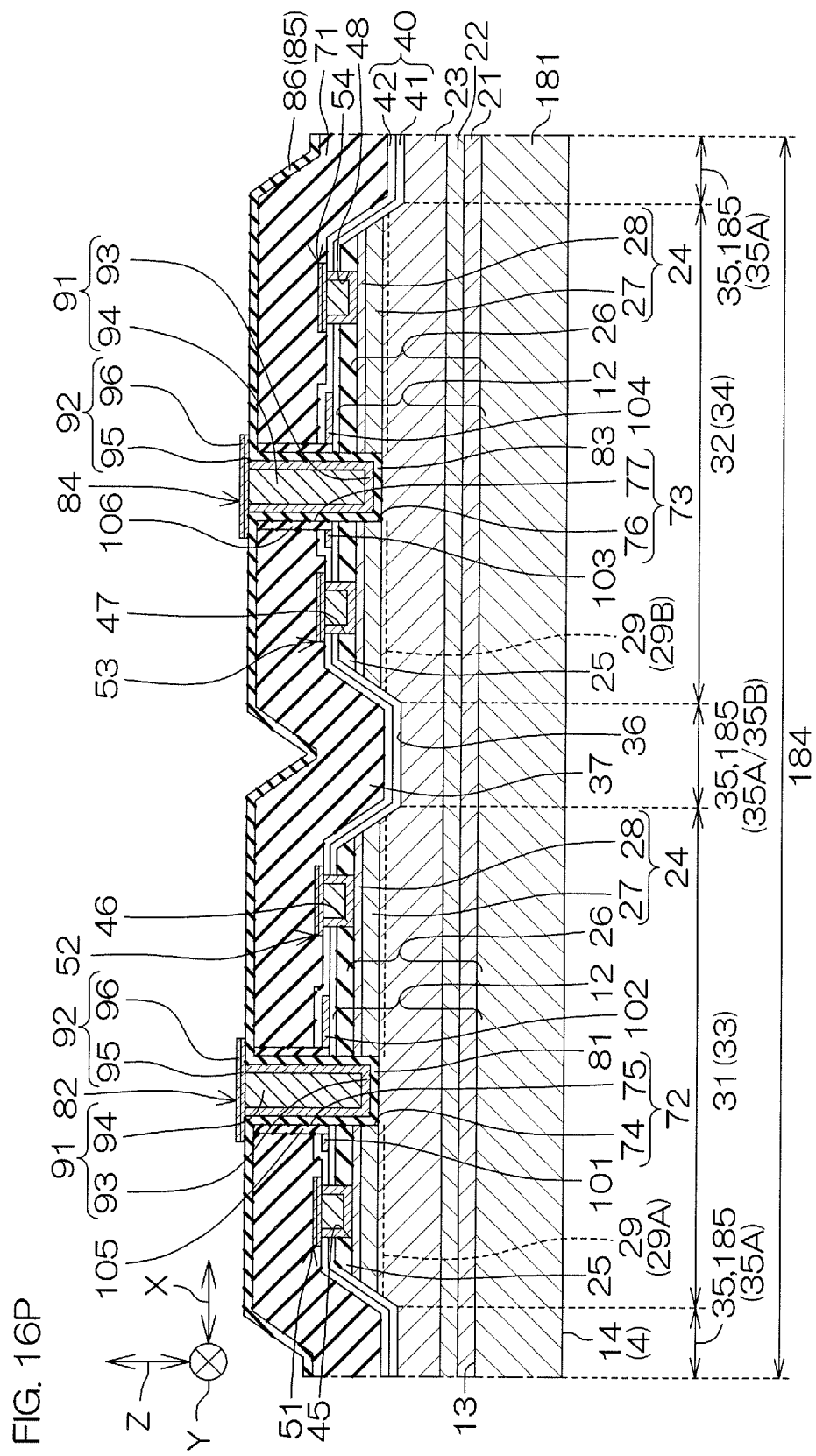
Figure 16Q:
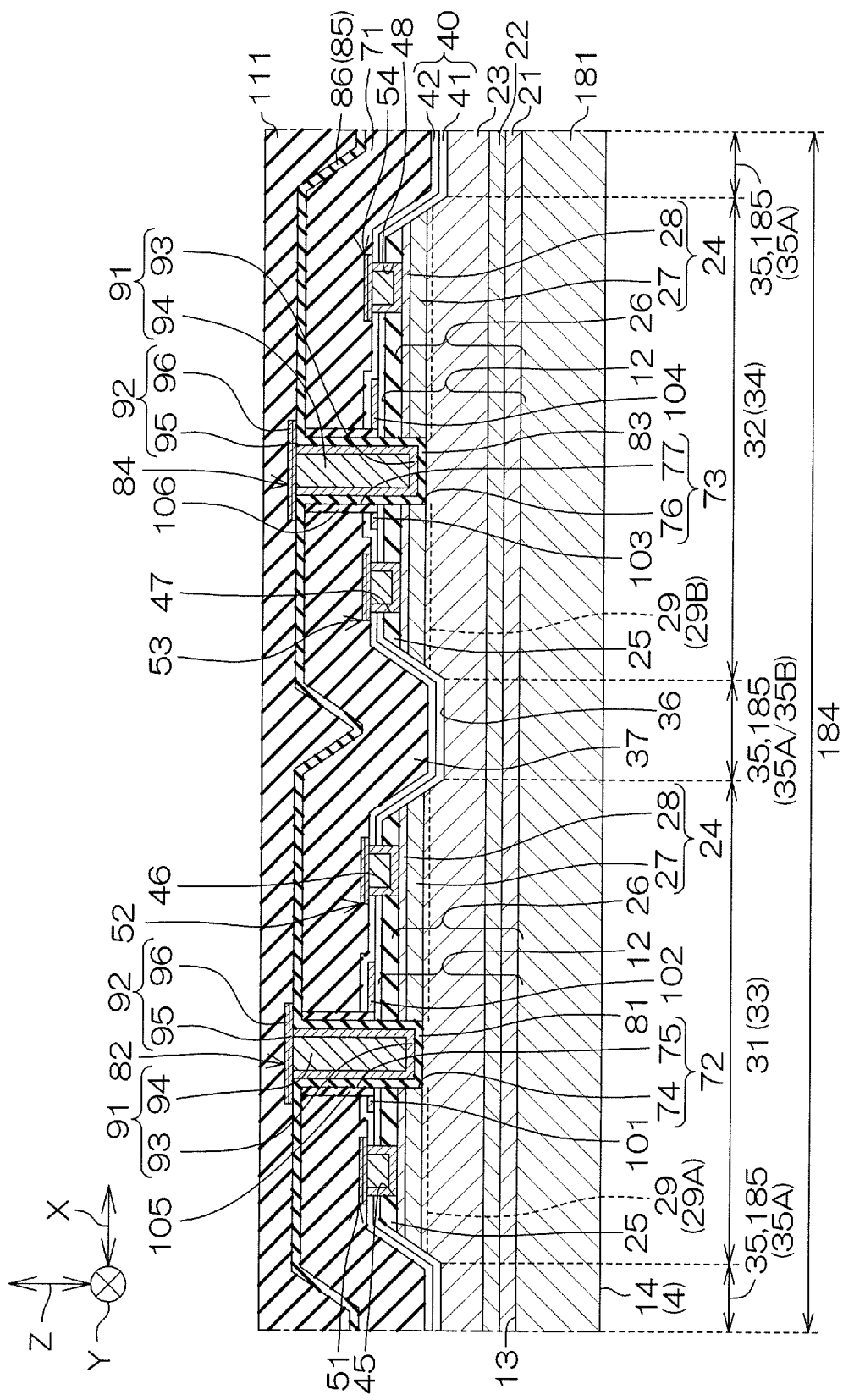
Figure 16R:
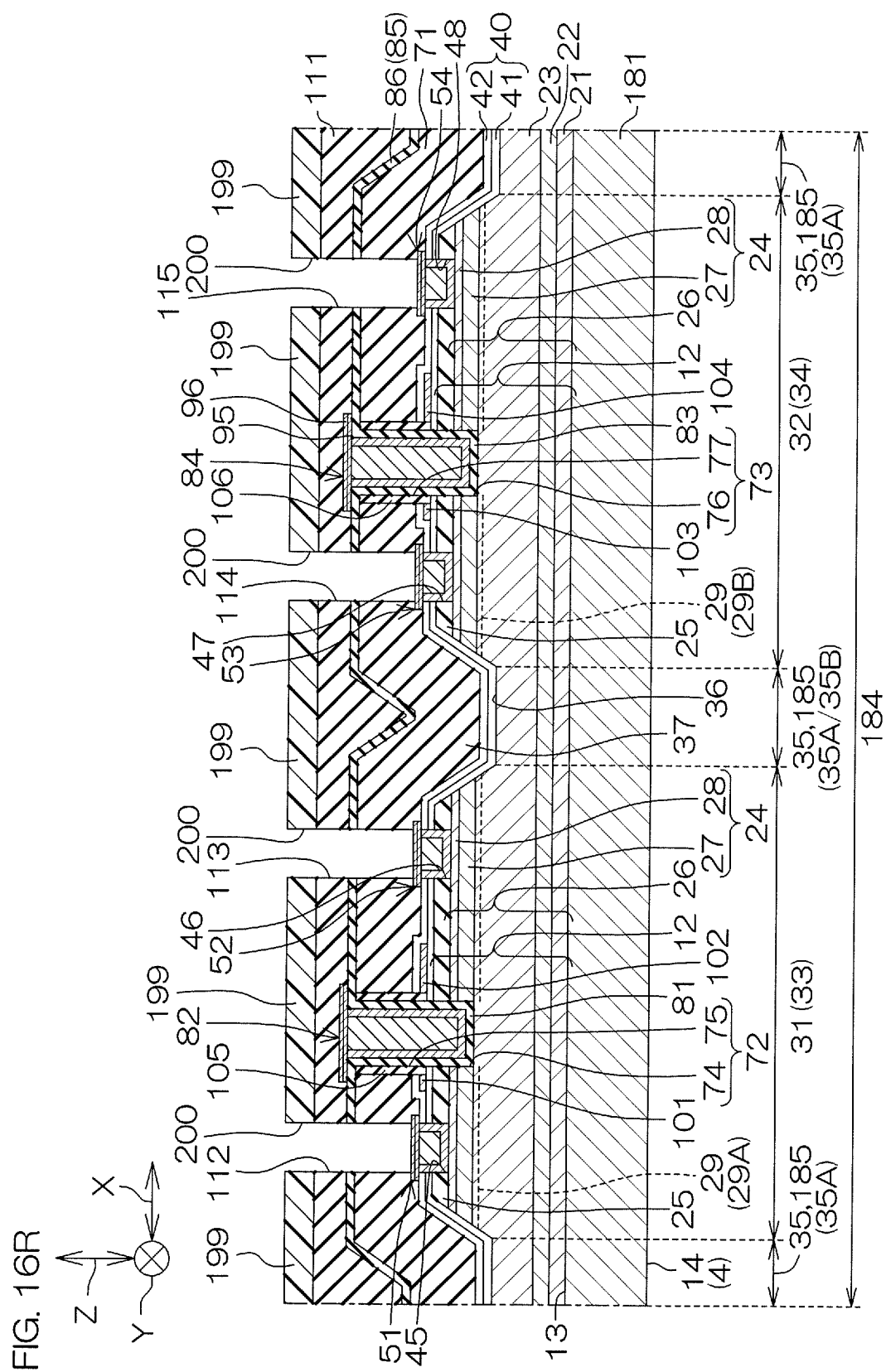
Figure 16W:
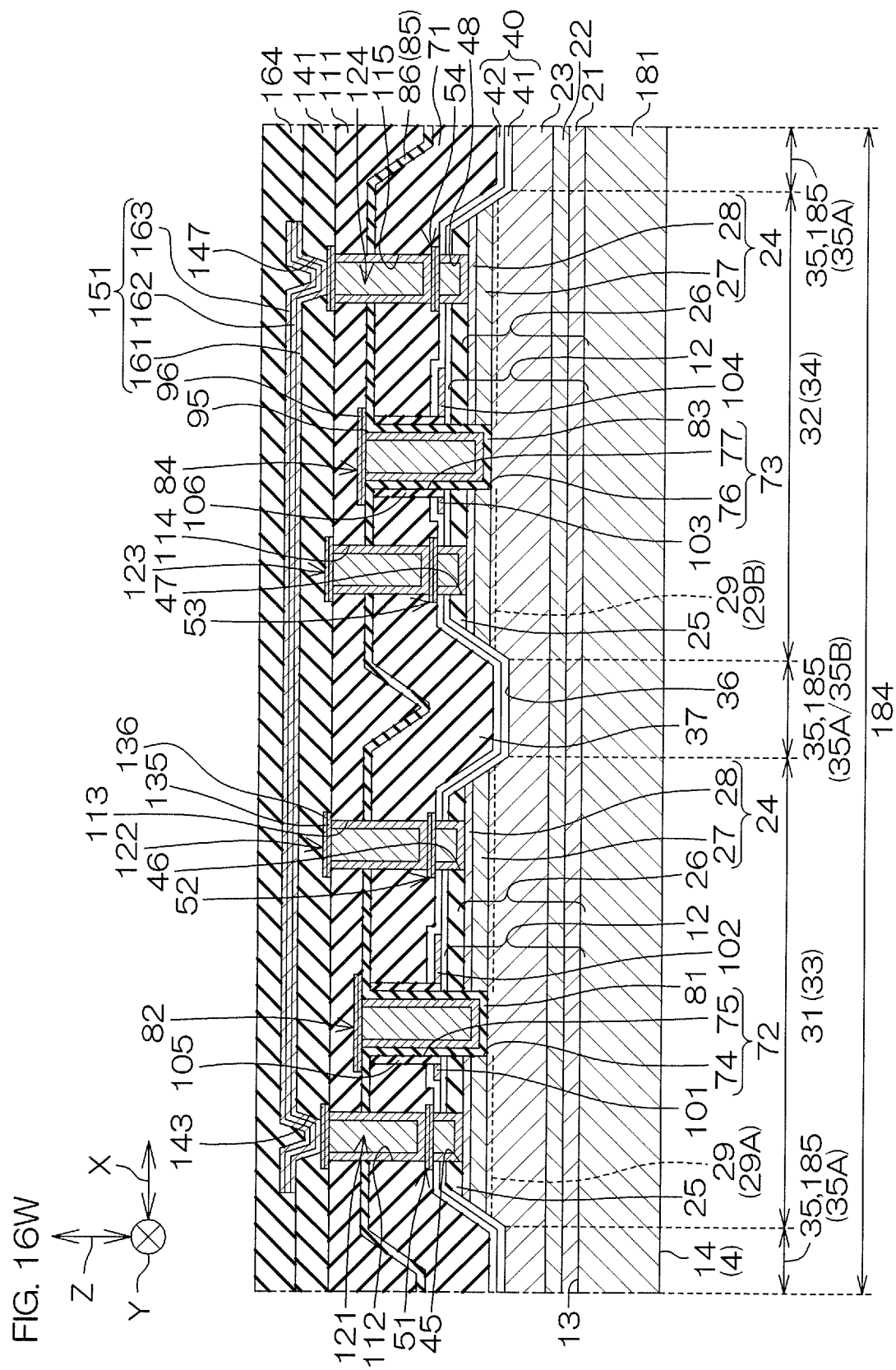
Figure 16Y:
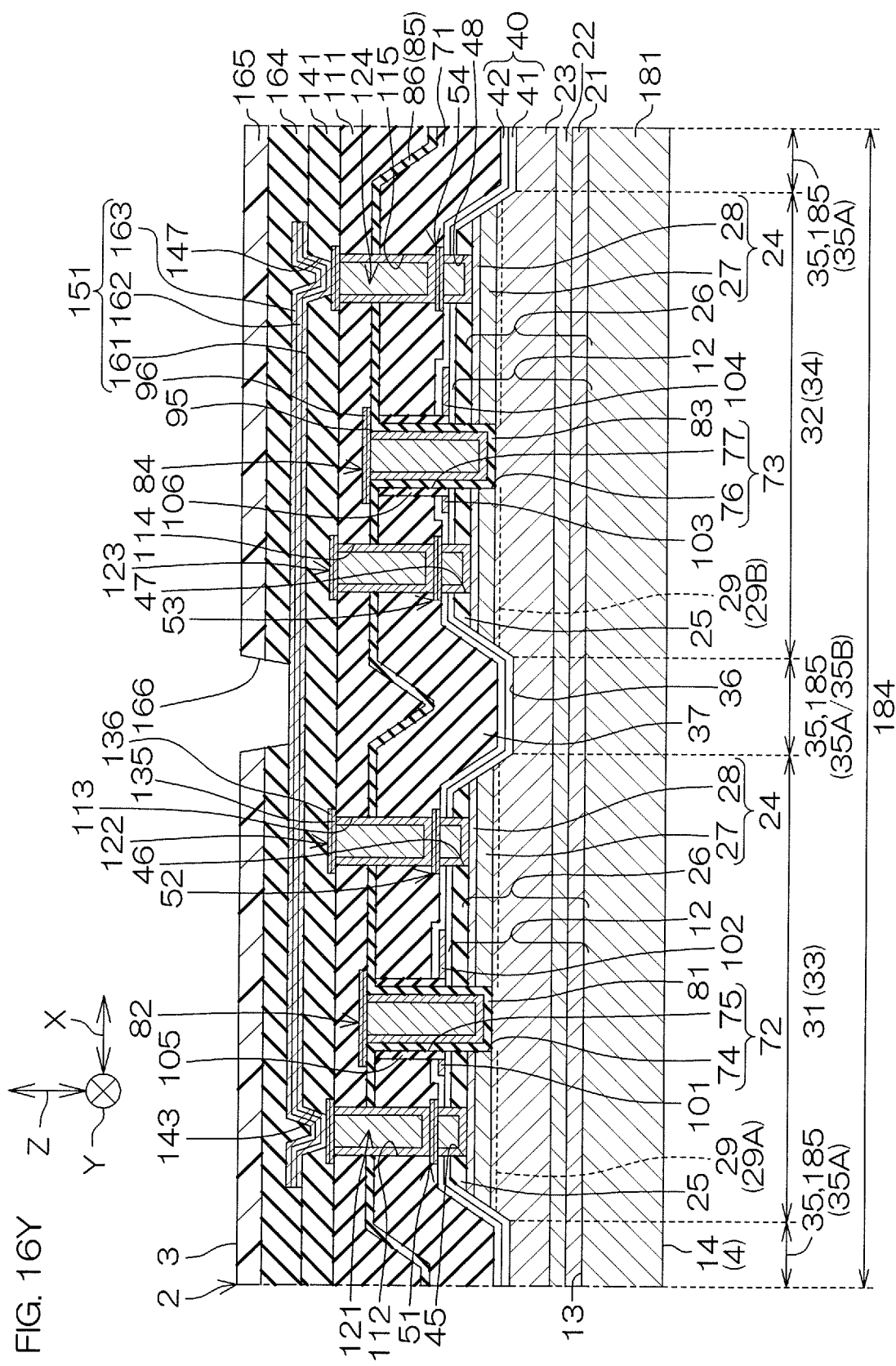
Figure 16Z:
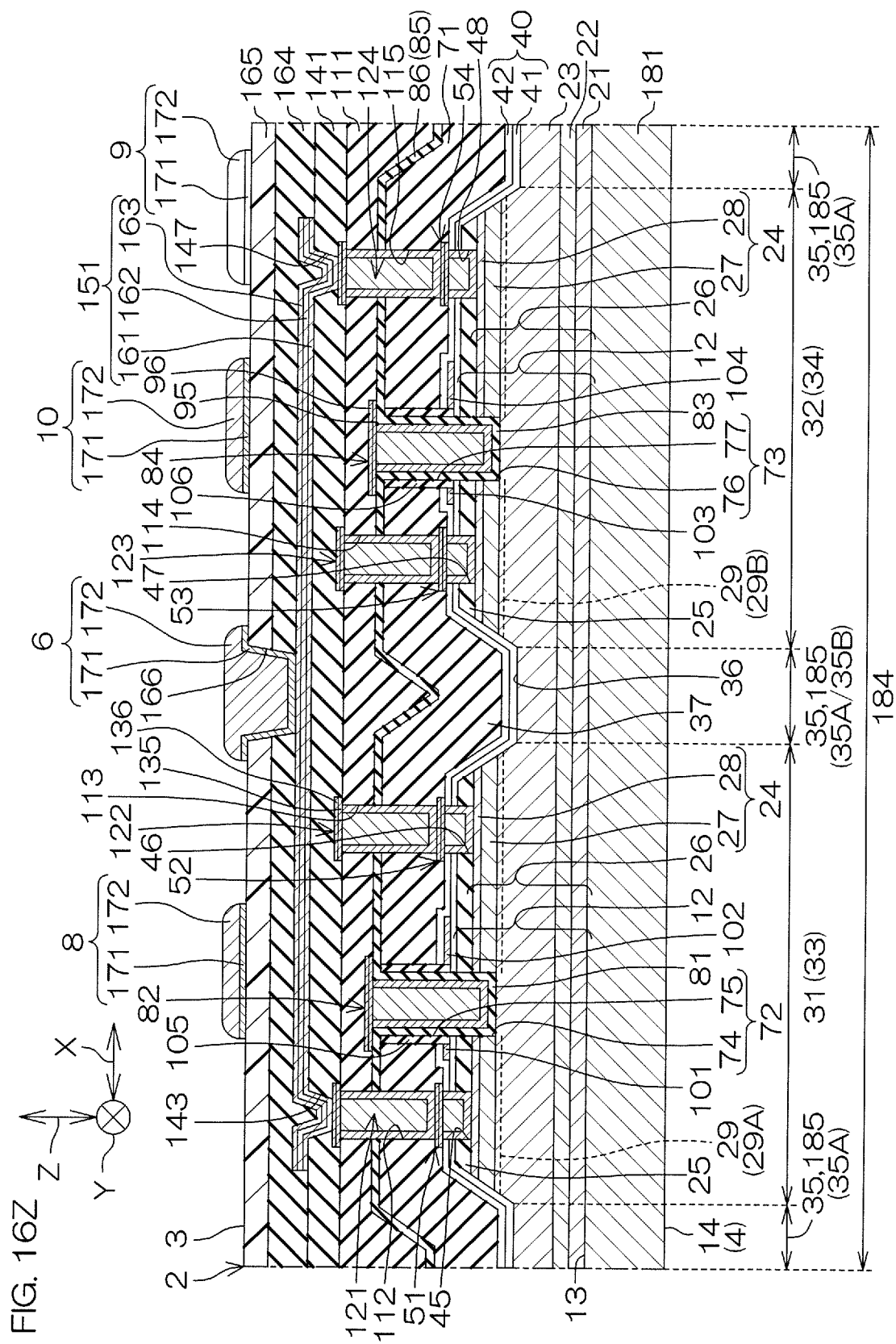

FIG. 16A to FIG. 16Z are cross-sectional views for explaining an example of a method of manufacturing the semiconductor device 1 shown in FIG. 1. FIG. 16A to FIG. 16Z are cross-sectional views showing such portions that correspond to FIG. 2, showing a region in which one semiconductor device 1 is formed.

Referring to FIG. 16A, a wafer 181 is prepared. The wafer 181 has a first wafer main surface 182 on one side and a second wafer main surface 183 on the other side. The first wafer main surface 182 and the second wafer main surface 183 correspond to the first main surface 13 and the second main surface 14 of the substrate 11, respectively.

A plurality of semiconductor device regions 184 in which the semiconductor device 1 is formed is set to the wafer 181. For example, the semiconductor device regions 184 are set in a matrix shape and defined by dicing lines (not shown).

The first device formation region 31 in which the first HEMT 33 is formed, the second device formation region 32 in which the second HEMT 34, and a boundary region 185 between the first device formation region 31 and the second device formation region 32 are further set in each of the semiconductor device regions 184. The wafer 181 is cut along the semiconductor device regions 184 (the dicing lines) into a plurality of semiconductor devices 1 after predetermined manufacturing processes are executed toward the wafer 181.

Next, referring to FIG. 16B, the laminated structure portion 12 that includes the core formation layer 21, the buffer layer 22, the electron transit layer 23, the electron supply layer 24, and the top insulating layer 25 is formed on the first wafer main surface 182. The core formation layer 21, the buffer layer 22, the electron transit layer 23, the electron supply layer 24, and the top insulating layer 25 are respectively formed by epitaxially grown methods.

Next, referring to FIG. 16C, a mask 186 having a predetermined pattern is formed on the laminated structure portion 12. The mask 186 has an opening 187 that exposes a portion along the boundary region 185 in the laminated structure portion 12. That is, the opening 187 exposes a region in which the region separation trench 36 is to be formed in the laminated structure portion 12.

Next, an unnecessary portion of the laminated structure portion 12 is removed by an etching method via the mask 186. The region separation trench 36 is thereby formed in the laminated structure portion 12. The mask 186 is removed thereafter.

Next, referring to FIG. 16D, the first protection layer 41 is formed such as to cover the laminated structure portion 12. The first protection layer 41 may be formed by a CVD (Chemical Vapor Deposition) method. The CVD method may be a low-pressure CVD method. The first protection layer 41 may include CVD-SiO2.

Next, referring to FIG. 16E, a base electrode layer 188 served as a base for the first source field electrode layer 101, the first floating electrode layer 102, the second source field electrode layer 103, and the second floating electrode layer 104 is formed on the first protection layer 41.

Next, referring to FIG. 16F, a mask 189 having a predetermined pattern is formed on the base electrode layer 188. The mask 189 covers regions of the base electrode layer 188 in which a first base electrode layer 190 and a second base electrode layer 191 are to be formed. The first base electrode layer 190 is served as a base for the first source field electrode layer 101 and the first floating electrode layer 102. The second base electrode layer 191 is served as a base for the second source field electrode layer 103 and the second floating electrode layer 104.

Next, an unnecessary portion of the base electrode layer 188 is removed by an etching method via the mask 189. The base electrode layer 188 is thereby divided into the first base electrode layer 190 and the second base electrode layer 191. The mask 189 is removed thereafter.

Next, referring to FIG. 16G, the second protection layer 42 is formed on the first protection layer 41. The second protection layer 42 covers the first base electrode layer 190 and the second base electrode layer 191. The second protection layer 42 may be formed by a CVD method. The CVD method may be a plasma CVD method. The second protection layer 42 may include TEOS-SiO2. The single protection layer 40 is formed by the laminated structure having the first protection layer 41 and the second protection layer 42.

Next, referring to FIG. 16H, a mask 192 having a predetermined pattern is formed on the protection layer 40. The mask 192 has openings 193 that expose regions in which the first source opening 45, the first drain opening 46, the second source opening 47, and the second drain opening 48 are to be formed in the protection layer 40 and the top insulating layer 25.

Next, unnecessary portions of the protection layer 40 and the top insulating layer 25 are removed by etching methods via the mask 192. The first source opening 45, the first drain opening 46, the second source opening 47, and the second drain opening 48 are thereby formed in the protection layer 40 and the top insulating layer 25. The mask 192 is removed thereafter.

Next, referring to FIG. 16I, the first source electrode 51, the first drain electrode 52, the second source electrode 53, and the second drain electrode 54 are embedded in the first source opening 45, the first drain opening 46, the second source opening 47, and the second drain opening 48 that correspond to those electrodes, respectively. This step includes a step of forming the embedded electrode layer 61 and a step of forming the cover electrode layer 62.

The step of forming the embedded electrode layer 61 includes a step of embedding the embedded electrode layer 61 in the first source opening 45, the first drain opening 46, the second source opening 47, and the second drain opening 48. In this step, the second embedded electrode layer 64 is embedded in the first source opening 45, the first drain opening 46, the second source opening 47, and the second drain opening 48 with the first embedded electrode layer 63 interposed between the second embedded electrode layer 64 and the respective opening.

The first embedded electrode layer 63 and the second embedded electrode layer 64 may be each formed by a sputtering method. The first embedded electrode layer 63 may include Ti. The second embedded electrode layer 64 may include AlSiCu alloy.

After the step of forming the embedded electrode layer 61, the step of forming the cover electrode layer 62 is performed. In this step, the first cover electrode layer 65 and the second cover electrode layer 66 are formed in that order on each embedded electrode layer 61. The first cover electrode layer 65 and the second cover electrode layer 66 may be each formed by a sputtering method. The first cover electrode layer 65 may include Ti. The second cover electrode layer 66 may include TiN. The first source electrode 51, the first drain electrode 52, the second source electrode 53, and the second drain electrode 54 are thereby formed.

Next, referring to FIG. 16J, the first interlayer insulating layer 71 is formed on the protection layer 40. The first interlayer insulating layer 71 may be formed by a CVD method. The first interlayer insulating layer 71 may include SiO2. The main surface of the first interlayer insulating layer 71 may be flattened after forming the first interlayer insulating layer 71.

Next, referring to FIG. 16K, a mask 194 having a predetermined pattern is formed on the first interlayer insulating layer 71. The mask 194 has openings 195 that expose regions in which the first gate opening 72 and the second gate opening 73 are to be formed in the first interlayer insulating layer 71, the protection layer 40, the first base electrode layer 190, and the second base electrode layer 191.

Next, unnecessary portions of the first interlayer insulating layer 71, the protection layer 40, the first base electrode layer 190, and the second base electrode layer 191 are removed by etching methods via the mask 194. A first base gate opening 196 served as a base for the first gate opening 72 and a second base gate opening 197 served as a base for the second gate opening 73 are thereby formed.

Furthermore, in this step, an unnecessary portion of the first base electrode layer 190 is removed, so that the first base electrode layer 190 is divided into the first source field electrode layer 101 and the first floating electrode layer 102. Furthermore, in this step, an unnecessary portion of the second base electrode layer 191 is removed, so that the second base electrode layer 191 is divided into the second source field electrode layer 103 and the second floating electrode layer 104. The mask 192 is removed thereafter.

Next, referring to FIG. 16L, a base insulating layer 198 served as a base for the first sidewall insulating layer 105 and the second sidewall insulating layer 106 is formed. The base insulating layer 198 is formed in a film shape along an inner wall of the first base gate opening 196, an inner wall of the second base gate opening 197, and the main surface of the first interlayer insulating layer 71. The base insulating layer 198 may be formed by a CVD method. The base insulating layer 198 may include SiO2.

Next, referring to FIG. 16M, an unnecessary portion of the base insulating layer 198 is removed such that a portion along the inner wall of the first base gate opening 196 and a portion along the inner wall of the second base gate opening 197 remain in the base insulating layer 198. The unnecessary portion of the base insulating layer 198 may be removed by an etching method (e.g., by a dry etching method).

The first sidewall insulating layer 105 and the second sidewall insulating layer 106 are thereby be formed in a self-aligned manner with respect to the main surface of the first interlayer insulating layer 71. In this case, a corner portion of the upper end portion of the first sidewall insulating layer 105 and a corner portion of the upper end portion of the second sidewall insulating layer 106 are rounded (also see FIG. 8).

Next, an unnecessary portion of the second protection layer 42 and an unnecessary portion of the top insulating layer 25 are removed from a bottom wall of the first base gate opening 196 and a bottom wall of the second base gate opening 197. The unnecessary portion of the second protection layer 42 and the unnecessary portion of the top insulating layer 25 may be removed by an etching method (e.g., by a dry etching method). The first through hole 75 of the first gate opening 72 and the second through hole 77 of the second gate opening 73 are thereby formed.

Next, referring to FIG. 16N, unnecessary portions of the electron supply layer 24 are removed from the bottom wall of the first base gate opening 196 and the bottom wall of the second base gate opening 197. The unnecessary portions of the electron supply layer 24 may be removed by an etching method (e.g., by a dry etching method).

The first gate contact hole 74 of the first gate opening 72 and the second gate contact hole 76 of the second gate opening 73 are thereby formed. Furthermore, the first base gate opening 196 and the second base gate opening 197 are thereby formed as the first gate opening 72 and the second gate opening 73.

Next, referring to FIG. 16O, the insulating layer 86 that integrally includes the first gate insulating layer 81, the second gate insulating layer 83, and the main surface insulating layer 85 is formed on the first interlayer insulating layer 71. The insulating layer 86 may be formed by a CVD method or an ALD (Atomic Layer Deposition) method. The insulating layer 86 may include SiO2.

Next, referring to FIG. 16P, the first gate electrode 82 and the second gate electrode 84 are embedded in the first gate opening 72 and the second gate opening 73, respectively. This step includes a step of forming the embedded electrode layer 91 and a step of forming the cover electrode layer 92.

The step of forming the embedded electrode layer 91 includes a step of forming the embedded electrode layer 91 in the first gate opening 72 and the second gate opening 73. In this step, the second embedded electrode layer 94 is embedded in the first gate opening 72 and the second gate opening 73 with the first embedded electrode layer 93 interposed between the second embedded electrode layer 94 and the respective openings. The first embedded electrode layer 93 and the second embedded electrode layer 94 may be each formed by a sputtering method. The first embedded electrode layer 93 may include TiN. The second embedded electrode layer 94 may include W (tungsten).

The step of forming the cover electrode layer 92 is performed after the step of forming the embedded electrode layer 91. In this step, the first cover electrode layer 95 and the second cover electrode layer 96 are formed in that order on each embedded electrode layer 91. The first cover electrode layer 95 and the second cover electrode layer 96 may be each formed by a sputtering method. The first cover electrode layer 95 may include AlCu alloy. The second cover electrode layer 96 may include TiN. The first gate electrode 82 and the second gate electrode 84 are thereby formed.

Next, referring to FIG. 16Q, the second interlayer insulating layer 111 is formed on the insulating layer 86. The second interlayer insulating layer 111 may be formed by a CVD method. The second interlayer insulating layer 111 may include SiO2. The main surface of the second interlayer insulating layer 111 may be flattened after forming the second interlayer insulating layer 111.

Next, referring to FIG. 16R, a mask 199 having a predetermined pattern is formed on the second interlayer insulating layer 111. The mask 199 has openings 200 that expose regions in which the first source contact opening 112, the first drain contact opening 113, the second source contact opening 114, and the second drain contact opening 115 are to be formed in the second interlayer insulating layer 111, the insulating layer 86, and the first interlayer insulating layer 71.

Next, unnecessary portions of the second interlayer insulating layer 111, the insulating layer 86, and the first interlayer insulating layer 71 are removed by etching methods via the mask 199. The second source contact opening 114 and the second drain contact opening 115 are thereby formed. The mask 199 is removed thereafter.

Next, referring to FIG. 16S, the first source contact electrode 121, the first drain contact electrode 122, the second source contact electrode 123, and the second drain contact electrode 124 are embedded in the first source contact opening 112, the first drain contact opening 113, the second source contact opening 114, and the second drain contact opening 115 that correspond to those electrodes, respectively. This step includes a step of forming the embedded electrode layer 131 and a step of forming the cover electrode layer 132.

The step of forming the embedded electrode layer 131 includes a step of embedding the embedded electrode layer 131 in the first source contact opening 112, the first drain contact opening 113, the second source contact opening 114, and the second drain contact opening 115 that correspond to the embedded electrode layer 131. In this step, the second embedded electrode layer 134 is embedded in the first source contact opening 112, the first drain contact opening 113, the second source contact opening 114, and the second drain contact opening 115 with the first embedded electrode layer 133 interposed between the second embedded electrode layer 134 and each opening.

The first embedded electrode layer 133 and the second embedded electrode layer 134 may be each formed by a sputtering method. The first embedded electrode layer 133 may include TiN. The second embedded electrode layer 134 may include W (tungsten).

The step of forming the cover electrode layer 132 is performed after the step of forming the embedded electrode layer 131. In this step, the first cover electrode layer 135 and the second cover electrode layer 136 are formed in that order on each embedded electrode layer 131. The first cover electrode layer 135 and the second cover electrode layer 136 may be each formed by a sputtering method. The first cover electrode layer 135 may include AlCu alloy. The second cover electrode layer 136 may include TiN. The first source contact electrode 121, the first drain contact electrode 122, the second source contact electrode 123, and the second drain contact electrode 124 are thereby formed.

Next, referring to FIG. 16T, the third interlayer insulating layer 141 is formed on the second interlayer insulating layer 111. The third interlayer insulating layer 141 may be formed by a CVD method. The third interlayer insulating layer 141 may include SiO2. The main surface of the third interlayer insulating layer 141 may be flattened after forming the third interlayer insulating layer 141.

Next, referring to FIG. 16U, a mask 201 having a predetermined pattern is formed on the third interlayer insulating layer 141. The mask 201 has openings 202 that expose regions in which the first source contact hole 143, the first drain contact hole 144, the second source contact hole 146, and the second drain contact hole 147 are to be formed in the third interlayer insulating layer 141.

Next, unnecessary portions of the third interlayer insulating layer 141 are removed by an etching method via the mask 201. The first source contact hole 143, the first drain contact hole 144, the second source contact hole 146, and the second drain contact hole 147 are thereby formed. The mask 201 is removed thereafter.

Next, referring to FIG. 16V, a base wiring layer 203 to serve as a base for the source-drain wiring layer 151, the first gate wiring layer 152, the drain wiring layer 153, the second gate wiring layer 154, and the source wiring layer 155 is formed on the third interlayer insulating layer 141.

The first wiring layer 161, the second wiring layer 162, and the third wiring layer 163 are formed in that order on the third interlayer insulating layer 141, in the step of forming the base wiring layer 203. The first wiring layer 161, the second wiring layer 162, and the third wiring layer 163 may be each formed by a sputtering method.

Next, a mask 204 having a predetermined pattern is formed on the base wiring layer 203. The mask 204 covers regions in which the source-drain wiring layer 151, the first gate wiring layer 152, the drain wiring layer 153, the second gate wiring layer 154, and the source wiring layer 155 are to be formed in the base wiring layer 203.

Next, unnecessary portions of the base wiring layer 203 are removed by etching methods via the mask 204. The source-drain wiring layer 151, the first gate wiring layer 152, the drain wiring layer 153, the second gate wiring layer 154, and the source wiring layer 155 are thereby formed. The mask 204 is removed thereafter.

Next, referring to FIG. 16W, the fourth interlayer insulating layer 164 is formed on the third interlayer insulating layer 141. The fourth interlayer insulating layer 164 may be formed by a CVD method. The fourth interlayer insulating layer 164 may include SiO2. The main surface of the fourth interlayer insulating layer 164 may be flattened after forming the fourth interlayer insulating layer 164.

Next, referring to FIG. 16X, a mask 205 having a predetermined pattern is formed on the fourth interlayer insulating layer 164. The mask 205 has openings 206 that expose regions in which the source-drain pad opening 166, the first gate pad opening 167, the drain pad opening 168, the second gate pad opening 169, and the source pad opening 170 are to be formed in the fourth interlayer insulating layer 164. Next, unnecessary portions of the fourth interlayer insulating layer 164 are removed by an etching method via the mask 205. The mask 205 is removed thereafter.

Next, referring to FIG. 16Y, the resin layer 165 is formed on the fourth interlayer insulating layer 164. The resin layer 165 may be formed by coating the fourth interlayer insulating layer 164 with a polyimide resin. Next, the resin layer 165 is selectively exposed to light and developed. The regions in which the source-drain pad opening 166, the first gate pad opening 167, the drain pad opening 168, the second gate pad opening 169, and the source pad opening 170 are to be formed in the resin layer 165 are removed.

The source-drain pad opening 166, the first gate pad opening 167, the drain pad opening 168, the second gate pad opening 169, and the source pad opening 170 are thereby formed in the fourth interlayer insulating layer 164 and the resin layer 165.

Next, referring to FIG. 16Z, the source-drain external terminal 6, the first gate external terminal 7, the drain external terminal 8, the second gate external terminal 9, and the source external terminal 10 are formed in the source-drain pad opening 166, the first gate pad opening 167, the drain pad opening 168, the second gate pad opening 169, and the source pad opening 170 that correspond to those terminals, respectively.

In this step, first, the base electrode layer 171 is formed in the source-drain pad opening 166, the first gate pad opening 167, the drain pad opening 168, the second gate pad opening 169, and the source pad opening 170. The base electrode layer 171 may be formed by a sputtering method. The base electrode layer 171 may include TiN.

Next, the conductive bonding material layer 172 is formed on the base electrode layer 171. The conductive bonding material layer 172 may be formed by a plating method. The conductive bonding material layer 172 may include solder. The source-drain external terminal 6, the first gate external terminal 7, the drain external terminal 8, the second gate external terminal 9, and the source external terminal 10 are thereby formed.

The wafer 181 is cut along the semiconductor device regions 184 (the dicing lines) into a plurality of semiconductor devices 1 thereafter. Through the steps including the above, the semiconductor device 1 is manufactured.

Figure 17:
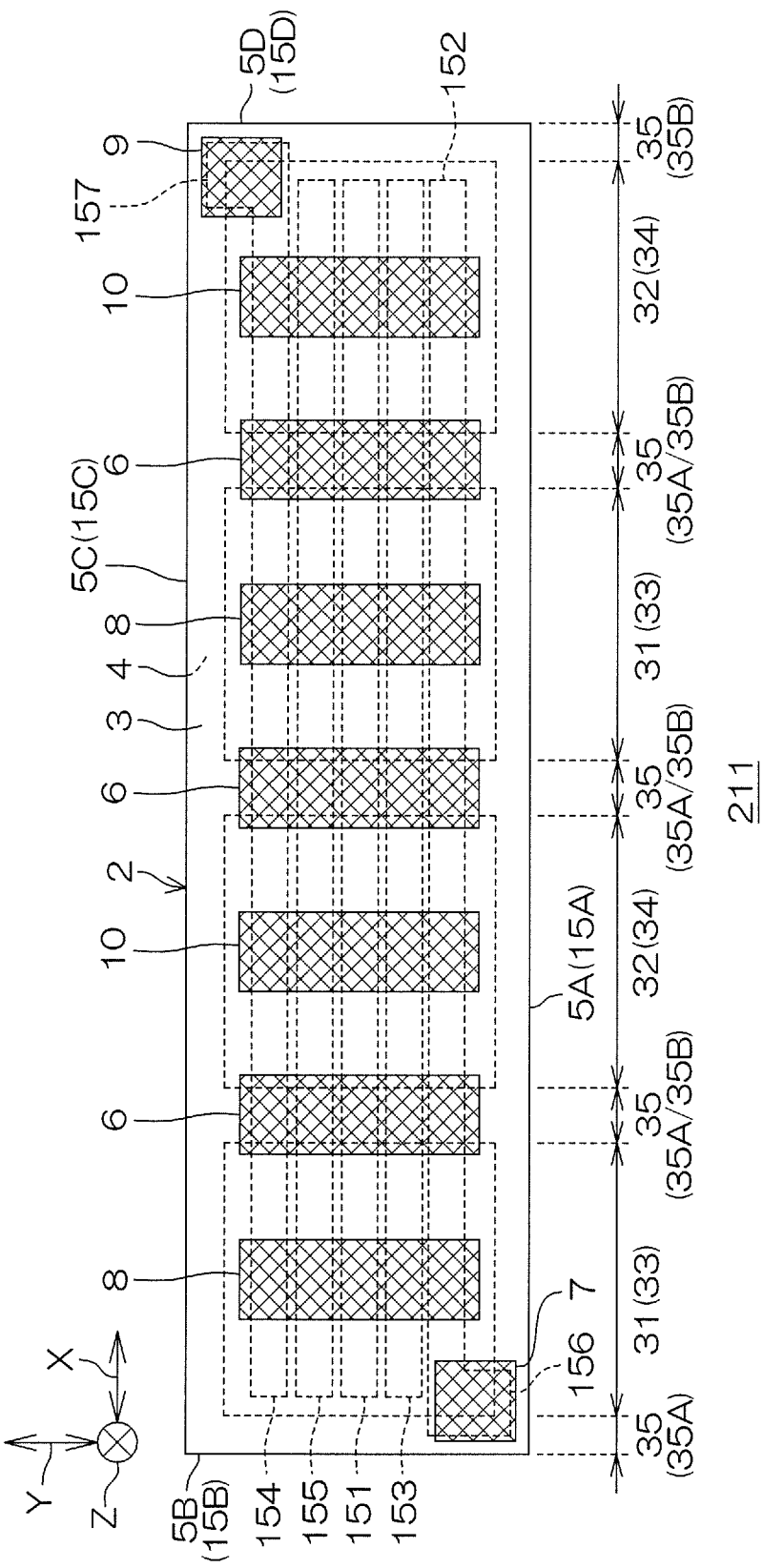
FIG. 17 is a plan view showing a semiconductor device according to a second preferred embodiment of the present invention.
Figure 18:
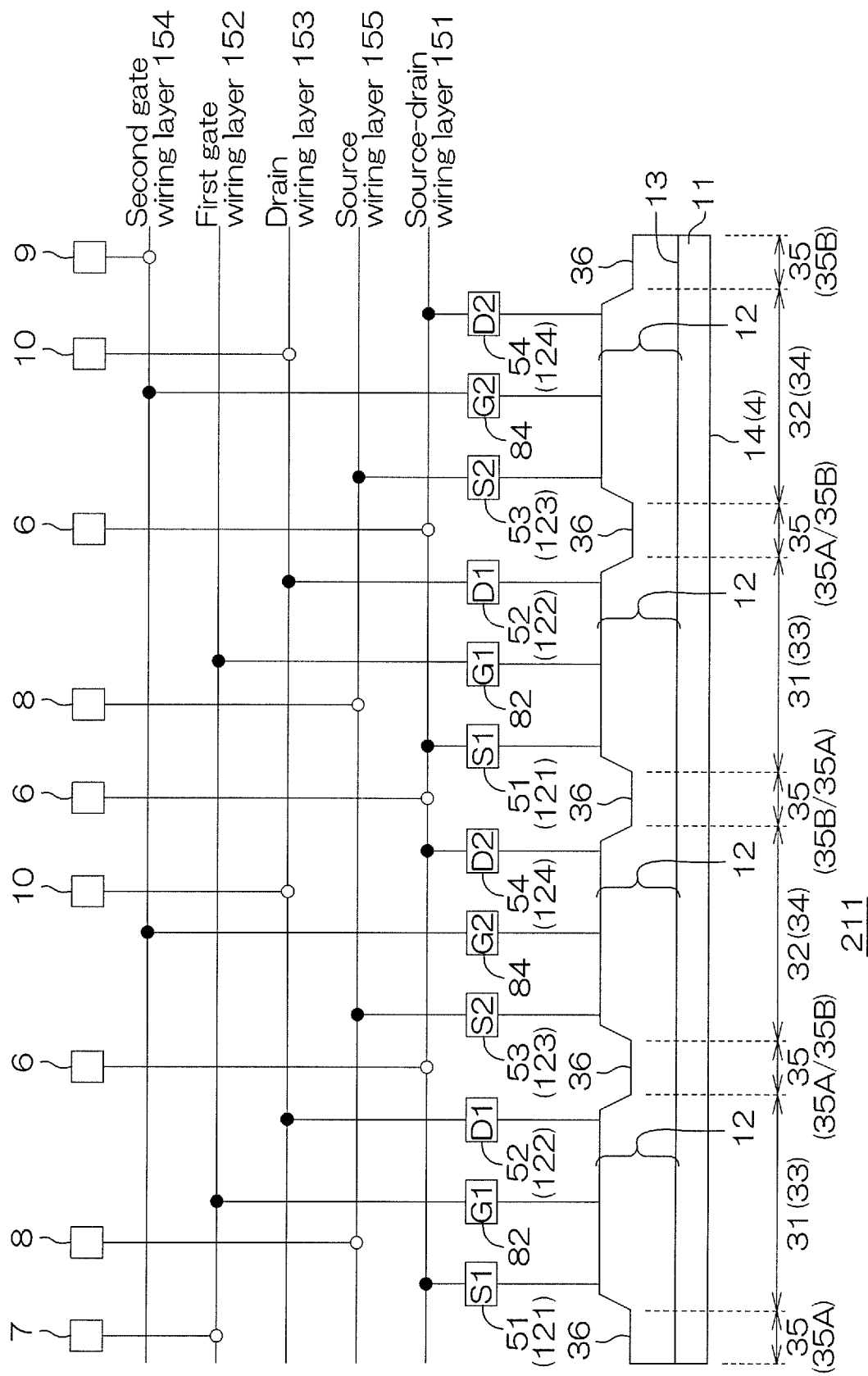
FIG. 18 is a schematic block diagram for explaining a mode of electrical connection of each member in the semiconductor device shown in FIG. 17.

FIG. 17 is a plan view showing a semiconductor device 211 according to a second preferred embodiment of the present invention. FIG. 18 is a schematic block diagram for explaining a mode of electrical connection of each member in the semiconductor device 211 shown in FIG. 17. Hereinafter, structures corresponding to the structures described for the semiconductor device 1 are denoted by the same reference symbols, and the descriptions thereof will be omitted.

In FIG. 18, as shown in FIG. 14 aforementioned, the first gate electrode 82, the first source electrode 51 (the first source contact electrode 121), and the first drain electrode 52 (the first drain contact electrode 122) are shown in a simplified manner by "G1," "S1," and "D1," respectively. Additionally, in FIG. 18, the second gate electrode 84, the second source electrode 53 (the second source contact electrode 123), and the second drain electrode 54 (the second drain contact electrode 124) are shown in a simplified manner by "G2," "S2," and "D2," respectively.

Furthermore, in FIG. 18, the source-drain wiring layer 151, the first gate wiring layer 152, the drain wiring layer 153, the second gate wiring layer 154, and the source wiring layer 155 are shown by the respective lines that extend along the first direction X. Furthermore, in FIG. 18, the source-drain external terminal 6, the first gate external terminal 7, the drain external terminal 8, the second gate external terminal 9, and the source external terminal 10 are each shown blocks.

Referring to FIG. 17 and FIG. 18, a plurality of first device formation regions 31 and a plurality of second device formation regions 32 are set in the single laminated structure portion 12 in the semiconductor device 211. Hereinafter, an example in which two first device formation regions 31 and two second device formation regions 32 are set will be described.

The plurality of first device formation regions 31 and the plurality of second device formation regions 32 are formed alternately along the first direction X. Each of the first device formation regions 31 and each of the second device formation regions 32 are separated from each other by the region separation structure 35.

The structure of each first device formation region 31 is similar to the structure of the first device formation region 31 of the semiconductor device 1. The structure of each second device formation region 32 is similar to the structure of the second device formation region 32 of the semiconductor device 1.

The source-drain wiring layer 151, the first gate wiring layer 152, the drain wiring layer 153, the second gate wiring layer 154, and the source wiring layer 155 are all formed above the laminated structure portion 12 such as to intersect the plurality of first device formation regions 31 and the plurality of second device formation regions 32.

The source-drain wiring layer 151, the first gate wiring layer 152, the drain wiring layer 153, the second gate wiring layer 154, and the source wiring layer 155 all extend in band shapes along the first direction X.

That is, the source-drain wiring layer 151, the first gate wiring layer 152, the drain wiring layer 153, the second gate wiring layer 154, and the source wiring layer 155 all intersect (are orthogonal to) the first gate electrode 82, the first source electrode 51 (the first source contact electrode 121), the first drain electrode 52 (the first drain contact electrode 122), the second gate electrode 84, the second source electrode 53 (the second source contact electrode 123), and the second drain electrode 54 (the second drain contact electrode 124).

The length of the source-drain wiring layer 151, the length of the first gate wiring layer 152, the length of the drain wiring layer 153, the length of the second gate wiring layer 154, and the length of the source wiring layer 155 may be arbitrary as in the case of the semiconductor device 1 and are not limited to the modes shown in FIG. 17.

The source-drain wiring layer 151 is electrically connected to the first source electrode 51 (the first source contact electrode 121) that is formed in each first device formation region 31 and the second drain electrode 54 (the second drain contact electrode 124) that is formed in each second device formation region 32.

The first gate wiring layer 152 is electrically connected to the first gate electrode 82 that is formed in each first device formation region 31. The drain wiring layer 153 is electrically connected to the first drain electrode 52 that is formed in each first device formation region 31.

The second gate wiring layer 154 is electrically connected to the second gate electrode 84 that is formed in each second device formation region 32. The source wiring layer 155 is electrically connected to the second source electrode 53 that is formed in each second device formation region 32.

One or a plurality of source-drain external terminals 6 is electrically connected to the source-drain wiring layer 151. Three source-drain external terminals 6 are electrically connected to the source-drain wiring layer 151, in this preferred embodiment.

The plurality of source-drain external terminals 6 are formed to be spaced apart from each other along the first direction X on the first chip main surface 3. Each source-drain external terminal 6 extends in a band shape along the second direction Y in plan view. Each source-drain wiring layer 151 is formed in a region between the first device formation region 31 and the second device formation region 32 in plan view, in this preferred embodiment.

One or a plurality of the first gate external terminals 7 is electrically connected to the first gate wiring layer 152. One first gate external terminal 7 is electrically connected to the first gate wiring layer 152, in this preferred embodiment.

The first gate external terminal 7 is formed in a region along a corner portion on the first chip main surface 3. More specifically, the first gate external terminal 7 is formed a region along a corner portion that connects the chip side surface 5A and the chip side surface 5B in the first chip main surface 3.

One or a plurality of the drain external terminals 8 is electrically connected to the drain wiring layer 153. Two drain external terminals 8 are electrically connected to the drain wiring layer 153, in this preferred embodiment. Each drain external terminal 8 is arranged immediately above each second device formation region 32, in this preferred embodiment. Each drain external terminal 8 extends in a band shape along the second direction Y in plan view.

One or a plurality of the second gate external terminals 9 is electrically connected to the second gate wiring layer 154. One second gate external terminal 9 is electrically connected to the second gate wiring layer 154, in this preferred embodiment. The second gate external terminal 9 is formed in a region along a corner portion on the first chip main surface 3. More specifically, the second gate external terminal 9 is formed in a region along a corner portion that connects the chip side surface 5C and the chip side surface 5D in the first chip main surface 3.

One or a plurality of the source external terminals 10 is electrically connected to the source wiring layer 155. Two source external terminals 10 are electrically connected to the source wiring layer 155, in this preferred embodiment. Each source external terminals 10 is arranged immediately above each first device formation region 31, in this preferred embodiment. Each source external terminal 10 extends in a band shape along the second direction Y in plan view.

As described above, the semiconductor device 211 is also capable of providing a similar effect as those described regarding the semiconductor device 1.

As described above, the preferred embodiments of the present invention were described, however, the present invention may be implemented yet in other preferred embodiments.

In each preferred embodiment described above, an example in which the source-drain wiring layer 151 to be electrically connected to the first source electrode 51 and the second drain electrode 54 is formed has been described.

However, the electrical connection between the first HEMT 33 and the second HEMT 34 is not limited to the preferred embodiments.

For example, in each preferred embodiment described above, a source-source wiring layer to be electrically connected to the first source electrode 51 and the second source electrode 53 may be formed in place of or in addition to the source-drain wiring layer 151. In this case, the plurality of external terminals may include an external terminal that is electrically connected to the source-source wiring layer.

In each preferred embodiment described above, a source-gate wiring layer to be electrically connected to the first source electrode 51 and the second gate electrode 84 may be formed in place of or in addition to the source-drain wiring layer 151. In this case, the plurality of external terminals may include an external terminal that is electrically connected to the source-gate wiring layer.

In each preferred embodiment described above, a drain-source wiring layer to be electrically connected to the first drain electrode 52 and the second source electrode 53 may be formed in place of or in addition to the source-drain wiring layer 151. In this case, the plurality of external terminals may include an external terminal that is electrically connected to the drain-source wiring layer.

In each preferred embodiment described above, a drain-drain wiring layer to be electrically connected to the first drain electrode 52 and the second drain electrode 54 may be formed in place of or in addition to the source-drain wiring layer 151. In this case, the plurality of external terminals may include an external terminal that is electrically connected to the drain-drain wiring layer.

In each preferred embodiment described above, a drain-gate wiring layer to be electrically connected to the first drain electrode 52 and the second gate electrode 84 may be formed in place of or in addition to the source-drain wiring layer 151. In this case, the plurality of external terminals may include an external terminal that is electrically connected to the drain-gate wiring layer.

In each preferred embodiment described above, a gate-source wiring layer to be electrically connected to the first gate electrode 82 and the second source electrode 53 may be formed in place of or in addition to the source-drain wiring layer 151. In this case, the plurality of external terminals may include an external terminal that is electrically connected to the gate-source wiring layer.

In each preferred embodiment described above, a gate-drain wiring layer to be electrically connected to the first gate electrode 82 and the second drain electrode 54 may be formed in place of or in addition to the source-drain wiring layer 151. In this case, the plurality of external terminals may include an external terminal that is electrically connected to the gate-drain wiring layer.

In each preferred embodiment described above, a gate-gate wiring layer to be electrically connected to the first gate electrode 82 and the second gate electrode 84 may be formed in place of or in addition to the source-drain wiring layer 151. In this case, the plurality of external terminals may include an external terminal that is electrically connected to the gate-gate wiring layer.

For example, those modes are formed by modifying the layout of the mask 201 in the step of FIG. 16U, and by modifying the layout of the mask 205, etc., in the steps of FIG. 16X and FIG. 16Y.

That is, those modes can be readily achieved by adjusting layouts of the first gate contact hole 142, the first source contact hole 143, the first drain contact hole 144, the second gate contact hole 145, the second source contact hole 146, and the second drain contact hole 147, and layouts of the plurality of external terminals.

In the structure especially in which the plurality of wiring layers (the source-drain wiring layer 151, the first gate wiring layer 152, the drain wiring layer 153, the second gate wiring layer 154, and the source wiring layer 155) are formed in the stripe shape extending along the first direction X, there is an advantages in that the layouts of the contact holes 142 to 147 and the layouts of the plurality of external terminals can be modified without significantly modifying the layouts of the plurality of wiring layers.

In each preferred embodiment described above, positions of the second source electrode 53 (the second source contact electrode 123) and the second drain electrode 54 (the second drain contact electrode 124) may be interchanged.

In each preferred embodiment described above, positions of the first source electrode 51 (the first source contact electrode 121) and the first drain electrode 52 (the first drain contact electrode 122) may be interchanged.

In each preferred embodiment described above, an example in which the first source electrode 51 (the first source contact electrode 121), the first drain electrode 52 (the first drain contact electrode 122), and the first gate electrode 82 were formed each singly in the first device formation region 31.

However, in each preferred embodiment described above, a plurality of first source electrodes 51 (first source contact electrodes 121), a plurality of first drain electrodes 52 (first drain contact electrodes 122), and a plurality of first gate electrodes 82 may be formed. That is, the single first HEMT 33 having the plurality of first source electrodes 51 (the first source contact electrodes 121), the plurality of first drain electrodes 52 (the first drain contact electrodes 122), and the plurality of first gate electrodes 82 may be formed.

In each preferred embodiment described above, an example in which the second source electrode 53 (the second source contact electrode 123), the second drain electrode 54 (the second drain contact electrode 124), and the second gate electrode 84 were formed each singly in the second device formation region 32.

However, in each preferred embodiment described above, a plurality of second source electrodes 53 (second source contact electrodes 123), a plurality of second drain electrodes 54 (second drain contact electrodes 124), and a plurality of second gate electrodes 84 may be formed in the second device formation region 32. That is, the single second HEMT 34 having the plurality of second source electrodes 53 (the second source contact electrodes 123), the plurality of second drain electrodes 54 (the second drain contact electrodes 124), and the plurality of second gate electrodes 84 may be formed.

In the second preferred embodiment described above, three or more first device formation regions 31 and three or more second device formation regions 32 may be formed in the single laminated structure portion 12. In this case, the three or more first device formation regions 31 and the three or more second device formation regions 32 may be alternately arranged along the first direction X.

Figure 19:
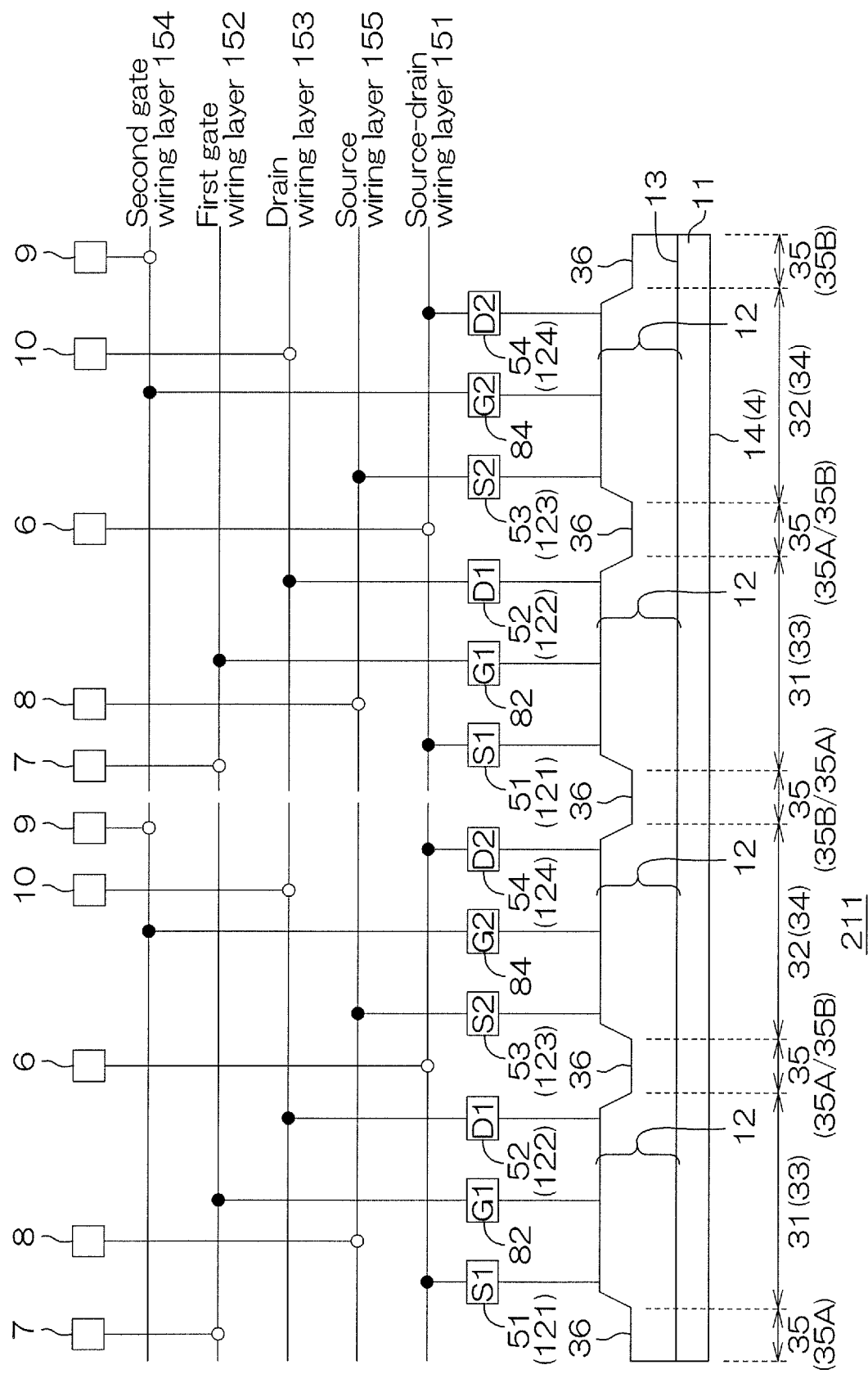
FIG. 19 is a schematic block diagram corresponding to FIG. 18 and a view for explaining another example of electrical connection of each member.

In the second preferred embodiment described above, an example shown in FIG. 19 may be employed. FIG. 19 is a schematic block diagram corresponding to FIG. 18 and a view for explaining another example of electrical connection of each member. Hereinafter, structures corresponding to the structures described for the semiconductor device 211 are denoted by the same reference symbols, and the descriptions thereof will be omitted.

Referring to FIG. 19, the source-drain wiring layer 151, the first gate wiring layer 152, the drain wiring layer 153, and the second gate wiring layer 154 may be each separated at an arbitrary region. In FIG. 19, a mode in which two semiconductor devices 1 are formed using the single laminated structure portion 12 is shown.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
   a semiconductor layer which has a first device formation region and a second device formation region;
   a first HEMT which is formed in the first device formation region and has a first two-dimensional electron gas region as a channel;
   a second HEMT which is formed in the second device formation region and has a second two-dimensional electron gas region as a channel;
   a trench which is formed in the semiconductor layer such as to define the first device formation region and the second device formation region;
   a first insulating layer which covers the first and second device formation regions such as to backfill the trench, and forms a region separation structure with the trench, the first insulating layer having flat portions extending along the first and second device formation regions and a recessed portion recessed toward the trench in a region between the flat portions; and
   a second insulating layer which covers the flat portions such as to backfill the recessed portion on the first insulating layer and has a flat surface extending along the flat portions over the recessed portion.

2. The semiconductor device according to claim 1, wherein the region separation structure separates the first two-dimensional electron gas region and the second two-dimensional electron gas region.

3. The semiconductor device according to claim 1, further comprising:
   a connection wiring layer which is formed on the flat surface of the second insulating layer such as to overlap the first device formation region, the second device formation region and the region separation structure, and electrically connected to the first HEMT and the second HEMT.

4. The semiconductor device according to claim 3, wherein the connection wiring layer extends along an opposing direction in which the first device formation region and the second device formation region oppose each other.

5. The semiconductor device according to claim 3, wherein the connection wiring layer intersects the region separation structure.

6. The semiconductor device according to claim 3, wherein the connection wiring layer extends linearly such as to be linearly connected to the first HEMT and the second HEMT as viewed in a plan view.

7. The semiconductor device according to claim 3, wherein
   the first HEMT includes a first gate electrode, a first drain electrode, and a first source electrode,
   the second HEMT includes a second gate electrode, a second drain electrode, and a second source electrode, and the connection wiring layer is a source-drain wiring layer that is electrically connected to the first source electrode of the first HEMT and the second drain electrode of the second HEMT.

8. The semiconductor device according to claim 7, wherein
the first gate electrode, the first drain electrode, and the first source electrode are formed in a layer between the first device formation region and the connection wiring layer, and
the second gate electrode, the second drain electrode, and the second source electrode are formed in a layer between the second device formation region and the connection wiring layer.

9. The semiconductor device according to claim 7, wherein
the first source electrode and the second drain electrode extend in a first direction, and
the connection wiring layer extends in a second direction that intersects the first direction.

10. The semiconductor device according to claim 7, wherein the connection wiring layer extends linearly such as to be linearly connected to the first source electrode and the second drain electrode as viewed in a plan view.

11. The semiconductor device according to claim 7, further comprising:
a first gate wiring layer that is formed on the flat surface of the second insulating layer and electrically connected to the first gate electrode;
a drain wiring layer that is formed on the flat surface of the second insulating layer and electrically connected to the first drain electrode;
a second gate wiring layer that is formed on the flat surface of the second insulating layer and electrically connected to the second gate electrode; and
a source wiring layer that is formed above the semiconductor layer on the flat surface of the second insulating layer and electrically connected to the second source electrode.

12. The semiconductor device according to claim 11, further comprising:
an upper insulating layer which covers the connection wiring layer, the first gate wiring layer, the drain wiring layer, the second gate wiring layer and the source wiring layer on the flat surface of the second insulating layer;
a source-drain external terminal which is formed on the upper insulating layer and penetrates a portion of the upper insulating layer such as to be electrically connected to the connection wiring layer;
a first gate external terminal which is formed on the upper insulating layer and penetrates a portion of the upper insulating layer such as to be electrically connected to the first gate wiring layer;
a drain external terminal which is formed on the upper insulating layer and penetrates a portion of the upper insulating layer such as to be electrically connected to the drain wiring layer;
a second gate external terminal which is formed on the upper insulating layer and penetrates a portion of the upper insulating layer such as to be electrically connected to the second gate wiring layer; and
a source external terminal which is formed on the upper insulating layer and penetrates a portion of the upper insulating layer such as to be electrically connected to the source wiring layer.

13. The semiconductor device according to claim 7, wherein
the semiconductor layer includes an electron transit layer, and an electron supply layer which is formed on the electron transit layer and has a first gate contact hole exposing the electron transit layer in the first device formation region and a second gate contact hole exposing the electron transit layer in the second device formation region,
the first gate electrode is embedded in the first gate contact hole in the first device formation region with a first gate insulating layer interposed between the first gate electrode and the first gate contact hole, and
the second gate electrode is embedded in the second gate contact hole in the second device formation region with a second gate insulating layer interposed between the second gate electrode and the second gate contact hole.

14. The semiconductor device according to claim 13, wherein
the first drain electrode and the first source electrode are electrically connected to the electron supply layer in the first device formation region, and
the second drain electrode and the second source electrode are electrically connected to the electron supply layer in the second device formation region.

15. The semiconductor device according to claim 1, wherein,
the trench is formed in a tapered shape that has an opening area greater than a bottom area such as to define the first device formation region in a frustum shape and define the second device formation region in a frustum shape.

16. The semiconductor device according to claim 1, wherein,
the trench communicates with a side surface of the semiconductor layer.

17. The semiconductor device according to claim 1, wherein,
the trench has a depth of 3 nm or more and 100 nm or less.

18. A semiconductor device comprising:
a semiconductor layer which includes an electron transit layer, and an electron supply layer formed on the electron transit layer;
a trench which penetrates the electron supply layer such as to separate the semiconductor layer into a first device formation region and a second device formation region;
a first HEMT that is formed in the first device formation region and has a first two-dimensional electron gas region as a channel;
a second HEMT that is formed in the second device formation region and has a second two-dimensional electron gas region as a channel;
a first insulating layer which covers the first and second device formation regions such as to backfill the trench, and forms a region separation structure with the trench, the first insulating layer having flat portions extending along the first and second device formation regions and a recessed portion recessed toward the trench in a region between the flat portions; and
a second insulating layer which covers the flat portions such as to backfill the recessed portion on the first insulating layer and has a flat surface extending along the flat portions over the recessed portion.

19. The semiconductor device according to claim 18, further comprising:
a connection wiring layer which is formed on the flat surface of the second insulating layer such as to overlap the first device formation region, the second device formation region and the region separation structure, and electrically connected to the first HEMT and the second HEMT.

20. A semiconductor device comprising: a semiconductor layer which has a first device formation region and a second device formation region;
- a first HEMT which is formed in the first device formation region and has formed in a lowermost portion thereof a first two-dimensional electron gas region as an associated channel in a boundary region between an electron transit layer and an electron supply layer below the electron supply layer;
- a second HEMT which is formed in the second device formation region and has formed in a lowermost portion a second two-dimensional electron gas region as an associated channel in a boundary region between an electron transit layer and an electron supply layer below the electron supply layer;
- a region separation structure which includes a separation trench which is formed in the semiconductor layer such as to define the first device formation region and the second device formation region and formed in a tapered shape that has an opening area greater than a bottom area, and
- an embedded insulator embedded in the separation trench, the lower surface of the trench penetrating the electron supply layer and exposing the electron transit layer to thereby separate the first and second two-dimensional electron gas regions, with the first and second two-dimensional electron gas regions extending up to side walls of the separation trench;

wherein the embedded insulator includes a first portion located inside the trench and a second portion located outside the trench at an upper side to the first portion; and wherein the second portion has a recess recessed toward the trench.

* * * * *